(12) United States Patent
Shimizu

(10) Patent No.: US 11,729,985 B2
(45) Date of Patent: Aug. 15, 2023

(54) SEMICONDUCTOR MEMORY DEVICE

(71) Applicant: Kioxia Corporation, Tokyo (JP)

(72) Inventor: Kojiro Shimizu, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 228 days.

(21) Appl. No.: 17/018,062

(22) Filed: Sep. 11, 2020

(65) Prior Publication Data

US 2021/0272977 A1 Sep. 2, 2021

(30) Foreign Application Priority Data

Mar. 2, 2020 (JP) ................................. 2020-034818

(51) Int. Cl.
| | |
|---|---|
| *H01L 27/112* | (2006.01) |
| *H01L 27/11578* | (2017.01) |
| *H01L 21/768* | (2006.01) |
| *H10B 43/50* | (2023.01) |
| *H10B 43/10* | (2023.01) |
| *H10B 43/27* | (2023.01) |

(52) U.S. Cl.
CPC ............. *H10B 43/50* (2023.02); *H10B 43/10* (2023.02); *H10B 43/27* (2023.02)

(58) Field of Classification Search
CPC ......... H01L 27/11582; H01L 27/11575; H01L 27/11565; H01L 27/11519; H01L 27/11524; H01L 27/11556; H01L 27/1157; H10B 43/50; H10B 43/10; H10B 43/27; H10B 41/10; H10B 41/27; H10B 41/35; H10B 43/35
See application file for complete search history.

(56) References Cited

U.S. PATENT DOCUMENTS

| | | | |
|---|---|---|---|
| 8,431,969 B2 * | 4/2013 | Kim ..................... | H10B 43/20 |
| | | | 365/72 |
| 9,305,849 B1 * | 4/2016 | Tsutsumi ............ | H01L 27/1157 |
| 9,754,963 B1 * | 9/2017 | Kawamura ....... | H01L 27/11565 |
| 9,853,050 B2 | 12/2017 | Kikutani | |
| 10,068,917 B2 * | 9/2018 | Kanamori ......... | H01L 27/11582 |
| 10,096,618 B2 * | 10/2018 | Kim .................. | H01L 21/31053 |
| 10,177,160 B2 * | 1/2019 | Pyon ..................... | A61K 47/12 |
| 10,276,583 B2 * | 4/2019 | Sharangpani ....... | H01L 27/0688 |
| 10,566,346 B2 * | 2/2020 | Lee .................... | H01L 27/11568 |
| 10,716,755 B2 * | 7/2020 | Pyon .................... | A61K 31/197 |
| 2010/0038699 A1 * | 2/2010 | Katsumata ........ | H01L 29/66833 |
| | | | 257/E21.409 |
| 2014/0203442 A1 * | 7/2014 | Yun .................. | H01L 27/11548 |
| | | | 257/773 |

(Continued)

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

According to one embodiment, a semiconductor memory device includes first to second areas, a plurality of conductive layers, first to fourth members, and a plurality of pillars. The second area includes a first contact area including first to third sub-areas. The conductive layers include first to fourth conductive layers. The first conductive layer includes a first terrace portion in the first sub-area. The second conductive layer includes a second terrace portion in the third sub-area. The third conductive layer includes a third terrace portion in the first sub-area. The fourth conductive layer includes a fourth terrace portion in the third sub-area.

19 Claims, 52 Drawing Sheets

(56) References Cited

U.S. PATENT DOCUMENTS

| | | | |
|---|---|---|---|
| 2015/0236038 A1* | 8/2015 | Pachamuthu | H01L 21/8221 |
| | | | 257/326 |
| 2015/0318296 A1* | 11/2015 | Kim | H01L 27/11519 |
| | | | 257/296 |
| 2016/0104715 A1* | 4/2016 | Pachamuthu | H01L 27/11575 |
| | | | 257/326 |
| 2016/0293625 A1* | 10/2016 | Kang | H01L 27/11565 |
| 2016/0322381 A1* | 11/2016 | Liu | H01L 27/11526 |
| 2016/0365351 A1* | 12/2016 | Nishikawa | H01L 27/11556 |
| 2017/0040337 A1* | 2/2017 | Kim | H01L 27/11573 |
| 2017/0047334 A1* | 2/2017 | Lu | H01L 27/11519 |
| 2017/0110462 A1 | 4/2017 | Akutsu | |
| 2017/0236746 A1* | 8/2017 | Yu | H01L 27/1157 |
| | | | 257/314 |
| 2017/0309635 A1* | 10/2017 | Kim | H01L 27/0688 |
| 2019/0287985 A1* | 9/2019 | Shimojo | H01L 23/5226 |
| 2019/0287995 A1 | 9/2019 | Oike et al. | |
| 2019/0371813 A1* | 12/2019 | Oike | H01L 23/528 |
| 2020/0098782 A1* | 3/2020 | Nojima | H01L 27/1157 |
| 2020/0119031 A1* | 4/2020 | Shen | H01L 27/11575 |
| 2021/0272977 A1* | 9/2021 | Shimizu | H01L 27/11565 |
| 2021/0288064 A1* | 9/2021 | Nishimura | H01L 27/11556 |
| 2021/0358937 A1* | 11/2021 | Yamaguchi | H01L 27/11565 |

\* cited by examiner

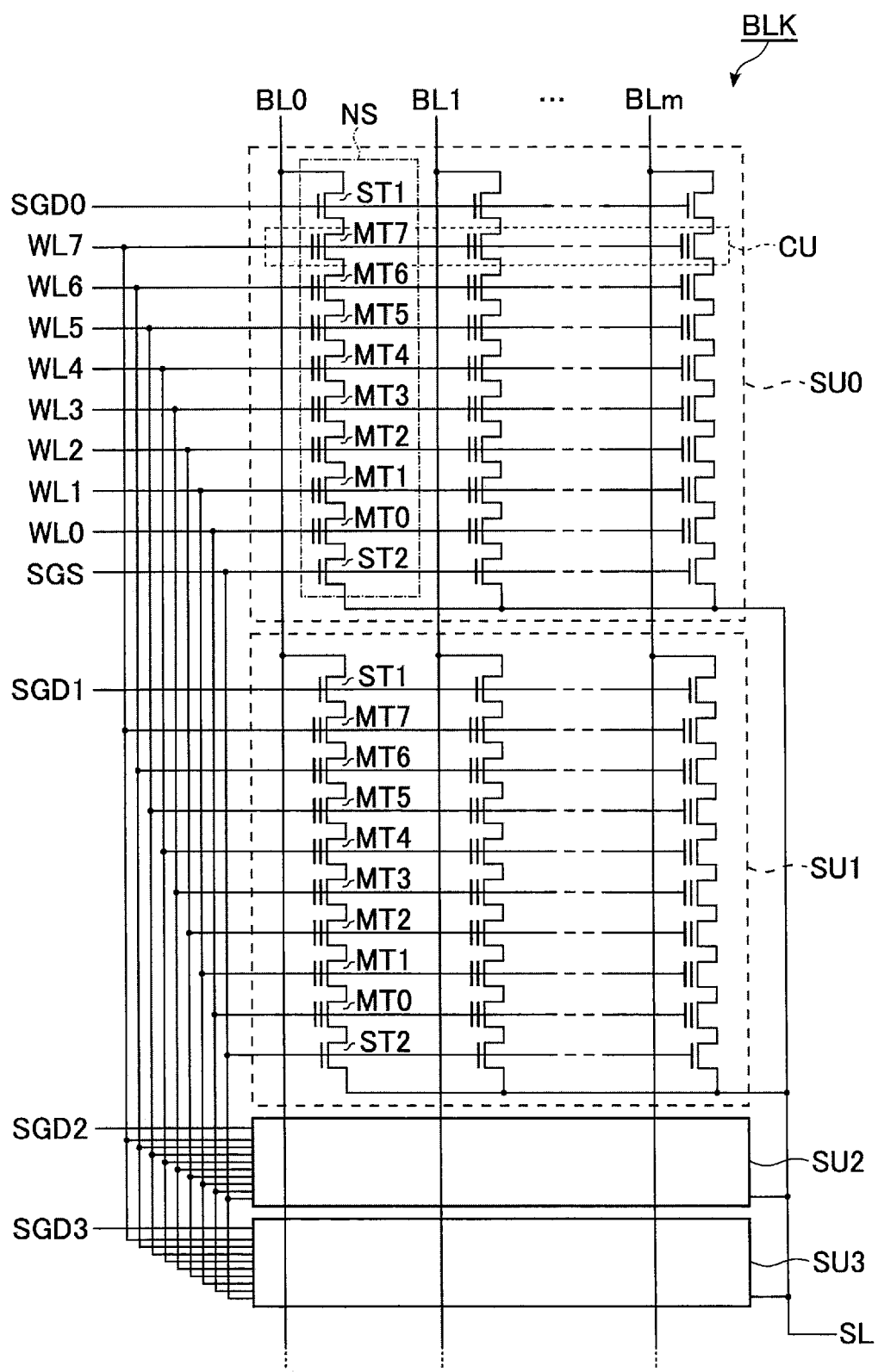
F I G. 2

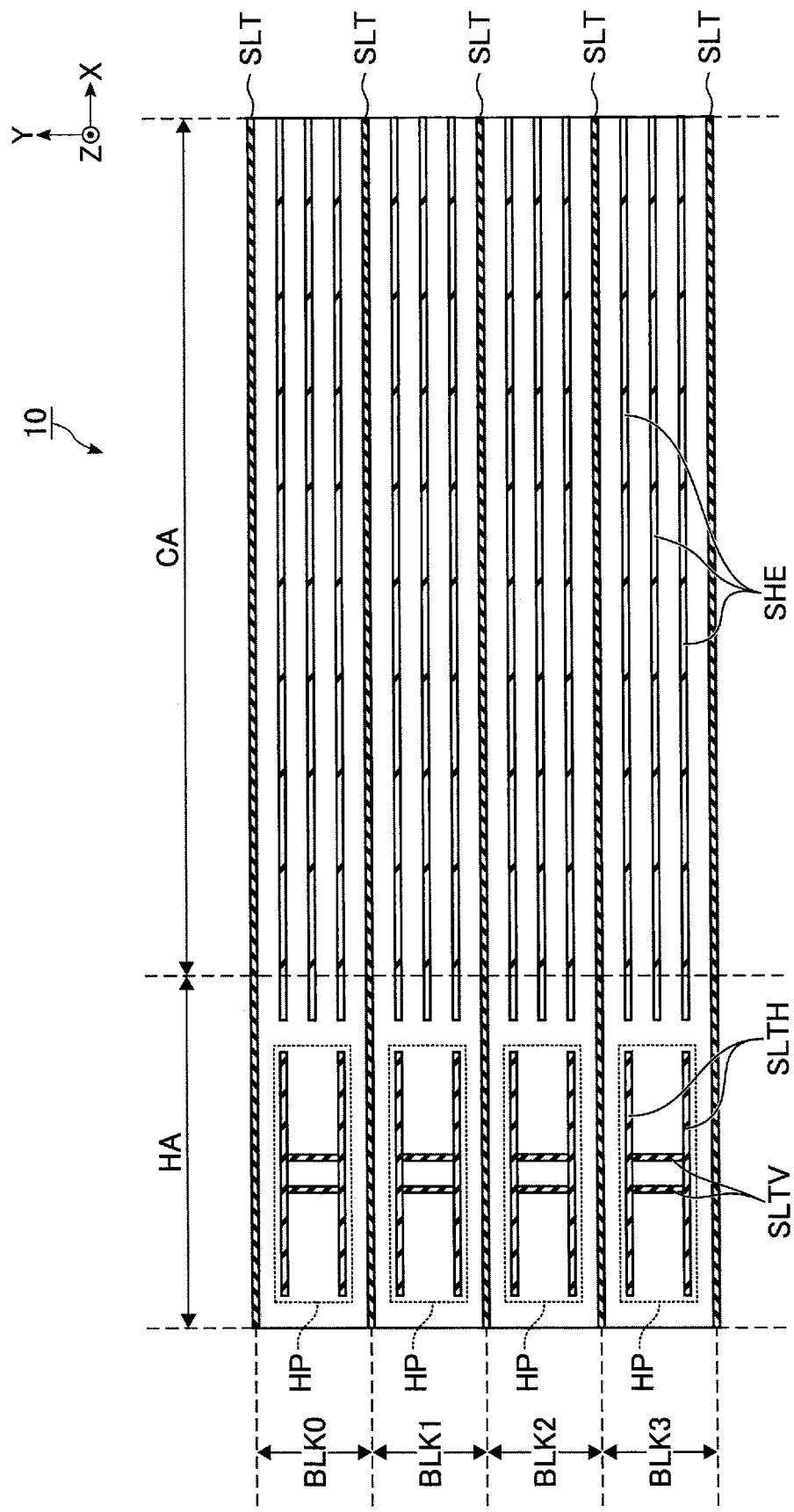
F I G. 3

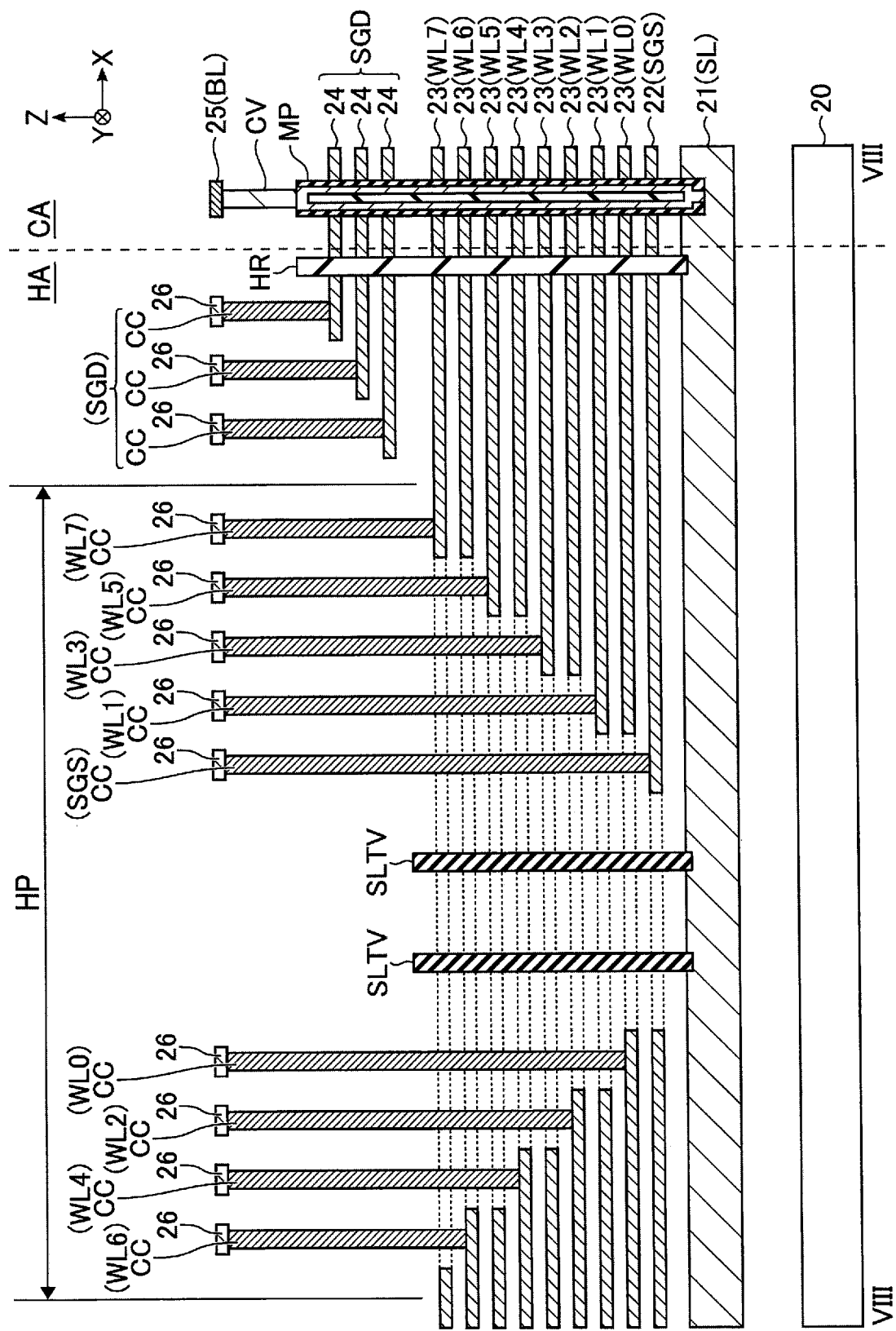
F I G. 8

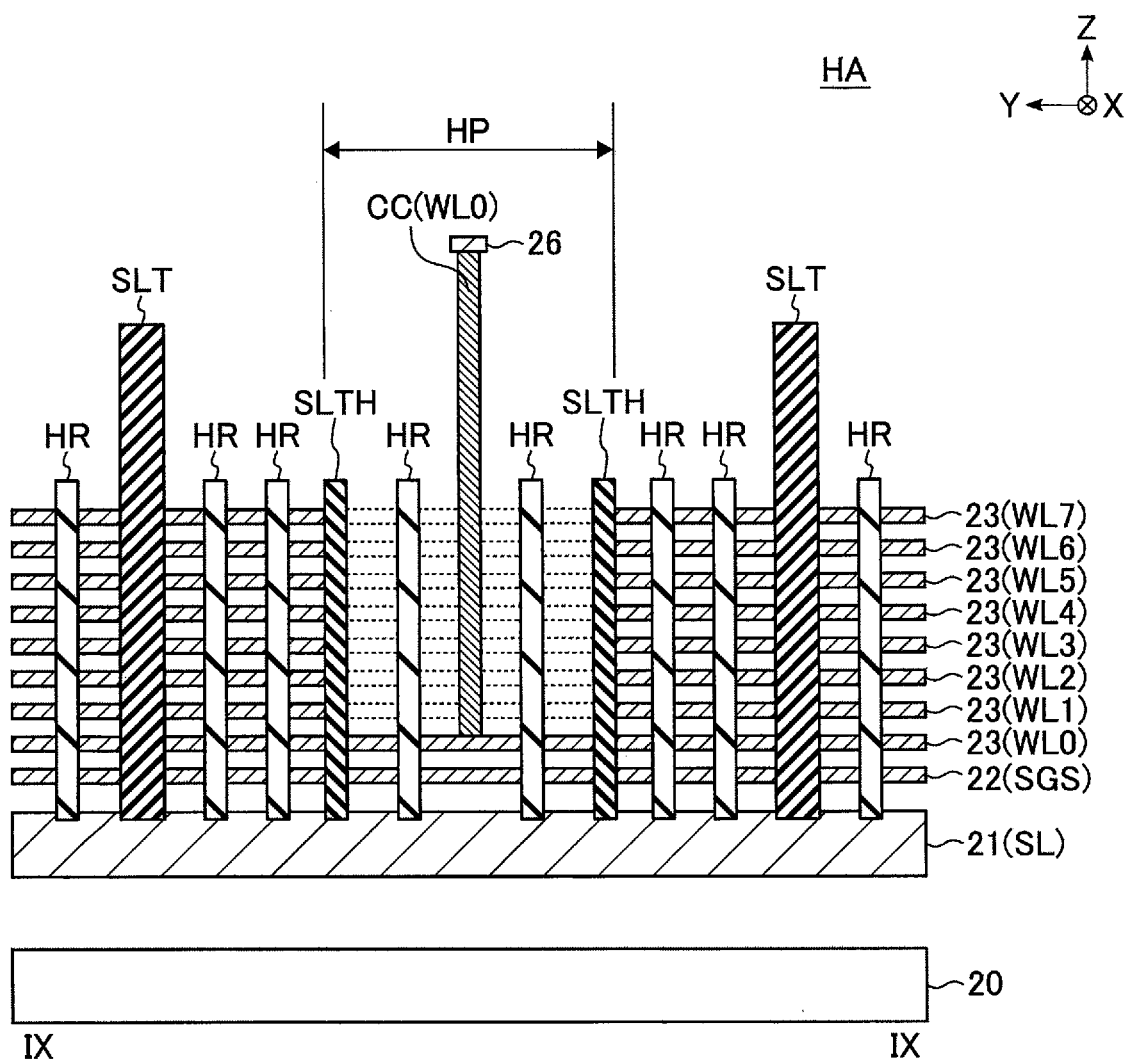
F I G. 9

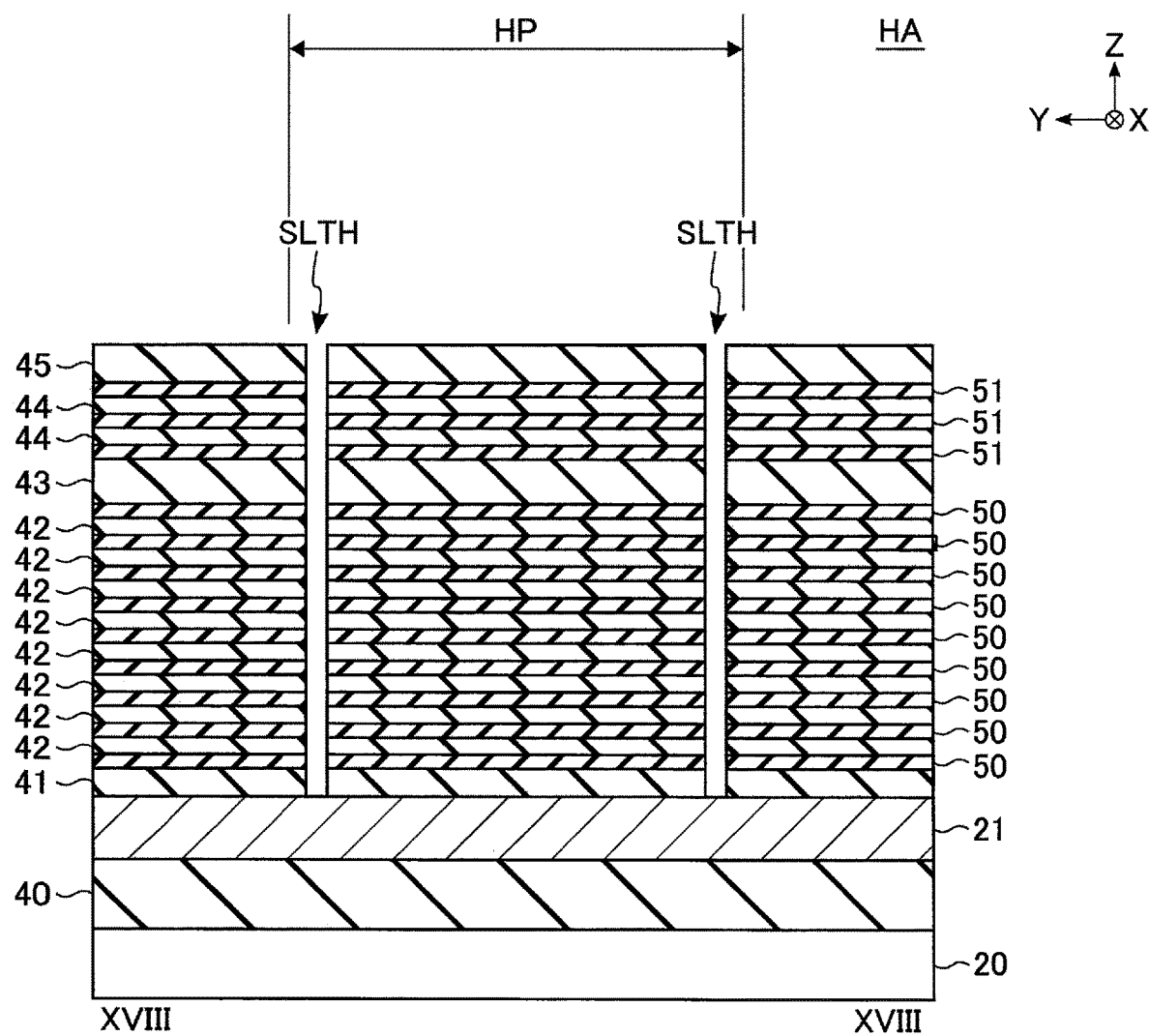
F I G. 18

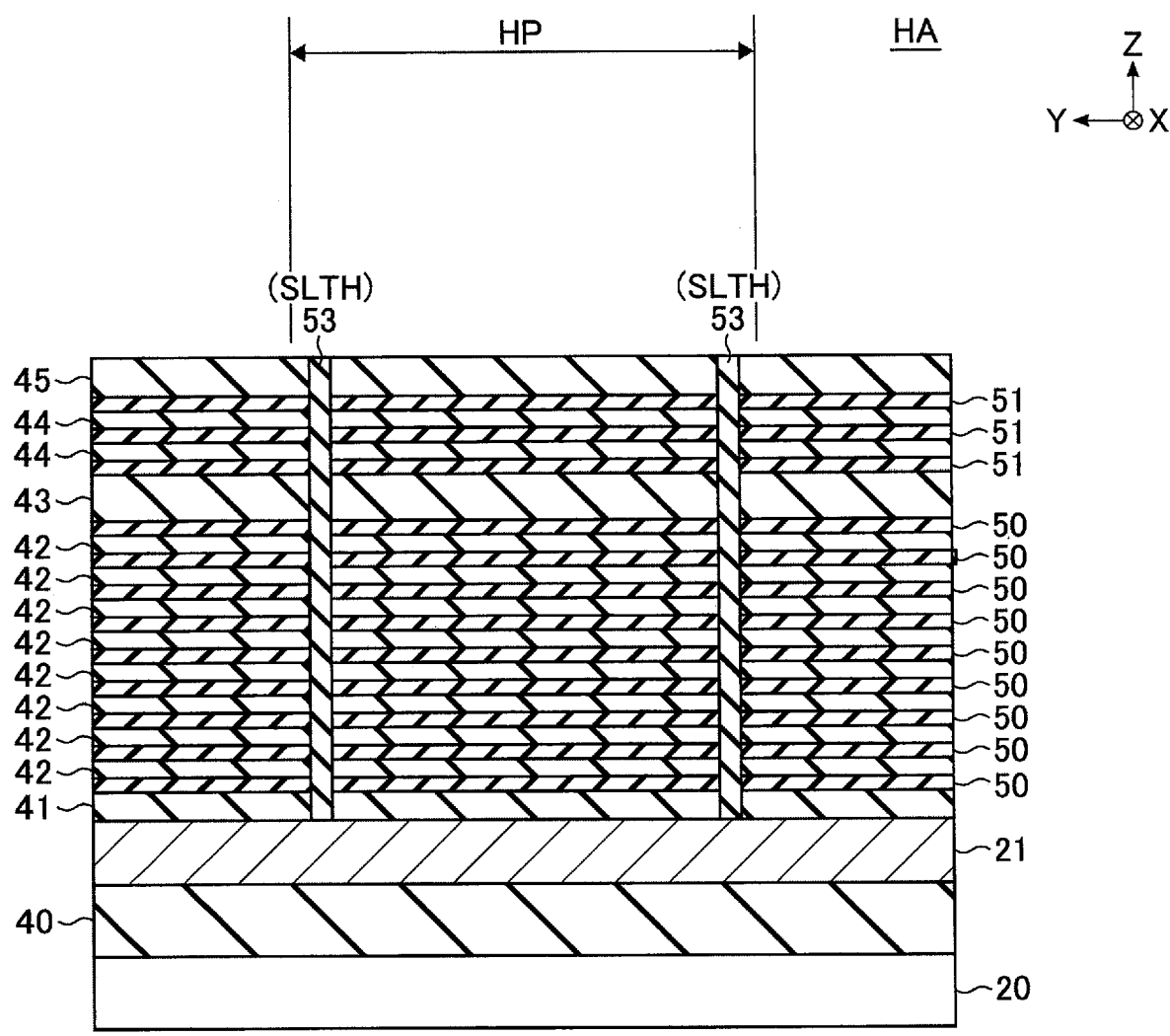
F I G. 20

(1) Insulators and sacrificial members are alternately stacked
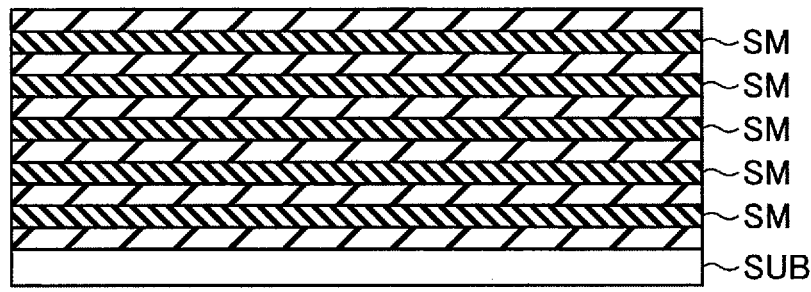
(2) Slimming and etching are repeatedly performed
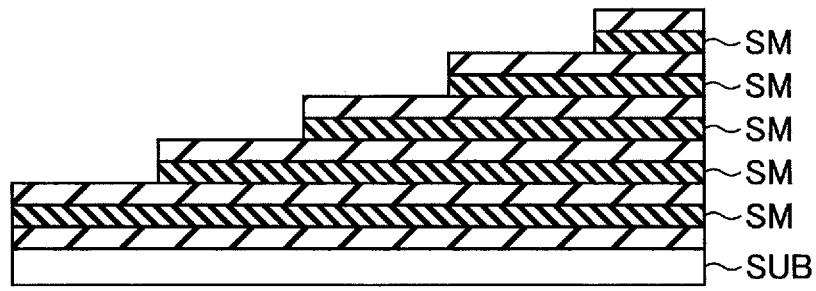
(3) Insulator is filled in and flattened
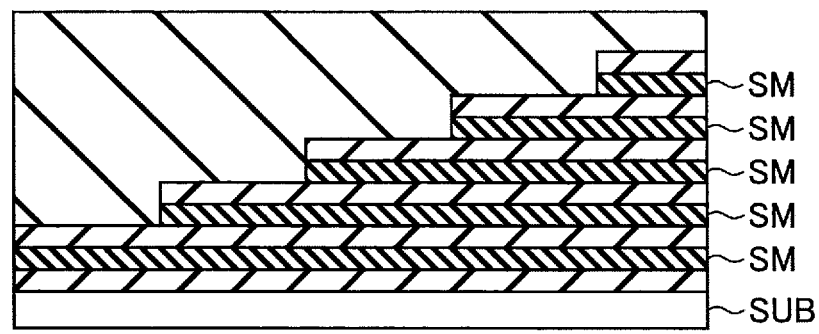
F I G. 34

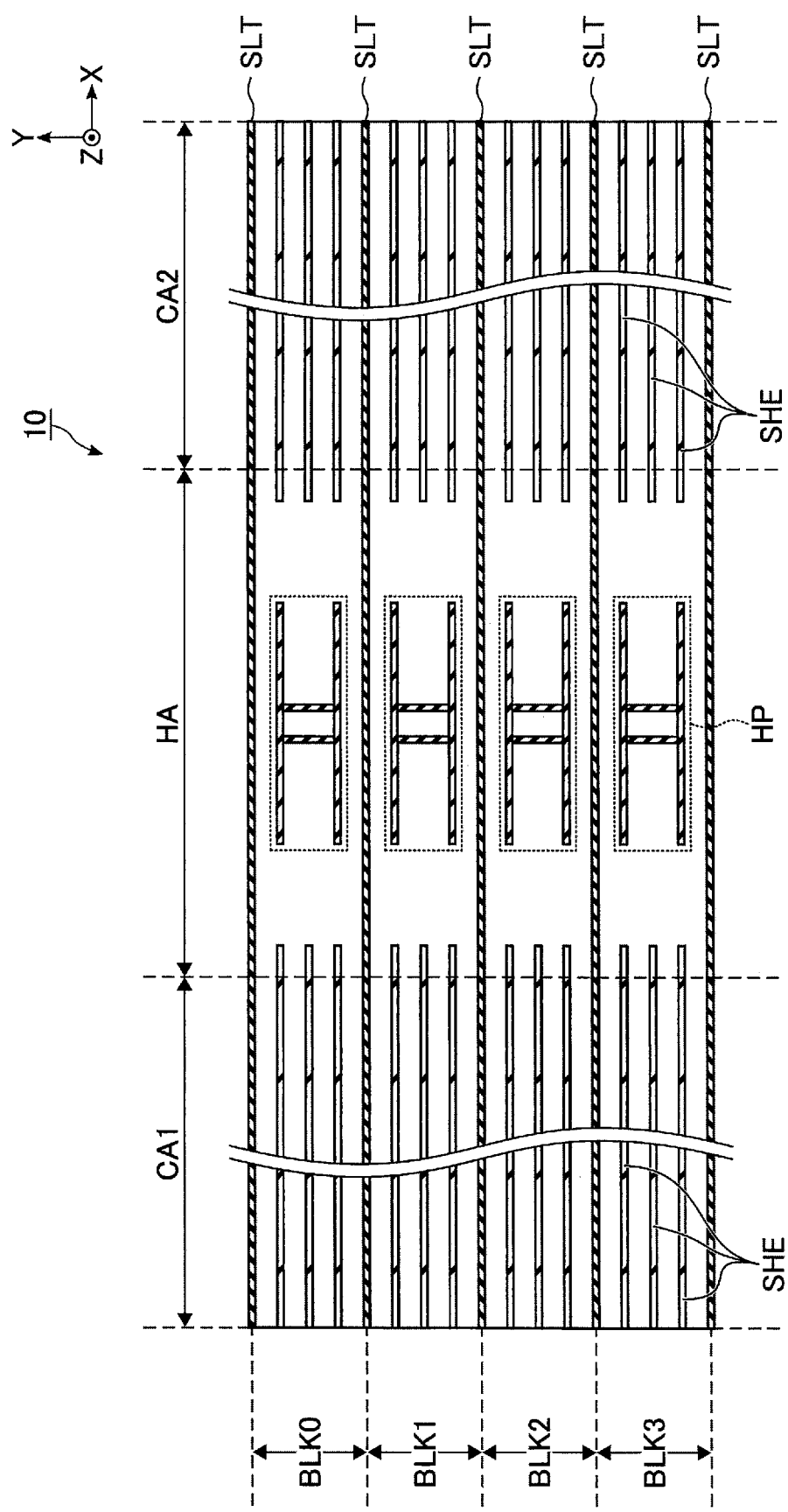
F I G. 37

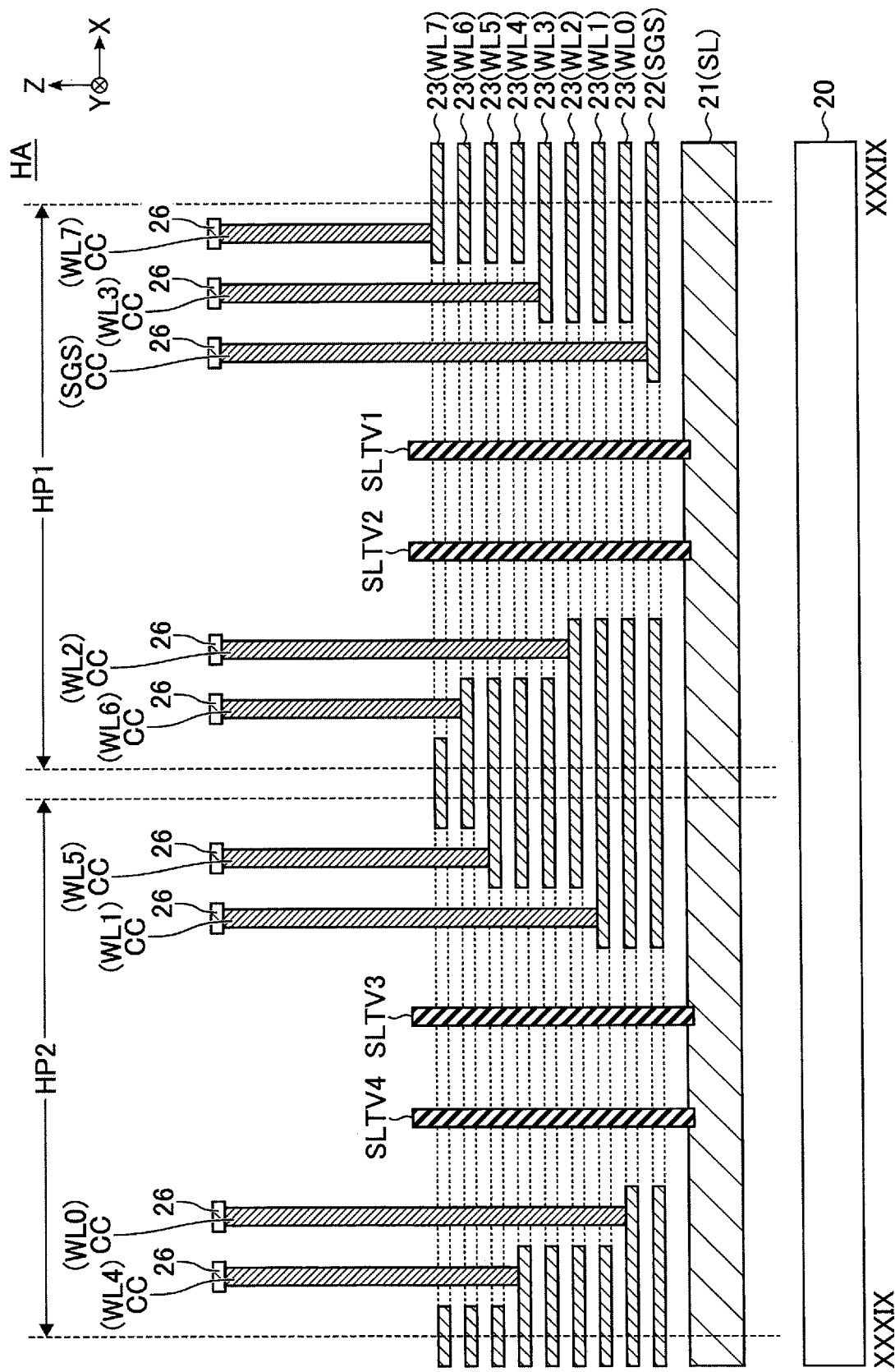
F I G. 39

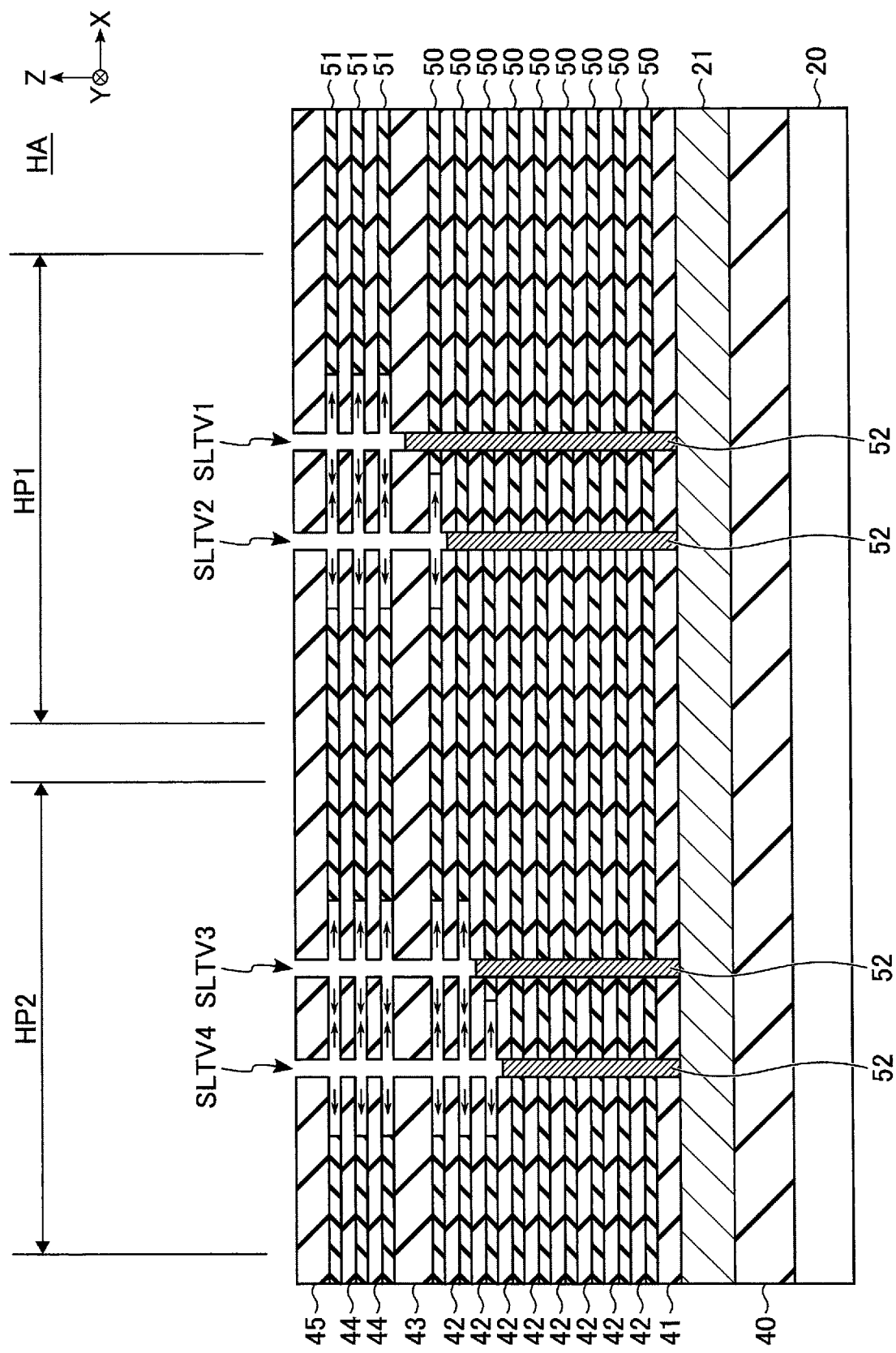
F I G. 44

SEMICONDUCTOR MEMORY DEVICE

CROSS-REFERENCE TO RELATED APPLICATIONS

This application is based upon and claims the benefit of priority from Japanese Patent Application No. 2020-034818, filed Mar. 2, 2020, the entire contents of which are incorporated herein by reference.

FIELD

Embodiments described herein relate generally to a semiconductor memory device.

BACKGROUND

A NAND-type flash memory capable of storing data in a non-volatile manner is known.

BRIEF DESCRIPTION OF THE DRAWINGS

FIG. 2 is a circuit diagram showing an example of a circuit configuration of a memory cell array included in the semiconductor memory device according to the first embodiment.

FIG. 3 is a plan view showing an example of a planar layout of the memory cell array included in the semiconductor memory device according to the first embodiment.

FIG. 8 is a cross-sectional view showing an example of a cross-sectional structure in the hookup area of the memory cell array taken along line VIII-VIII of FIG. 7.

FIG. 9 is a cross-sectional view showing an example of a cross-sectional structure in the hookup area of the memory cell array taken along line IX-IX of FIG. 7.

FIG. 18 is a cross-sectional view of the memory cell array, taken along line XVIII-XVIII of FIG. 17.

FIG. 20 is a cross-sectional view of the memory cell array showing an example of the manufacturing process of the semiconductor memory device according to the first embodiment.

FIG. 34 is a cross-sectional view illustrating an example of a cross-sectional structure of a semiconductor memory device in the course of manufacturing according to a comparative example of the first embodiment.

FIG. 37 is a plan view showing an example of a planar layout of a memory cell array included in a semiconductor memory device according to a third modification of the first embodiment.

FIG. 39 is a cross-sectional view showing an example of a cross-sectional structure in the hookup area of the memory cell array taken along line XXXIX-XXXIX of FIG. 38.

FIG. 44 is a cross-sectional view of the memory cell array showing an example of the manufacturing process of the semiconductor memory device according to the second embodiment.

DETAILED DESCRIPTION

Figure 1:
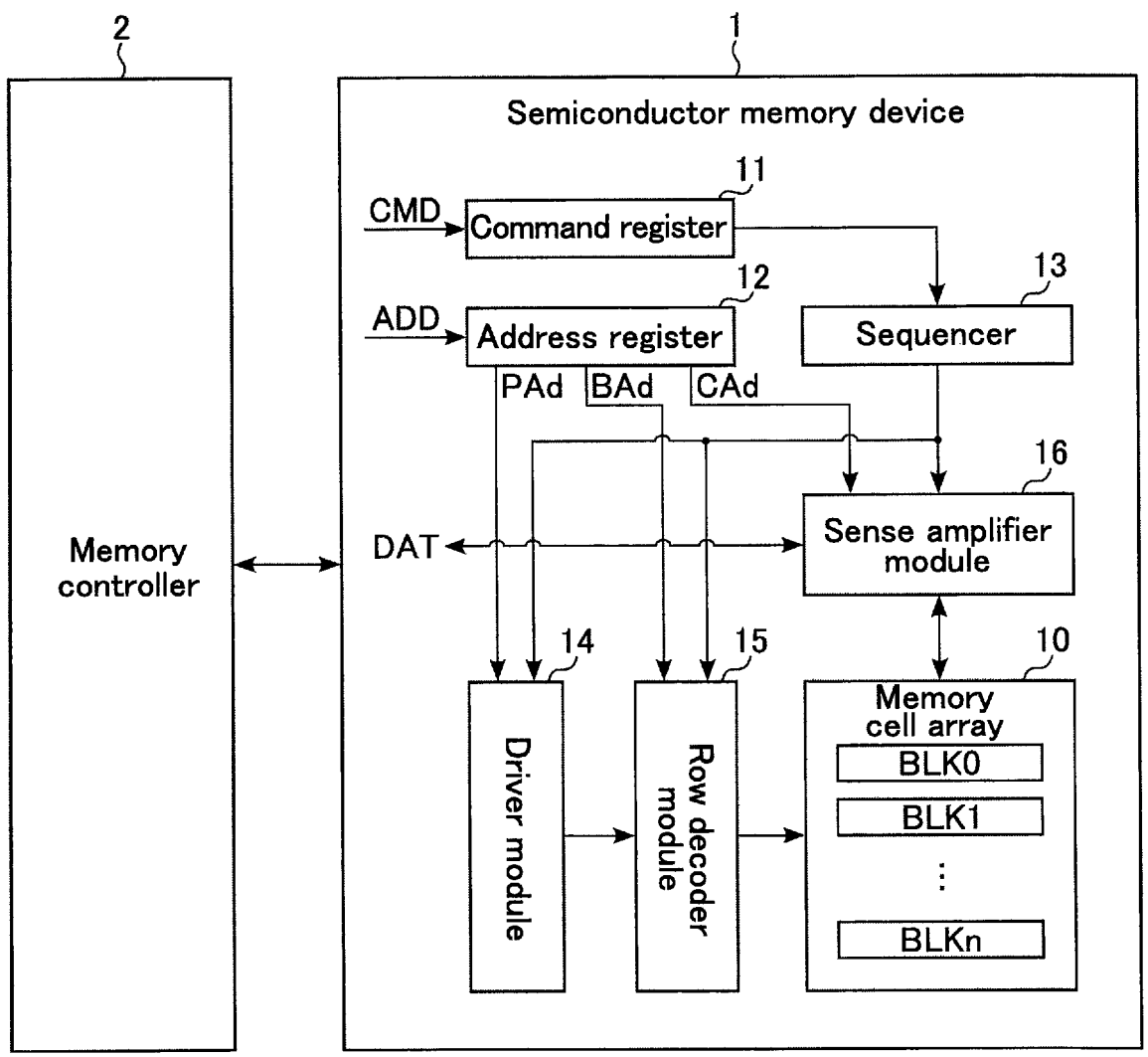
FIG. 1 is a block diagram showing a configuration example of a semiconductor memory device according to a first embodiment.

In general, according to one embodiment, a semiconductor memory device includes a first area, a second area, a plurality of conductive layers, a first member, a second member, a plurality of pillars, a third member, and a fourth member. The first area and the second area are arranged in a first direction. The plurality of conductive layers are arranged in a second direction intersecting the first direction, with first insulating layers each interposed between adjacent two of the conductive layers. The first member and the second member are arranged in a third direction intersecting each of the first direction and the second direction, the first member and the second member extend in the first direction across the first area and the second area and divide the conductive layers. The plurality of pillars penetrate the conductive layers in the first area. The third member and the fourth member is arranged in the third direction, the third member and the fourth member extend in the first direction and penetrate the conductive layers in the second area and between the first member and the second member. An intersection of each of the pillars and each of the conductive layers in the first area functions as a memory cell. The second area includes a first contact area including a first sub-area, a second sub-area, and a third sub-area, which are arranged in the first direction and interposed between the third member and the fourth member. The conductive layers include a first conductive layer, a second conductive layer, a third conductive layer, and a fourth conductive layer, which are arranged in order from bottom to top. The first conductive layer includes a first terrace portion that does not overlap conductive layers above the first conductive layer of the conductive layers in the first sub-area. The second conductive layer includes a second terrace portion that does not overlap conductive layers above the second conductive layer of the conductive layers in the third sub-area. The third conductive layer includes a third terrace portion that does not overlap conductive layers above the third conductive layer of the conductive layers in the first sub-area. The fourth conductive layer includes a fourth terrace portion that does not overlap conductive layers above the fourth conductive layer of the conductive layers in the third sub-area. At least one contact extends in the second direction from each of the first to fourth terrace portions. A part of the first sub-area of the conductive layers and a part of the third sub-area of the conductive layers are separated with the second sub-area interposed therebetween.

Hereinafter, the embodiments will be described with reference to the accompanying drawings. Each of the embodiments exemplifies a device and a method for embodying the technical idea of the invention. It should be noted that the drawings are schematic or conceptual, and that the dimensions and scale of the drawings are not necessarily the same as those of the actual products. The technical idea of the present invention is not specified by the shape, structure, arrangement, etc. of structural elements.

The description will use the same reference symbols for the structural features or components having the same or substantially the same functions and configurations. Numerals may be added after reference symbol-constituting characters in order to differentiate between elements that are denoted by reference symbols of the same characters and that have substantially the same configurations. If elements represented by reference symbols including the same letters need not be distinguished, those elements are assigned reference symbols including only the same letters.

[1] First Embodiment

Hereinafter, a semiconductor memory device 1 according to a first embodiment will be described.

[1-1] Configuration of Semiconductor Memory Device 1

[1-1-1] Overall Configuration of Semiconductor Memory Device 1

FIG. 1 shows a configuration example of the semiconductor memory device 1 according to the first embodiment. The semiconductor memory device 1 is a NAND flash memory, which can store data nonvolatilely, and can be controlled by an external memory controller 2.

As shown in FIG. 1, the semiconductor memory device 1 includes, for example, a memory cell array 10, a command register 11, an address register 12, a sequencer 13, a driver module 14, a row decoder module 15, and a sense amplifier module 16.

The memory cell array 10 includes a plurality of blocks BLK0 to BLKn (where n is an integer greater than or equal to 1). A block BLK is a group of a plurality of memory cells capable of storing data in a non-volatile manner, and is used as, for example, a data erasure unit. A plurality of bit lines and a plurality of word lines are provided in the memory cell array 10. Each memory cell is associated with, for example, one bit line and one word line. A detailed configuration of the memory cell array 10 will be described later.

The command register 11 retains a command CMD received by the semiconductor memory device 1 from the memory controller 2. The command CMD includes, for example, commands which cause the sequencer 13 to execute a read operation, a write operation, and an erase operation.

The address register 12 retains address information ADD received by the semiconductor memory device 1 from the memory controller 2. The address information ADD includes, for example, a block address BAd, a page address PAd, and a column address CAd. For example, the block address BAd, page address PAd, and column address CAd are used to select a block BLK, word line, and bit line, respectively.

The sequencer 13 controls the overall operation of the semiconductor memory device 1. For example, the sequencer 13 performs a read operation, a write operation, and an erase operation by controlling the driver module 14, the row decoder module 15, and the sense amplifier module 16, etc. based on the command CMD retained in the command register 11.

The driver module 14 generates voltages for use in a read operation, a write operation, an erase operation, etc. Then, the driver module 14 applies a generated voltage to a signal line corresponding to a selected word line based on, for example, the page address PAd retained in the address register 12.

The row decoder module 15 selects one block BLK in the corresponding memory cell array 10, based on the block address BAd retained in the address register 12. The row decoder module 15 transfers, for example, the voltage applied to the signal line corresponding to the selected word line to the selected word line in the selected block BLK.

The sense amplifier module 16 applies a desired voltage to each bit line in a write operation, in accordance with data DAT received from the memory controller 2. In a read operation, the sense amplifier module 16 determines data stored in a memory cell based on the voltage of the bit line, and transfers the determination result to the memory controller 2 as the data DAT.

The above-described semiconductor memory device 1 and memory controller 2 may constitute a single semiconductor memory device in combination. Examples of such semiconductor memory devices include a memory card such as an SD™ card, a solid state drive (SSD), etc.

[1-1-2] Circuit Configuration of Memory Cell Array

FIG. 2 shows one of a plurality of blocks BLK included in the memory cell array 10 as an example of the circuit configuration of the memory cell array 10 included in the semiconductor memory device 1 according to the first embodiment. As shown in FIG. 2, the block BLK includes, for example, four string units SU0 to SU3.

Each string unit SU includes a plurality of NAND strings NS that are respectively associated with bit lines BL0 to BLm (with m being an integer greater than or equal to 1). Each NAND string NS includes, for example, memory cell transistors MT0 to MT7 and select transistors ST1 and ST2. Each memory cell transistor MT includes a control gate and a charge storage layer, and stores data in a non-volatile manner. Each of the select transistors ST1 and ST2 is used to select a string unit SU at the time of performing various operations.

In each NAND string NS, memory cell transistors MT0 to MT7 are coupled in series. The drain of the select transistor ST1 is coupled to an associated bit line BL, and the source of the select transistor ST1 is coupled to one end of the memory cell transistors MT0 to MT7, which are coupled in series. The drain of the select transistor ST2 is coupled to the other end of the memory cell transistors MT0 to MT7, which are coupled in series. The source of the select transistor ST2 is coupled to the source line SL.

In the same block BLK, the control gates of the memory cell transistors MT0 to MT7 are respectively coupled in common to word lines WL0 to WL7. The gates of the select transistors ST1 in the string units SU0 to SU3 are coupled in common to select gate lines SGD0 to SGD3, respectively. The gates of the select transistors ST2 in the same block BLK are coupled in common to a select gate line SGS.

Different column addresses are assigned to the bit lines BL0 to BLm. Each bit line BL is shared by the NAND strings NS to which the same column address is assigned among a plurality of blocks BLK. A set of word lines WL0 to WL7 is provided for each block BLK. The source line SL is shared by a plurality of blocks BLK.

A set of memory cell transistors MT coupled to a common word line WL in a single string unit SU is referred to as, for example, a "cell unit CU". For example, the storage capacity of a cell unit CU including memory cell transistors MT, which individually store 1-bit data, is defined as "1-page data". A cell unit CU may have a storage capacity of 2 or more pages of data, according to the number of bits of data stored in the memory cell transistor MT.

The circuit configuration of the memory cell array 10 included in the semiconductor memory device 1 according to the embodiment is not limited to the above-described one. The number of string units SU in a block BLK and the numbers of memory cell transistors MT and select transistors ST1 and ST2 in a NAND string NS may be any number.

[1-1-3] Configuration of Memory Cell Array 10

An exemplary structure of the semiconductor memory device 1 according to the first embodiment will be described below. In the drawings mentioned below, the X direction corresponds to the extending direction of the word lines WL, the Y direction corresponds to the extending direction of the bit lines BL, and the Z direction corresponds to the extending direction perpendicular to the surface of a semiconductor substrate 20, which is used for the formation of the semiconductor memory device 1. In the plan views, hatching is applied as appropriate for improved viewability. The hatching applied to the plan views is not necessarily related to the materials or characteristics of the hatched structural element. To enhance the viewability of the drawings, wirings, contacts and inter-layer insulating films are omitted, as appropriate, from the cross-sectional views.

(Planar Layout of Memory Cell Array)

FIG. 3 shows an example of a planar layout of the memory cell array 10 in the semiconductor memory device 1 in the region corresponding to four blocks BLK0-BLK3 according to the first embodiment. As illustrated in FIG. 3, the planar layout of the memory cell array 10 is divided into a cell area CA and a hookup area HA in the X direction. The memory cell array 10 includes slits SLT, SLTH, SLTV and SHE.

The cell area CA is adjacent to the hookup area HA. A plurality of NAND strings NS are formed in the cell area CA. A contact is formed in the hookup area HA to establish an electrical connection between the row decoder module 15 and the word lines WL and select gate lines SGS and SGD coupled to the NAND string NS.

Each of the slits SLT, SHE, SLTH, and SLTV has a structure in which the inside is filled by an insulating material. Each of the slits SLT and SHE separates any two conductive layers arranged adjacent to each other with the slit interposed therebetween in the same interconnect layer.

The slits SLT extend in the X direction, and are aligned in the Y direction. Each of the slits SLT extends in the X direction across the cell area CA and hookup area HA. The slits SLT divide the word lines WL0 to WL7, and the select gate lines SGD and SGS.

Each of the slits SHE is arranged between any two adjacent slits SLT. The slit SHE extends in the X direction from the end region of the hookup area across the cell area CA. The slit SHE divides at least the select gate line SGD.

Each of the slits SLTH extends in the X direction in the hookup area HA. A pair of slits SLTH is arranged between any two adjacent slits SLT. Each of the slits SLTH is separated from each of the slits SLT and the slits SHE. The slits SLTH divide the word lines WL0 to WL7, and the select gate line SGS.

Each of the slits SLTV extends in the Y direction in the hookup area HA. A pair of slits SLTV is arranged between the two adjacent slits SLTH interposed between any two adjacent slits SLT. The two slits SLTH interposing the slits SLTV are in contact with both ends of the slits SLTV in the Y direction. The slits SLTV of one pair are located near a central portion of the slits SLTH, and separated from each other in the X direction.

In the following description, a portion including a set of slits SLTH and a set of slits SLTV interposed between the slits SLTH is referred to as a "ladder portion HP". In the ladder portion HP, the slits SLTH and the slit SLTV are almost the same in height.

In the planar layout of the memory cell array 10 described above, each area sectioned by the slits SLT and SHE in the cell area CA corresponds to one string unit SU.

In this example, the string units SU0 to SU3, each extending in the X direction, are aligned in the Y direction. Then, the pattern laid out in FIG. 3 is repeated in the Y direction in the memory cell array 10.

The number of slits SHE arranged between any adjacent two slits SLT may be determined as appropriate. The number of string units SU arranged between any adjacent two slits SLT varies depending on the number of slits SHE arranged between the adjacent two slits SLT.

(Structure of Memory Cell Array 10 in Cell Area CA)

Figure 4:
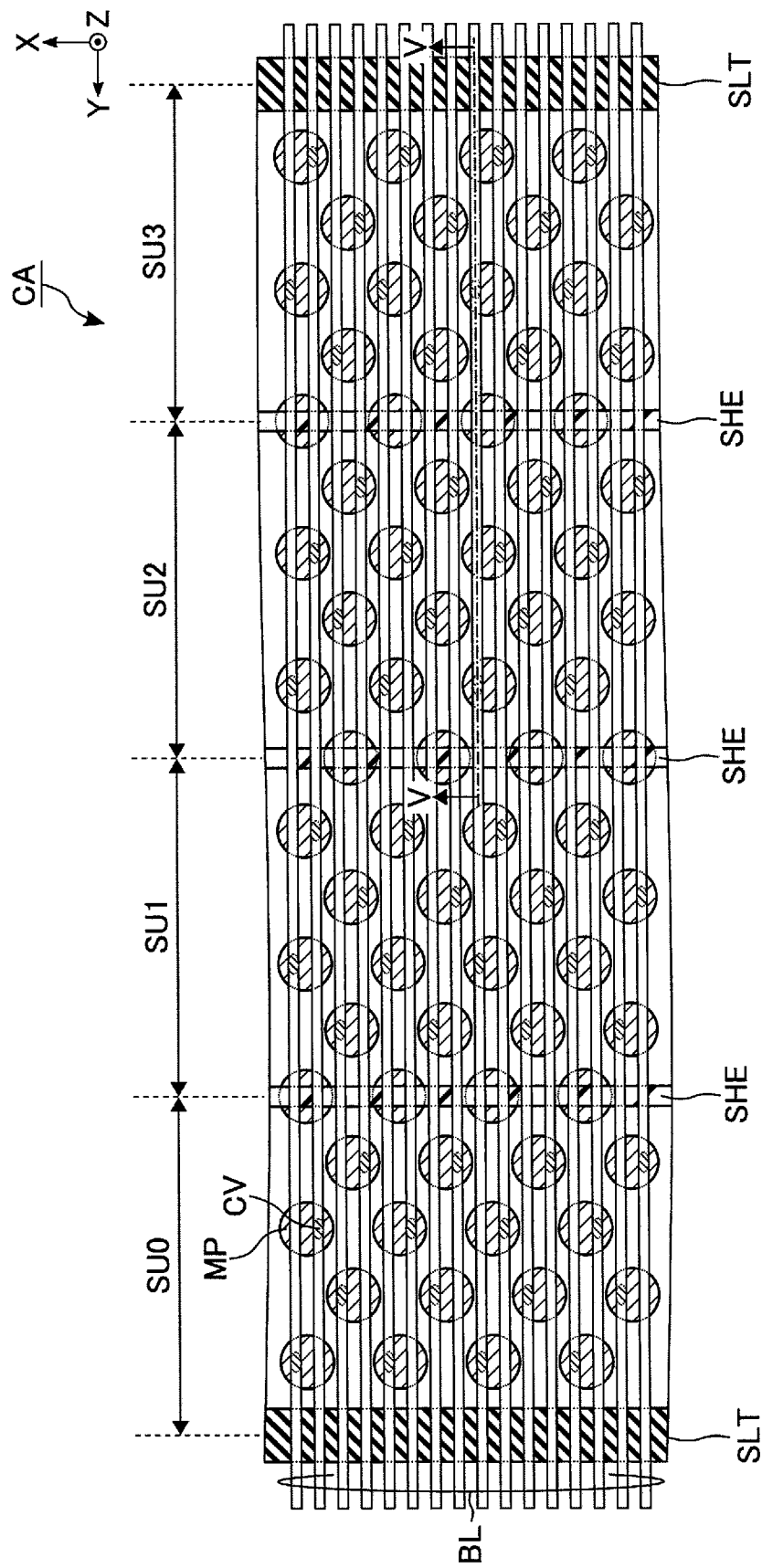
FIG. 4 is a plan view showing an example of a planar layout in a cell area of the memory cell array included in the semiconductor memory device according to the first embodiment.

FIG. 4 is a plan view showing an example of a detailed planar layout of the cell area CA in the memory cell array 10 in the semiconductor memory device 1 according to the first embodiment, which shows the region corresponding to one block BLK (namely, string units SU0 to SU3). As shown in FIG. 4, the memory cell array 10 in the cell area CA includes a plurality of memory pillars MP, a plurality of contacts CV, and a plurality of bit lines BL.

Each memory pillar MP functions as, for example, one NAND string NS. The plurality of memory pillars MP are arranged in 19 rows in a staggered manner, for example, in the region between the adjacent slits SLT. For example, a part of the memory pillars MP in the middle portion between adjacent slits SLT in the X direction overlaps slits SHE. In other words, some of the memory pillars MP are divided by the slits SHE, and brought into contact with the adjacent select gate line SGD.

The bit lines BL extend in the Y direction and are aligned in the X direction. Each bit line BL is arranged so as to overlap at least one of the memory pillars MP in each string unit SU. In the present example, two bit lines BL overlap each memory pillar MP. A contact CV is provided between one of the bit lines BL overlapping the memory pillar MP and that memory pillar MP. Each memory pillar MP is electrically coupled to the corresponding bit line BL via the contact CV.

A contact CV between a memory pillar MP overlapping the slit SHE and a bit line BL is omitted. That is, a contact CV between a memory pillar MP and the bit lines BL is omitted when the memory pillar MP is in contact with two different select gate lines SGD. The number and arrangement of memory pillars MP, slits SHE and the like between any adjacent slits SLT are not limited to the structure explained with reference to FIG. 4, and may be modified as needed. The number of bit lines BL overlapping each memory pillar MP may be designed to be any number.

Figure 5:
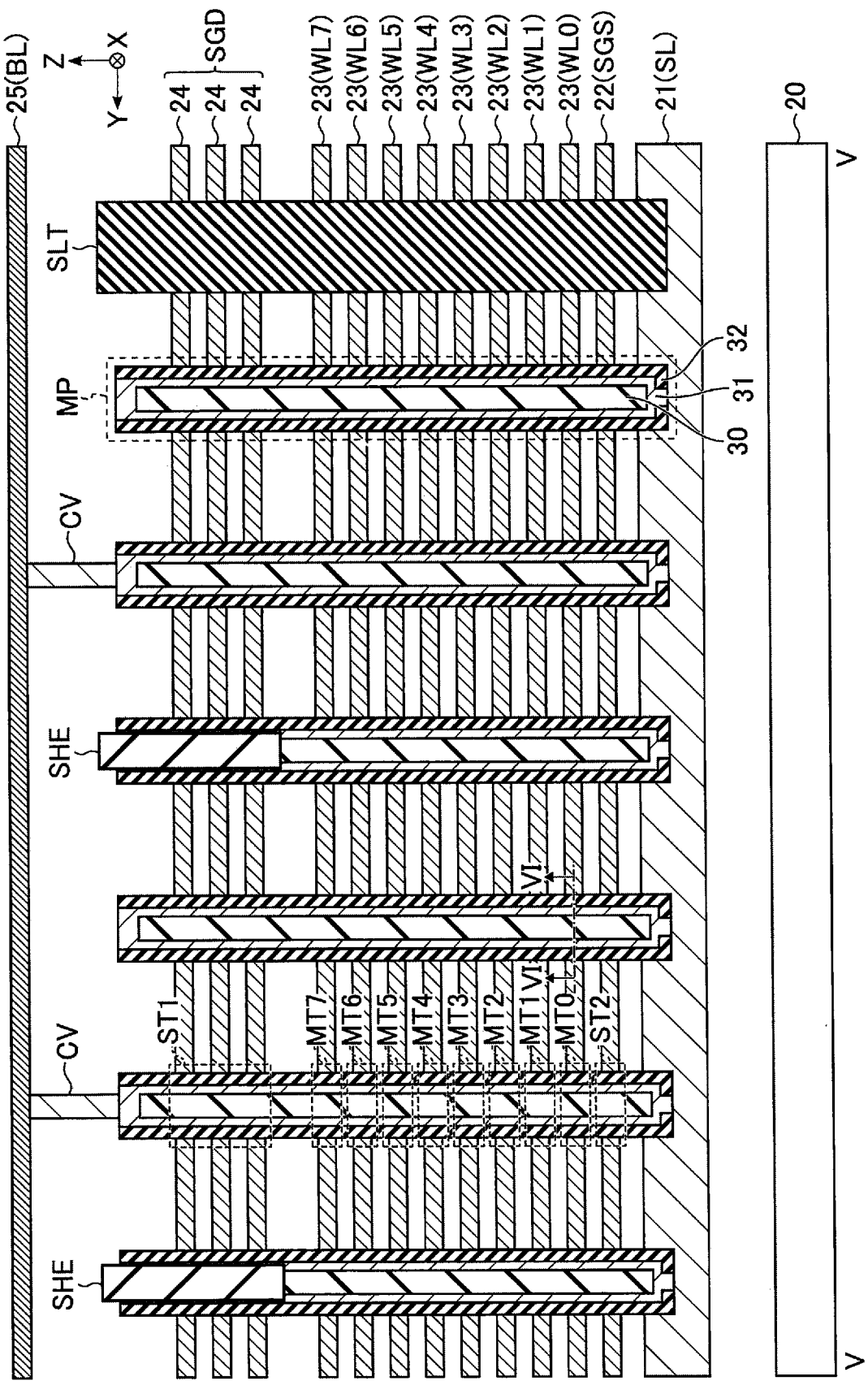
FIG. 5 is a cross-sectional view showing an example of a cross-sectional structure in the cell area of the memory cell array taken along line V-V of FIG. 4.

FIG. 5 is a cross-sectional view of the structure taken along line V-V in FIG. 4, showing an example of a cross-sectional structure of the cell area CA in the memory cell array 10 in the semiconductor memory device 1 according to the first embodiment. The memory cell array 10 includes conductive layers 21 to 25, as shown in FIG. 5. The conductive layers 21 to 25 are provided above the semiconductor substrate 20.

Specifically, the conductive layer 21 is provided above the semiconductor substrate 20 with an insulating layer interposed therebetween. Although not shown, circuits corresponding to, for example, the row decoder module 15 and sense amplifier module 16, are provided in the insulating layer between the semiconductor substrate 20 and the conductive layer 21. The conductive layer 21 has a structure in which a plurality of plate-like conductive layers expanding in the XY plane are stacked, and is used as a source line SL. The conductive layer 21 contains, for example, phosphorous-doped silicon.

The conductive layer 22 is provided above the conductive layer 21 with an insulating layer interposed therebetween. For example, the conductive layer 22 is formed in a plate-like shape expanding in the XY plane, and used as a select gate line SGS. The conductive layer 22 contains, for example, tungsten.

The insulating layers and the conductive layers 23 are alternately stacked above the conductive layer 22. For example, each conductive layer 23 is formed in a plate-like shape extending along the XY plane. A plurality of stacked conductive layers 23 are used as word lines WL0 to WL7 in order from the semiconductor substrate 20's side. The conductive layers 23 contain, for example, tungsten.

Insulating layers and conductive layers 24 are alternately stacked above the topmost conductive layer 23. For example, the thickness of the insulating layer between the topmost conductive layer 23 and the lowermost conductive layer 24 is greater than that of the insulating layer between the adjacent conductive layers 23 and the insulating layer between the adjacent conductive layers 24. Each conductive layer 24 is formed, for example, in a plate-like shape expanding on the XY plane. The stacked conductive layers 24 are used as select gate lines SGD. The conductive layers 24 contain, for example, tungsten.

The conductive layers 25 are provided above the conductive layers 24 with an insulating layer interposed therebetween. Each conductive layer 25 is formed in, for example, a linear shape extending in the Y direction, and is used as a bit line BL. That is, the conductive layers 25 are aligned in the X direction in a region not shown in the drawings. The conductive layer 25 contains, for example, copper.

Each of the memory pillars MP extends in the Z direction, and penetrates the conductive layers 22 to 24. Each of the memory pillars MP includes, for example, a core member 30, a semiconductor layer 31, and a stacked film 32.

The core member 30 extends in the Z direction. For example, the top end of the core member 30 is included in a layer above the topmost conductive layer 24, and the bottom end of the core member 30 is included in a layer in which the conductive layer 21 is deposited. The semiconductor layer 31 covers the periphery of the core member 30. Part of the semiconductor layer 31 is brought into contact with the conductive layer 21 at the bottom of the memory pillar MP. The stacked film 32 covers the side and bottom surfaces of the semiconductor layer 31 except for the portion where the semiconductor layer 31 and the conductive layer 21 are in contact with each other. The core member 30 includes an insulator such as silicon oxide ($SiO_2$). The conductive layer 31 includes, for example, silicon.

A pillar-shaped contact CV is provided on the top surface of the semiconductor layer 31 in the memory pillar MP. Of the six memory pillars MP in FIG. 5, contacts CV corresponding to two memory pillars MP are illustrated. A memory pillar MP not overlapping the slit SHE, with no contact CV coupled in the region in this drawing, is provided with a contact CV in a different region.

An upper surface of the contact CV is in contact with one conductive layer 25, that is, one bit line BL. One contact CV is coupled to one conductive layer 25 in each space sectioned by the slits SLT and SHE, and the memory pillars MP in contact with the slit SHE. In other words, for example, one memory pillar MP arranged between the slit SLT and its adjacent slit SHE and one memory pillar MP arranged between two adjacent slits SHE are electrically coupled in each of the conductive layers 25. The slit SLT is formed into, for example, a plate-like shape expanding along the XZ plane, and divides the conductive layers 22 to 24. An upper end of the slit SLT is included in a layer between the topmost conductive layer 24 and the conductive layer 25. A lower end of the slit. SLT is included in, for example, a layer where the conductive layer 21 is provided. The slit SLT includes an insulator such as silicon oxide. A linear contact may be formed in the slit SLT. In this case, the linear contact is coupled to the source line SL, and the contact is insulated from the conductive layers 22 to 24.

The slit SHE is formed into, for example, a plate-like shape expanding along the XZ plane, and divides the stacked conductive layers 24. An upper end of the slit SHE is included in a layer between the conductive layer 24 and the conductive layer 25. A lower end of the slit SHE is included in a layer arranged between the topmost conductive layer 23 and the lowermost conductive layer 24. The slit SHE includes an insulator such as silicon oxide. The upper end of the slit SHE and the upper end of the memory pillar MP may or may not be aligned.

In the above described structure of the memory pillar MP, the intersecting portion of the memory pillar MP and the conductive layer 22 functions as a select transistor ST2. The intersecting portion of the memory pillar MP and the conductive layer 23 functions as a memory cell transistor MT. The intersecting portion of the memory pillar MP and the conductive layer 24 functions as a select transistor ST1.

Figure 6:
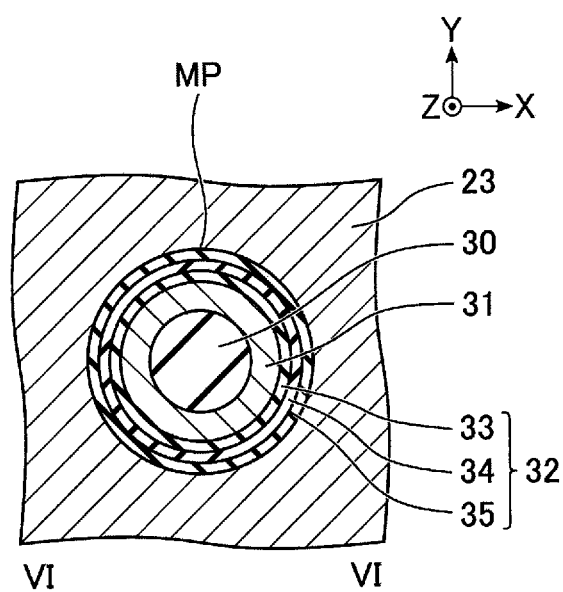
FIG. 6 is a cross-sectional view showing an example of a cross-sectional structure of a memory pillar taken along line VI-VI of FIG. 5.

FIG. 6 is a cross-sectional view of the structure taken along line VI-VI of FIG. 5, showing an exemplary cross-sectional structure of a memory pillar MP in the semiconductor memory device 1 according to the first embodiment. More specifically, FIG. 5 shows a cross-sectional structure of a memory pillar MP in a layer parallel to the surface of the semiconductor substrate 20 and including the conductive layer 23. As shown in FIG. 6, the stacked film 32 includes, for example, a tunnel insulating film 33, an insulating film 34, and a block insulating film 35.

The core member 30 is arranged in the middle of the memory pillar MP in the layer including the conductive layers 23. The semiconductor layer 31 surrounds the side surface of the core member 30. The tunnel insulating film 33 surrounds the side surface of the semiconductor layer 31. The insulating film 34 surrounds the side surface of the tunnel insulating film 33. The block insulating film 35 surrounds the side surface of the insulating film 34. The conductor layer 23 surrounds the side surface of the block insulating film 35.

The semiconductor layer 31 is used as a channel for the memory cell transistors MT0 to MT7 and select transistors ST1 and ST2. Each of the tunnel insulating film 33 and the block insulating film 35 contains, for example, silicon oxide. The insulating film 34 is used as a charge storage layer for the memory cell transistor MT, and contains, for example, silicon nitride (SiN). In this manner, each of the memory pillars MP function as a NAND string NS.

(Structure of Memory Cell Array in Hookup Area)

Figure 7:
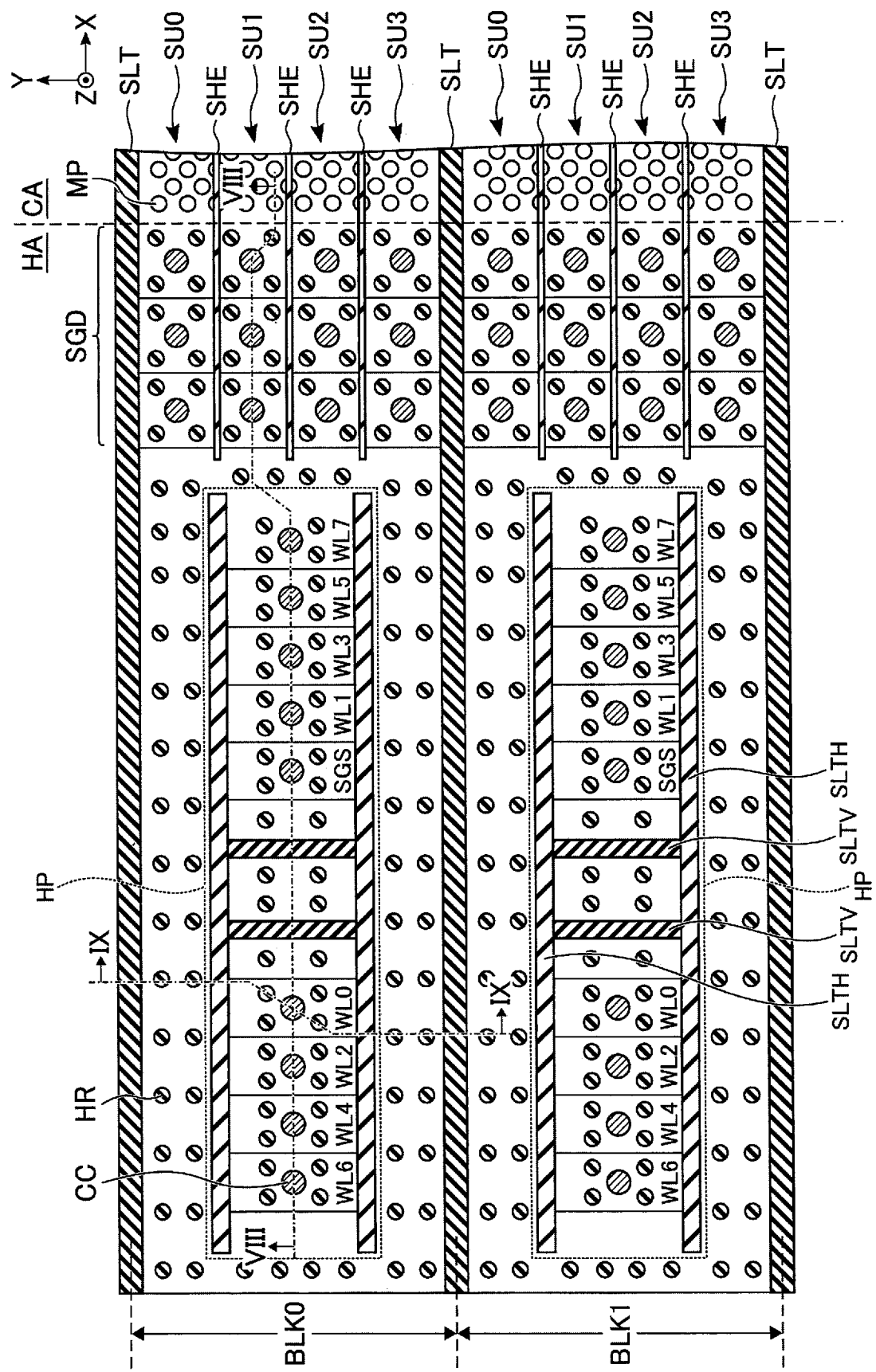
FIG. 7 is a plan view showing an example of a planar layout in a hookup area of the memory cell array included in the semiconductor memory device according to the first embodiment.

FIG. 7 is a plan view showing an example of a detailed planar layout of a hookup area HA of the memory cell array 10 in the semiconductor memory device 1 according to the first embodiment, which shows the region corresponding to the adjacent blocks BLK0 and BLK1. FIG. 7 also shows part of the cell area CA in the vicinity of the hookup area HA.

As shown in FIG. 7, in the hookup area HA, each of the select gate line SGS, the word lines WL0 to WL7, and the select gate lines SGD includes a portion (terrace portion) that does not overlap the upper interconnect layers (conductive layers). The portion that does not overlap the upper interconnect layers in the hookup area HA resembles a step, terrace, or rimstone. The memory cell array 10 in the hookup area HA includes a plurality of contacts CC and support pillars HR.

In each of the select gate line SGS, the word lines WL0 to WL7, a portion that does not overlap the upper interconnect layers is provided in a ladder portion HP. Specifically, in the ladder portion HP, a set of terrace portions of the select gate line SGS and the word lines WL1, WL3, WL5, and WL7 faces a set of terrace portions of the word lines WL0, WL2, WL4, and WL6 with the set of slits SLTV interposed therebetween. Steps are individually provided between the select gate line SGS and the word line WL1, between the word line WL1 and the word line WL3, between the word line WL3 and the word line WL5, and between the word line WL5 and the word line WL7. Similarly, steps are individually provided between the word line WL0 and the word line WL2, between the word line WL2 and the word line WL4, and between the word line WL4 and the word line WL6.

The configuration of the ladder portion HP can also be described as follows: The ladder portion HP corresponds to a contact area, where terrace portions are provided and contacts CC are formed on the terrace portions, in the conductive layers corresponding to the select gate line SGS and the word lines WL0 to WL7. The ladder portion HP includes a first sub-area, a second sub-area, and a third sub-area arranged in this order in the X direction. The first sub-area includes the respective terrace portions of the word lines WL0, WL2, WL4, and WL6. The second sub-area includes a set of slits SLTV. The third sub-area includes the respective terrace portions of the select gate line SGS, and the word lines WL1, WL3, WL5, and WL7. The first sub-area includes steps that become higher in a direction away from the cell area CA. The third sub-area includes steps that become higher in a direction approaching the cell area CA.

The respective terrace portions of the select gate line SGS and the word lines WL are substantially the same in width in the X direction. The width of the terrace portion in the X direction is hereinafter referred to as "one terrace width". The distance in terms of width between the slits SLTV in the X direction in the ladder portion HP is designed to be wider than the terrace portion in the X direction.

In each of the select gate lines SGD, a portion that does not overlap the upper interconnect layers is provided in the hookup area HA and near the boundary between the cell area CA and the hookup area HA. The respective terrace portions of the conductive layers corresponding to the select gate lines SGD have steps in the X direction.

In this example, the select gate line SGS and the word lines WL of the same layer in the same block BLK are electrically coupled through a region around the ladder portion HP of the hookup area HA. In other words, each of the select gate line SGS and the word lines WL0 to WL7 has a portion divided by the slits SLTH and SLTV in the ladder portion HP, but continuously provided detouring the ladder portion HP.

In the hookup area HA, the contacts CC are provided in the respective terrace portions of the word lines WL0 to WL7 and the select gate lines SGS and SGD. Each of the word lines WL0 to WL7 and the select gate lines SGS and SGD is electrically coupled to the row decoder module 15 by way of the corresponding contact CC.

The support pillars HR are arranged as appropriate in the hookup area HA, except for the regions corresponding to the slits SLT, SLTH, and SLTV and the contacts CC. A support pillar HR has a structure in which an insulating material is embedded in a hole extending in the Z direction, and penetrates the stacked interconnect layers, such as the word lines WL and the select gate lines SGS and SGD.

FIG. 8 is a cross-sectional view of the structure taken along line VIII-VIII in FIG. 7, showing an example of a cross-sectional structure of the hookup area HA of the memory cell array 10 in the semiconductor memory device 1 according to the first embodiment. FIG. 8 also shows part of the cell area CA near the hookup area HA. As shown in FIG. 8, portions of the conductive layers corresponding to the word lines WL and the select gate lines SGS and SGD are formed into stairs in the hookup area HA. Specifically, a plurality of terrace portions corresponding to the word lines WL0 to WL7 and the select gate lines SGS and SGD are included in the illustrated region. The memory cell array 10 in the hookup area HA includes a plurality of conductive layers 26.

A set of terrace portions of the select gate line SGS and the word lines WL1, WL3, WL5, and WL7 faces a set of terrace portions of the word lines WL0, WL2, WL4, and WL6 with the set of slits SLTV interposed therebetween. A step corresponding to two layers of the conducive layers 23 is formed by the terrace portions adjacent to each other in the X direction. The respective terrace portions of the conductive layers 24 corresponding to the select gate lines SGD are arranged in the X direction. A step corresponding to one layer of the conductive layers 24 is provided by the terrace portions adjacent to each other in the X direction.

One contact CC is provided on each of the terrace portions of the conductive layer 22 corresponding to the select gate line SGS, the eight conductive layers 23 respectively corresponding to the word lines WL0 to WL7, and the three conductive layers 24 corresponding to the select gate line SGD. One conductive layer 26 is provided on, and electrically coupled to, each of the contacts CC. Each conductive layer 26 is included in the same interconnect layer as the conductive layer 25.

The support pillar HR extends in the Z direction and, for example, penetrates the conductive layers 22 to 24. An upper end of the support pillar HR is included in, for example, a layer between the conductive layer 24 and the conductive layer 25. A lower end of the support pillar HR is included in, for example, a layer lower than the conductive layer 22. The upper end of the support pillar HR and the upper end of the memory pillar MP may or may not be aligned.

FIG. 9 is a cross-sectional view of the structure taken along line IX-IX in FIG. 7, showing an example of a cross-sectional structure of the hookup area HA in the memory cell array 10 in the semiconductor memory device 1 according to the first embodiment. The cross section shown in FIG. 9 includes a terrace portion of the word line WL0.

As shown in FIG. 9, in the area sandwiched between the slits SLTH, the conductive layer 22 corresponding to the select gate line SGS and the conductive layer 23 corresponding to the terrace portion of the word line WL0 are provided, while no conductive layer 23 is provided in layers above the word line WL0. The insulation layer is formed in each of the layers having no conductive layer 23.

On the other hand, the conductive layers 23, respectively corresponding to the word lines WL0 to WL7, are provided between the slit SLT and the slit SLTH adjacent to each other in the Y direction. Thus, the region provided with the conductive layers 23, corresponding to the word lines WL0 to WL7, and the region provided with the terrace portion of the conductive layer 23 are separated by the slit SLTH as a boundary.

The conductive layer 23 provided with the terrace portion in a place farther from the cell area CA within the ladder portion HP is continuous to the conductive layer 23 within the cell area CA via a portion around the slit SLTH, namely, the conductive layer 23 between the slit SLT and the slit SLTH. In that portion, the support pillars HR and the slit SLTH are lower than the slit SLT.

[1-2] Manufacturing Method

Figure 10:
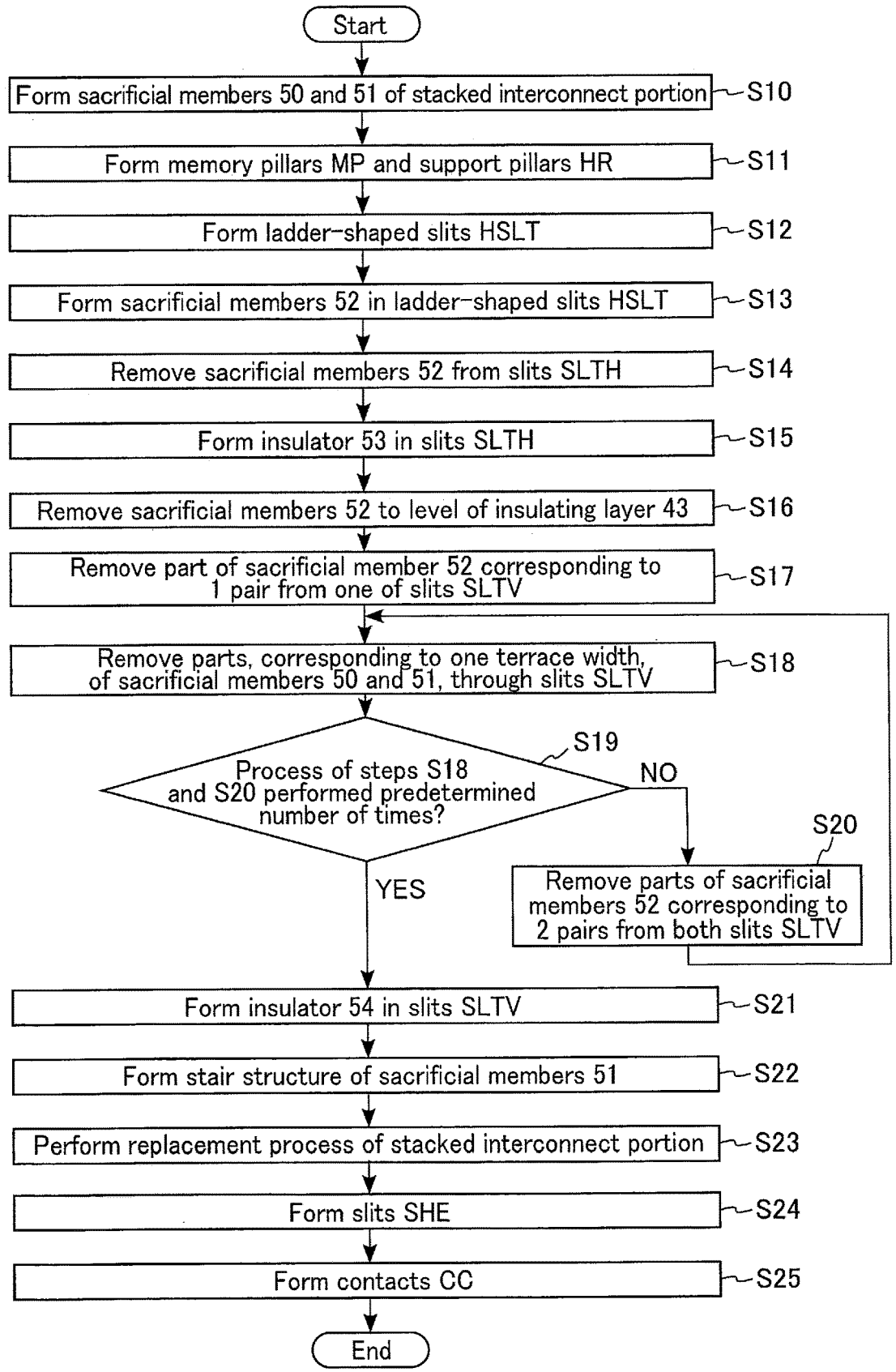
FIG. 10 is a flowchart showing an example of a manufacturing process of the semiconductor memory device according to the first embodiment.

Hereinafter, a series of manufacturing steps to form the semiconductor memory device 1 according to the first embodiment will be described with reference to FIG. 10 as appropriate. FIG. 10 is a flowchart showing an example of the manufacturing steps of the semiconductor memory device 1 according to the first embodiment. FIGS. 11 to 33 each show an example of the cross-sectional structure of a region including the hookup area HA in the manufacturing steps of the semiconductor memory device 1 according to the first embodiment.

Figure 11:
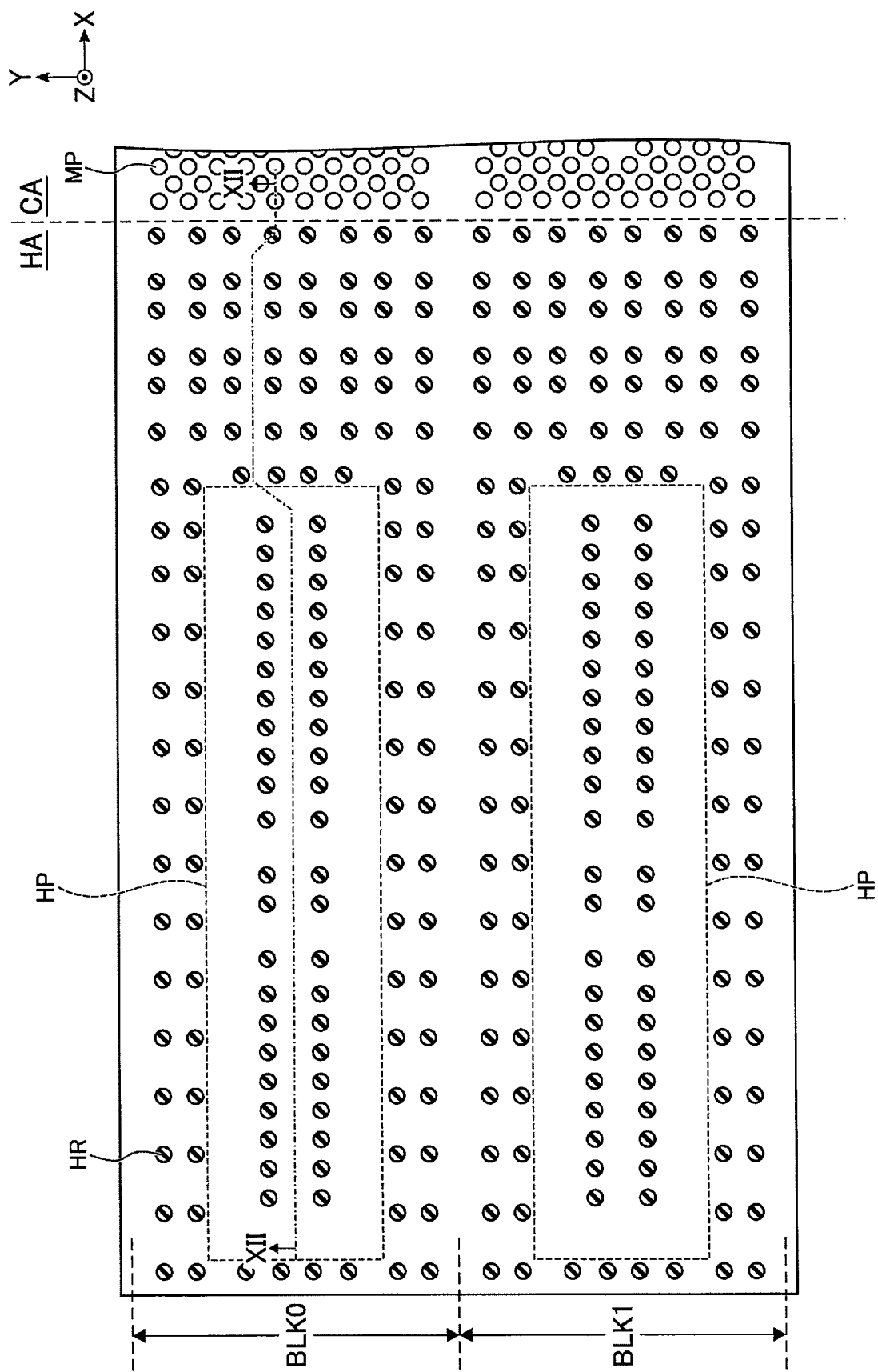
FIG. 11 is a cross-sectional view of the memory cell array showing an example of the manufacturing process of the semiconductor memory device according to the first embodiment.
Figure 12:
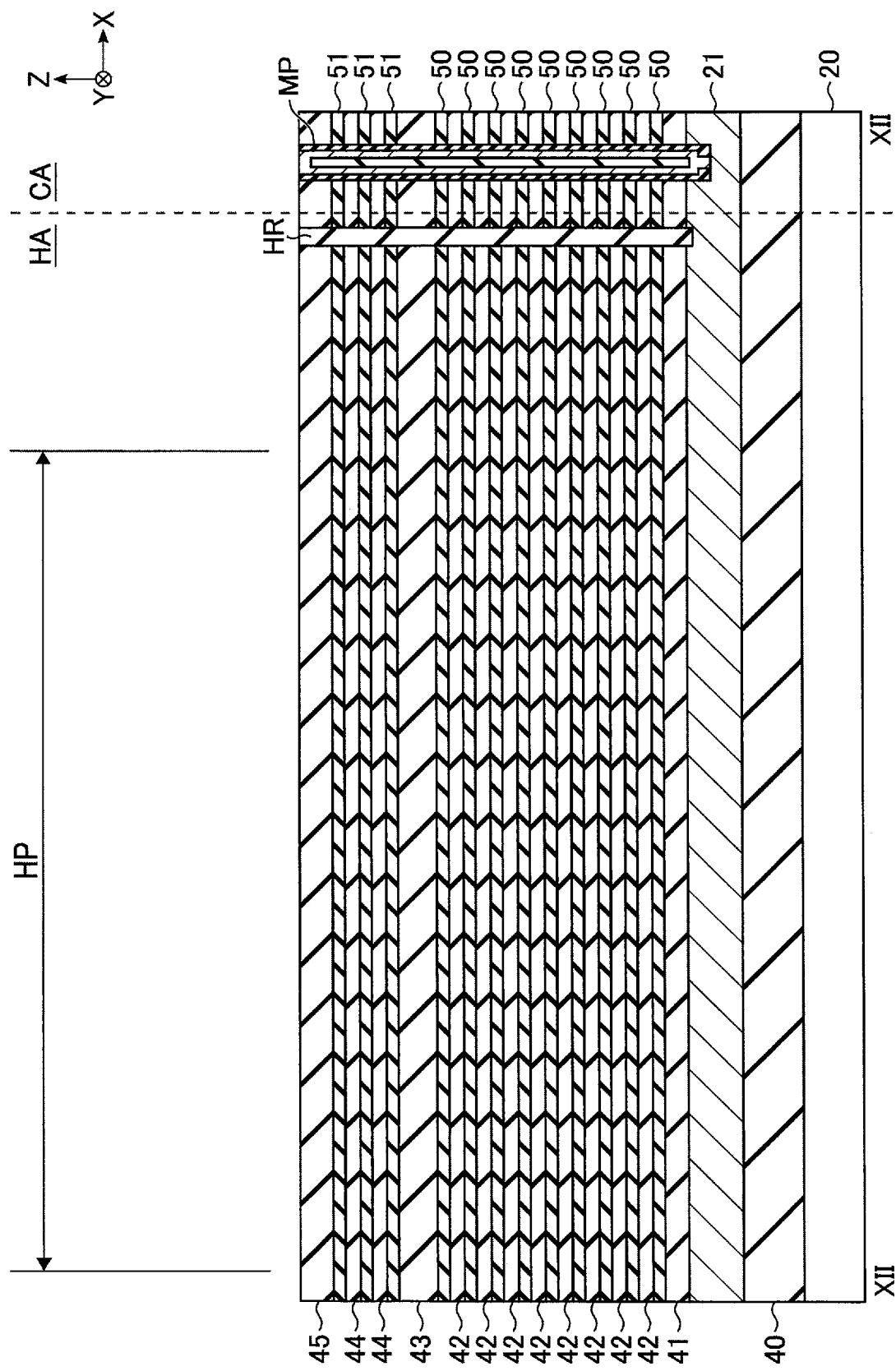
FIG. 12 is a cross-sectional view of the memory cell array, taken along line XII-XII of FIG. 11.

First, as shown in FIGS. 11 and 12, sacrificial members 50 and 51 of a stacked interconnect portion are stacked (step S10), and memory pillars MP and support pillars HR are formed (step S11). Specifically, an insulating layer 40, a conductive layer 21, and an insulating layer 41 are sequentially formed on a semiconductor substrate 20. On the insulating layer 41, the sacrificial members 50 and insulating layers 42 are alternately stacked. An insulating layer 43 is formed on the topmost sacrificial member 50. The insulating layer 43 is thicker than the insulating layer 42. On the insulating layer 43, the sacrificial members 51 and insulating layers 44 are alternately stacked. An insulating layer 45 is formed on the topmost sacrificial member 51.

The conductive layer 21 corresponds to the source line SL. The conductive layer 21 contains, for example, silicon (Si). Each of the insulating layers 40, 41, 42, 43, 44, and 45 contains, for example, silicon oxide ($SiO_2$). The sacrificial members 50 correspond to the select gate line SGS and the word lines WL. For example, the number of layers in which the sacrificial members 50 are formed corresponds to the number of select gate lines SGS and word lines WL to be stacked. The sacrificial members 51 correspond to the select gate lines SGD. For example, the number of layers in which the sacrificial members 51 are formed corresponds to the number of select gate lines SGD to be stacked. Each of the sacrificial members 50 and 51 contains, for example, silicon nitride (SiN).

A mask in which regions corresponding to the memory pillar MP and the support pillar HR are opened is formed by photolithography, etc. Then, by anisotropic etching using the formed mask, a space to provide the memory pillars MP and the support pillars HR is formed. The anisotropic etching in this step is, for example, reactive ion etching (RIE). Then, the memory pillars MP and the support pillars HR are formed in the provided space. For example, the memory pillars MP are arranged in a staggered manner in the cell area CA. The support pillars HR are arranged in the hookup area HA. In the ladder portion HP of the hookup area HA, the support pillars HR are arranged so as not to overlap the region where the slits SLTH and SLTV are provided.

Figure 13:
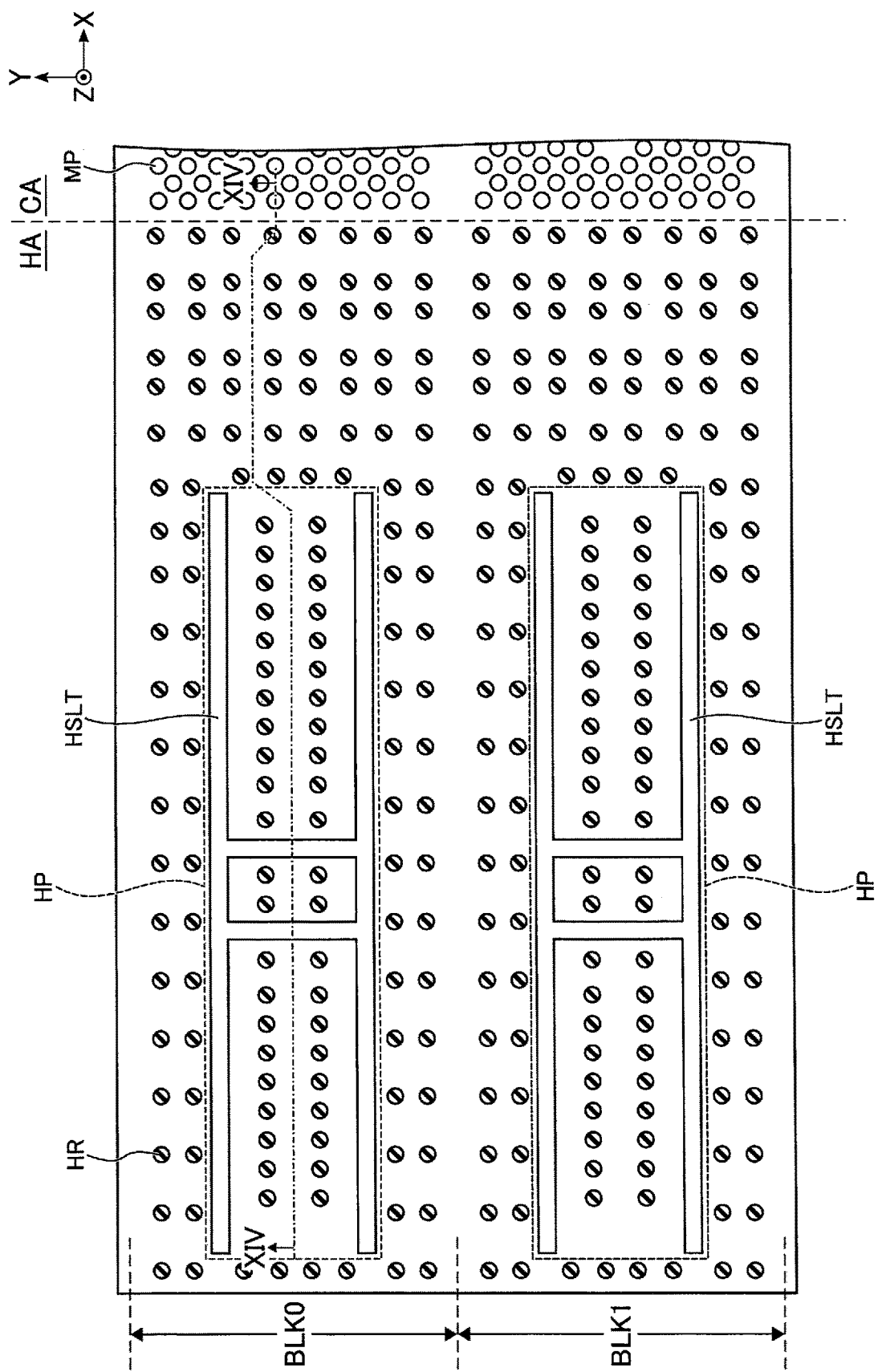
FIG. 13 is a cross-sectional view of the memory cell array showing an example of the manufacturing process of the semiconductor memory device according to the first embodiment.
Figure 14:
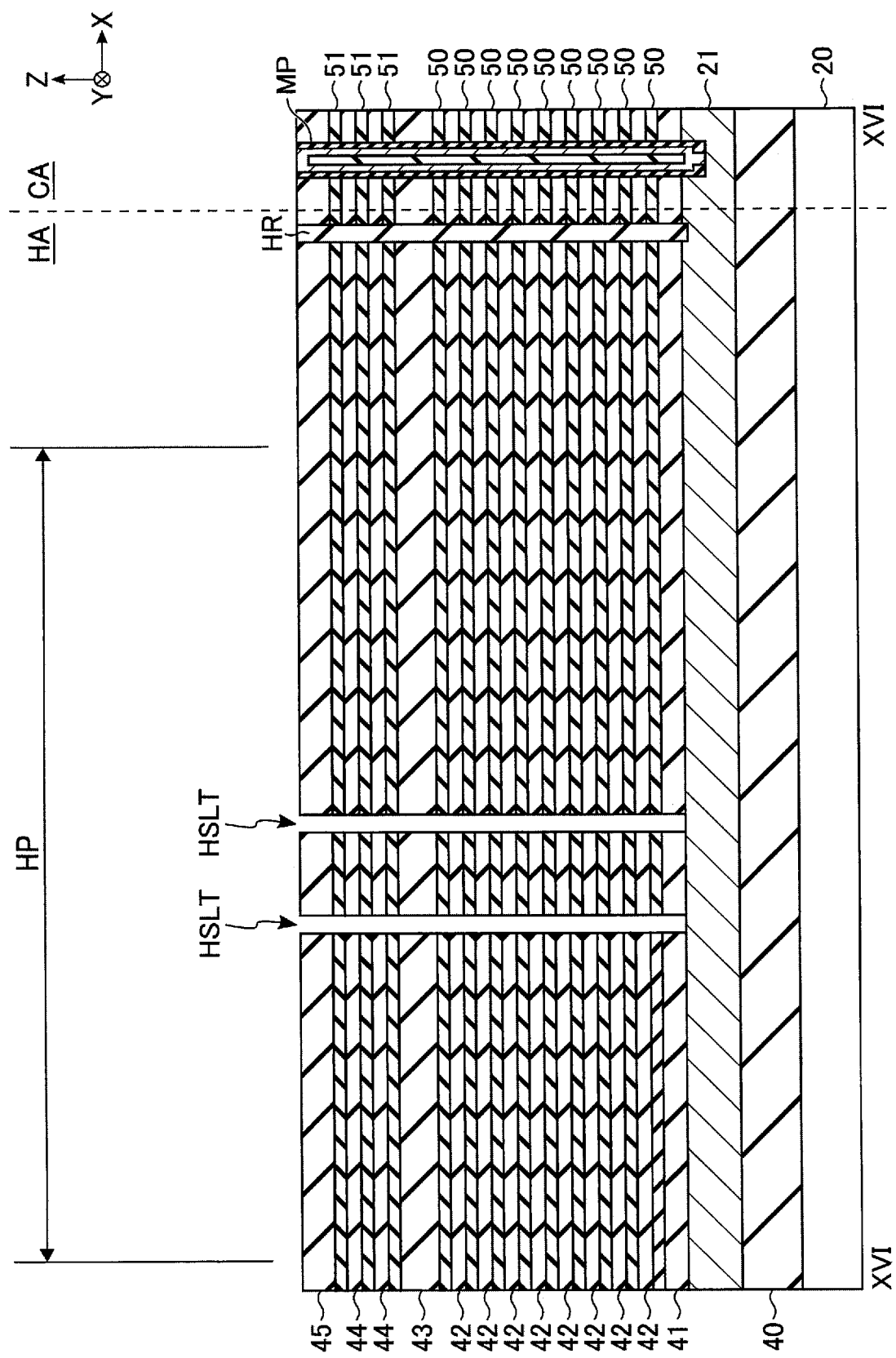
FIG. 14 is a cross-sectional view of the memory cell array, taken along line XIV-XIV of FIG. 13.

Subsequently, as shown in FIGS. 13 and 14, ladder-shaped slits HSLT are formed (step S12). The ladder-shaped slits HSLT correspond to opening portions in the region where the slits SLTH and SLTV are provided. Specifically, first, a mask in which regions corresponding to the ladder-shaped slits HSLT are opened is formed by photolithography, etc. Then, the ladder-shaped slits HSLT are formed by the anisotropic etching using the formed mask.

Each ladder-shaped slit HSLT formed in the present process penetrates the sacrificial members 50 and 51, and the insulating layers 41, 42, 43, 44 and 45. The bottom part of the ladder-shaped slit HSLT stops, for example, at the surface of the conductive layer 21. The ladder-shaped slit HSLT formed in the present process suffices if it penetrates at least the lowermost sacrificial member 50. The anisotropic etching in the present process is, for example, RIE.

Figure 15:
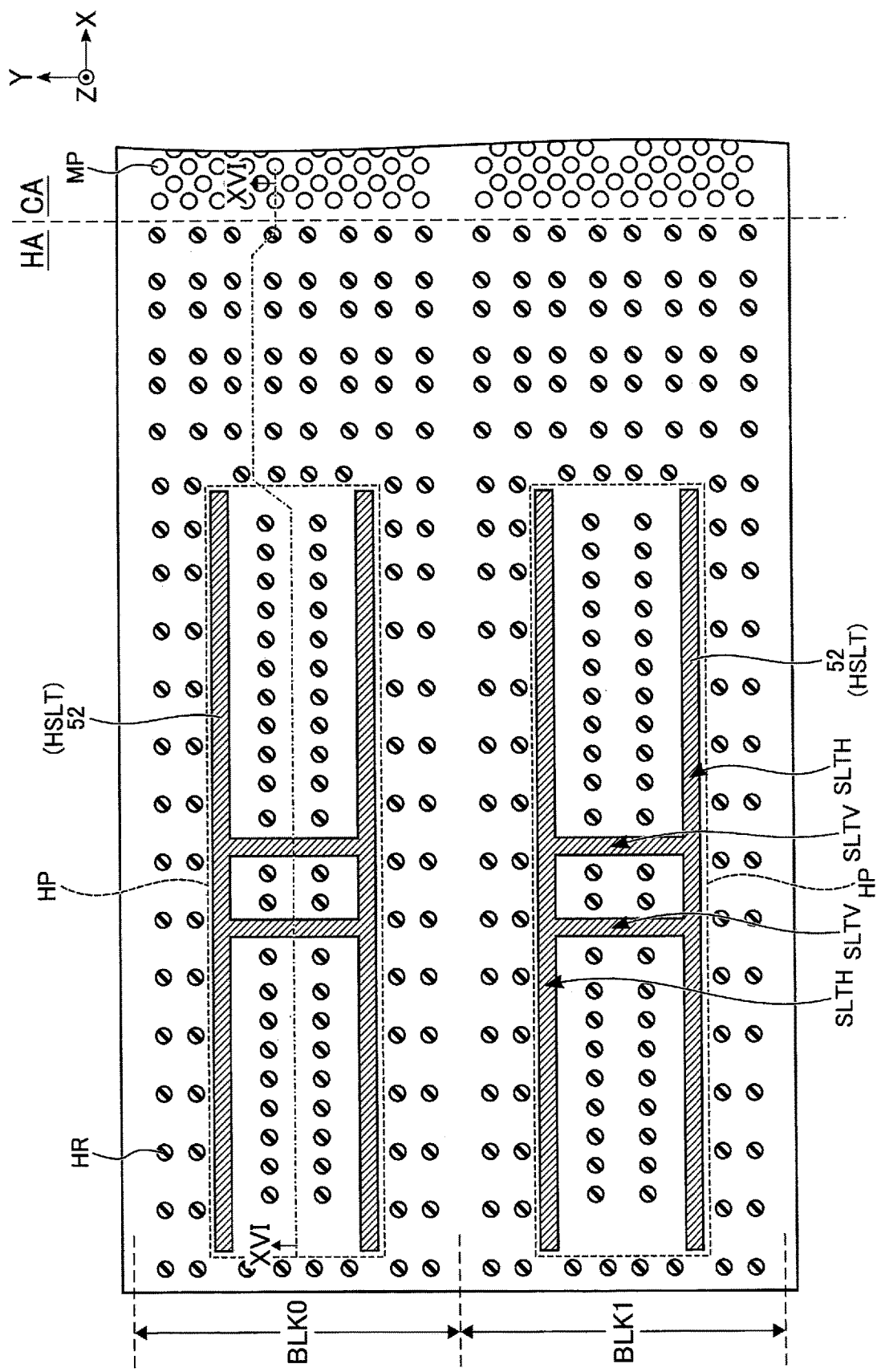
FIG. 15 is a cross-sectional view of the memory cell array showing an example of the manufacturing process of the semiconductor memory device according to the first embodiment.
Figure 16:
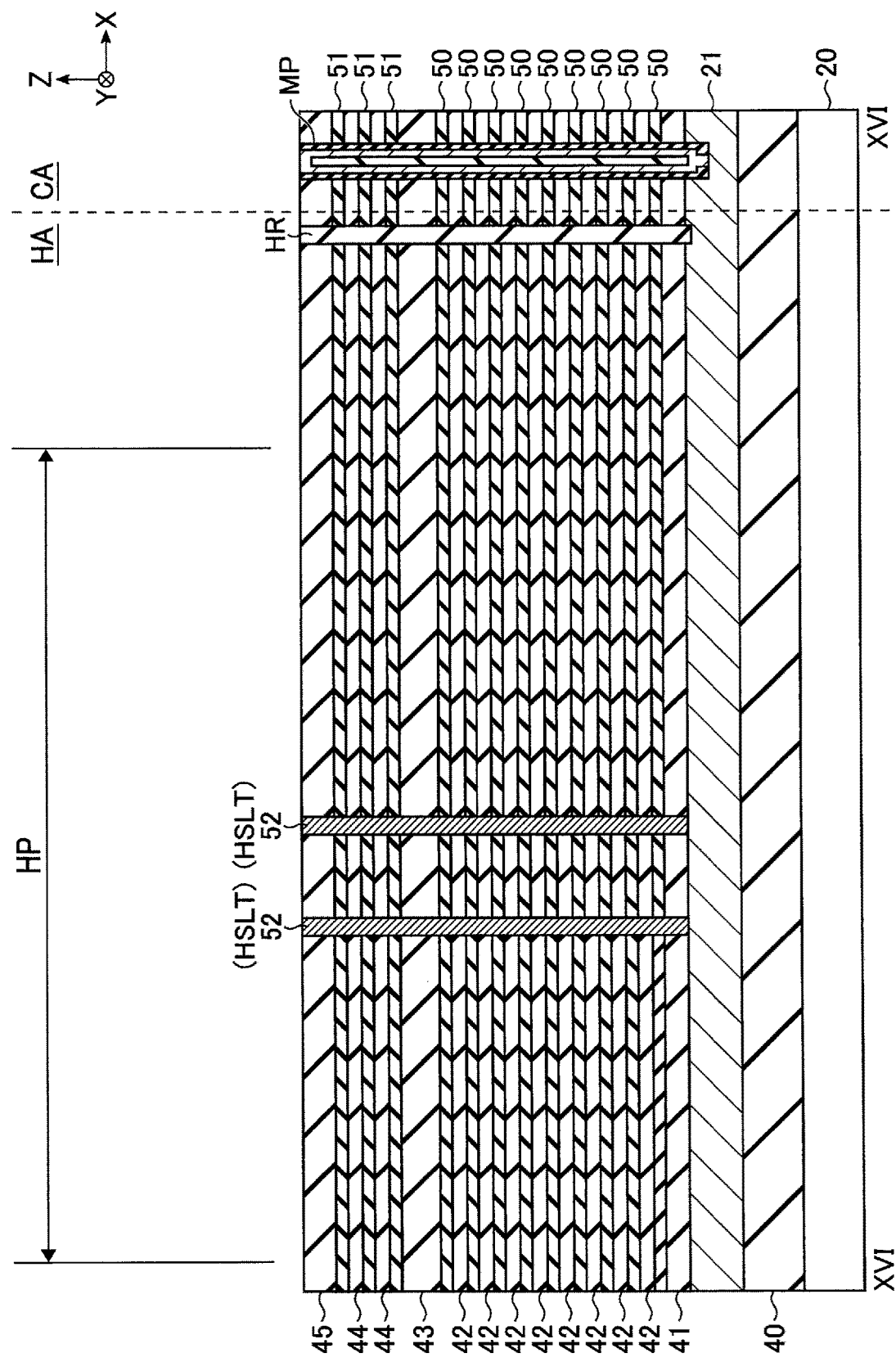
FIG. 16 is a cross-sectional view of the memory cell array, taken along line XVI-XVI of FIG. 15.

Subsequently, as shown in FIGS. 15 and 16, the ladder-shaped slits HSLT are filled with the sacrificial members 52 (step S13). Specifically, first, the sacrificial members 52 are formed to fill in the ladder-shaped slits HSLT. Then, the sacrificial members 52 formed outside the ladder-shaped slits HSLT are removed by, for example, chemical mechanical polishing (CMP). Each sacrificial member 52 is, for example, amorphous silicon. Alternatively, the sacrificial member 52 may be a carbon film containing carbon as a major component.

Figure 17:
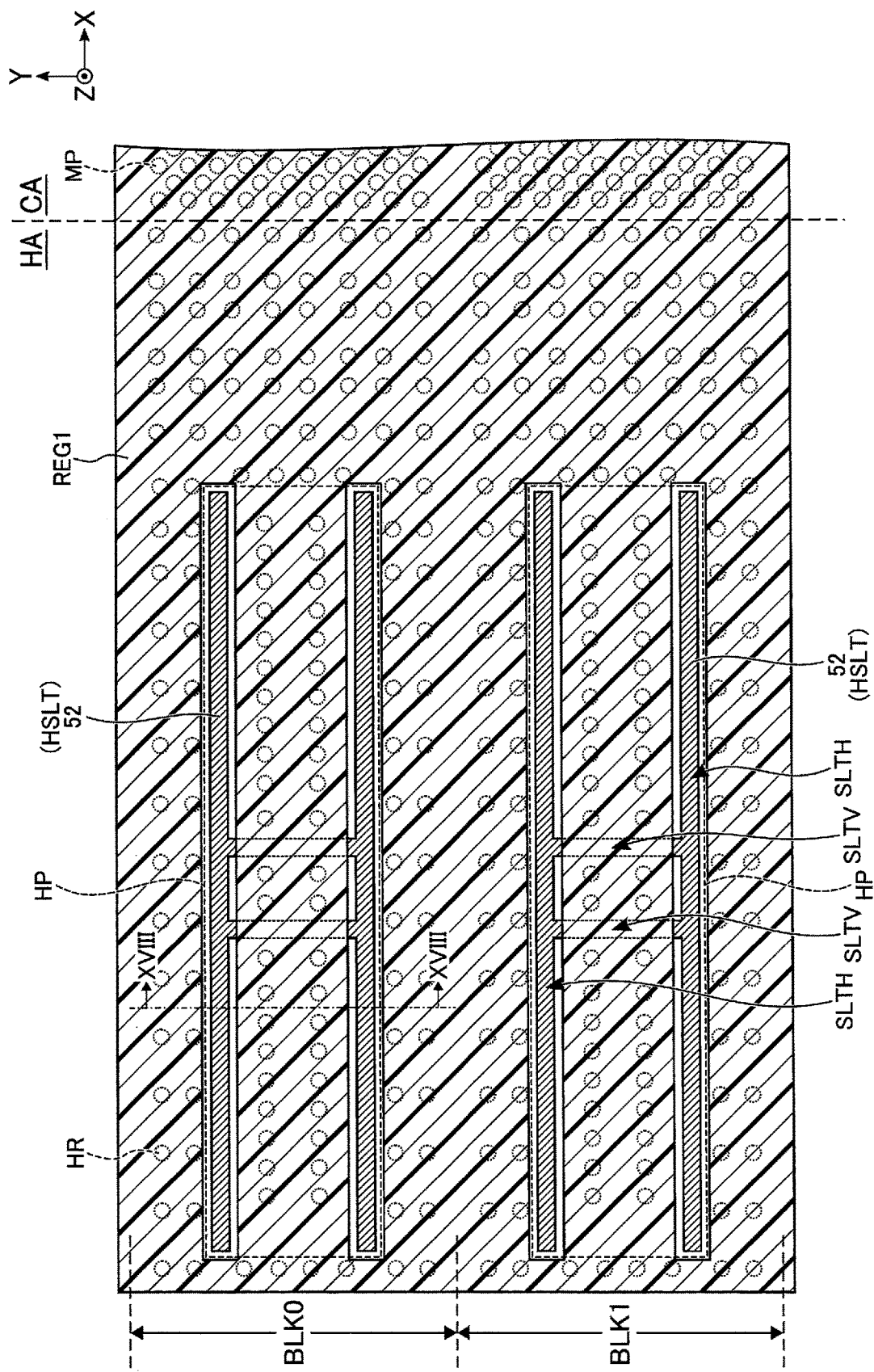
FIG. 17 is a cross-sectional view of the memory cell array showing an example of the manufacturing process of the semiconductor memory device according to the first embodiment.

Subsequently, as shown in FIGS. 17 and 18, the sacrificial members 52 in the slits SLTH are removed (step S14). Specifically, first, as shown in FIG. 17, a resist REG1 in which regions corresponding to the slits SLTH are opened is formed by, for example, photolithography, etc. Then, the sacrificial members 52 in the slits SLTH are removed by the anisotropic etching using the resist REG1. Then, the resist REG1 is removed by, for example, the CMP. As a result, a space corresponding to the slits SLTH is provided as shown in FIG. 18.

Figure 19:
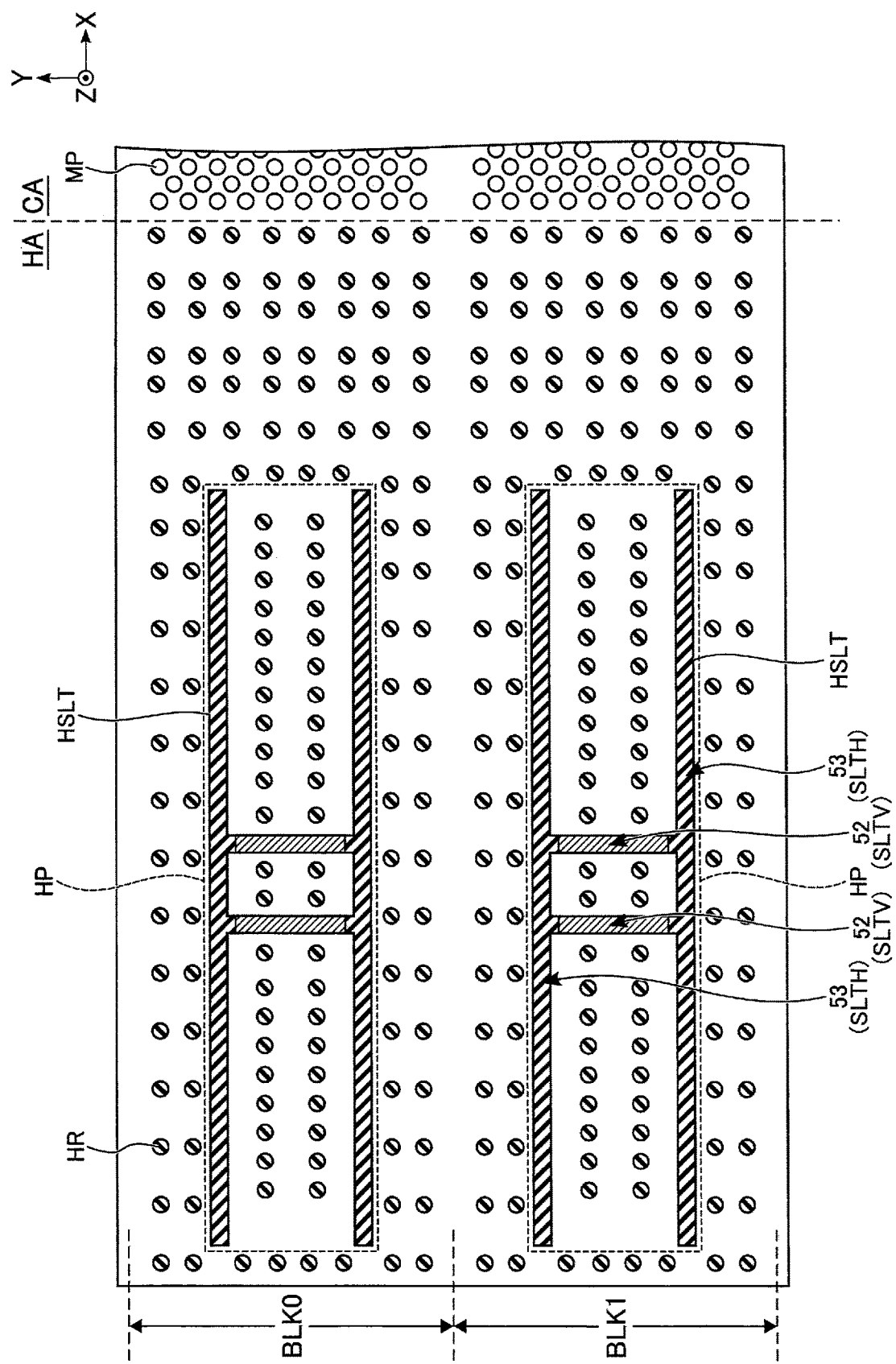
FIG. 19 is a cross-sectional view of the memory cell array showing an example of the manufacturing process of the semiconductor memory device according to the first embodiment.

Thereafter, the slits SLTH are filled with an insulator 53, as shown in FIGS. 19 and 20 (step S15). Specifically, the insulator 53 is first formed to fill in the slits SLTH. Then, the insulator 53 formed outside the slits SLTH is removed by, for example, the CMP. The insulator 53 is, for example, silicon oxide.

Figure 21:
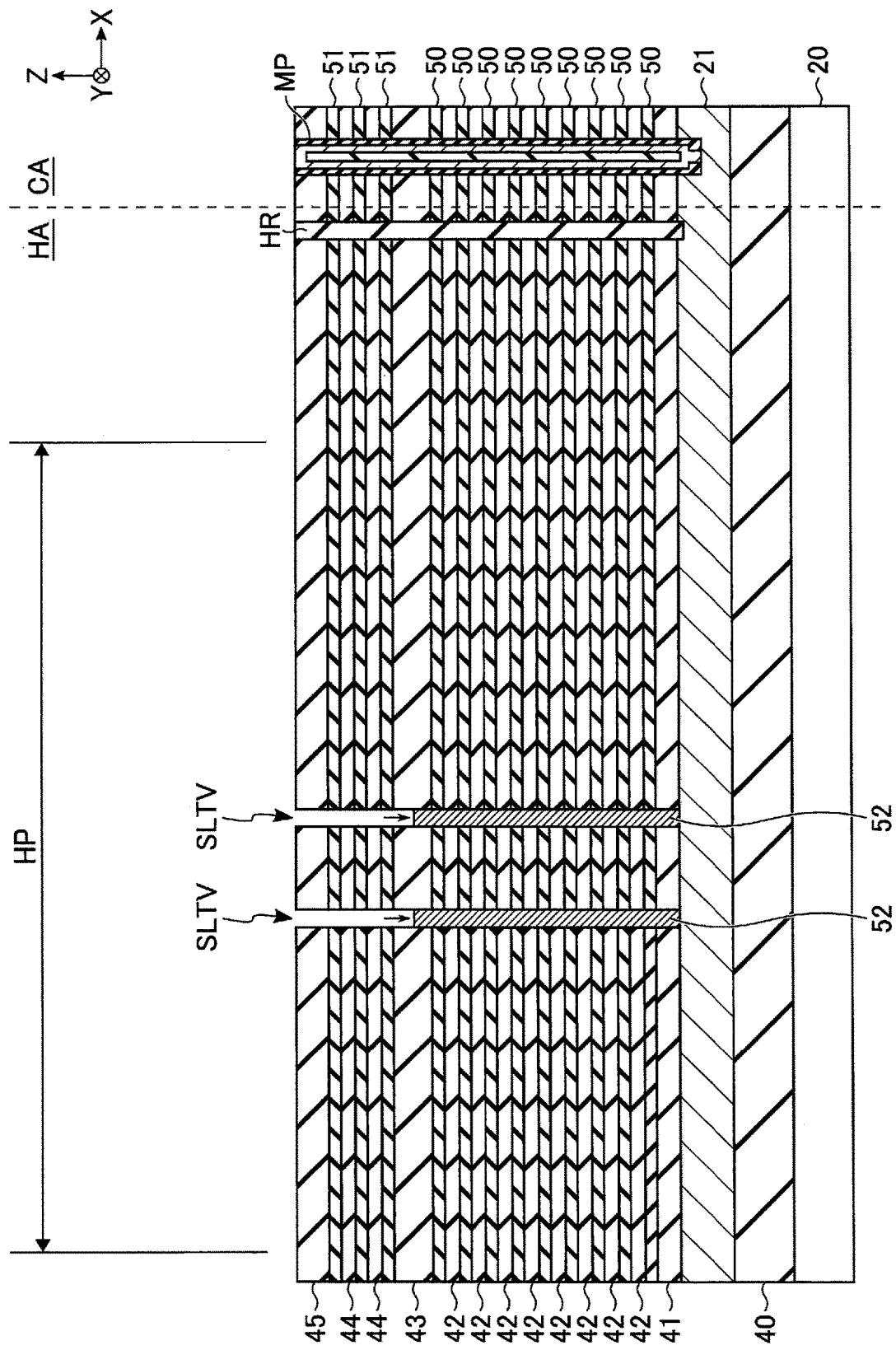
FIG. 21 is a cross-sectional view of the memory cell array showing an example of the manufacturing process of the semiconductor memory device according to the first embodiment.

Subsequently, as shown in FIG. 21, parts of the sacrificial members 52 in the slits SLTV are removed until the top ends of the sacrificial members 52 come to a level (height) of the insulating layer 43 (step S16). Specifically, first, a mask in which regions corresponding to the slits SLTV are opened is formed by photolithography, etc. Then, the sacrificial members 52 in the slits SLTV are removed by the anisotropic etching, with use of the formed mask, until the top ends of the sacrificial members 52 come to a level included in the insulating layer 43.

Figure 22:
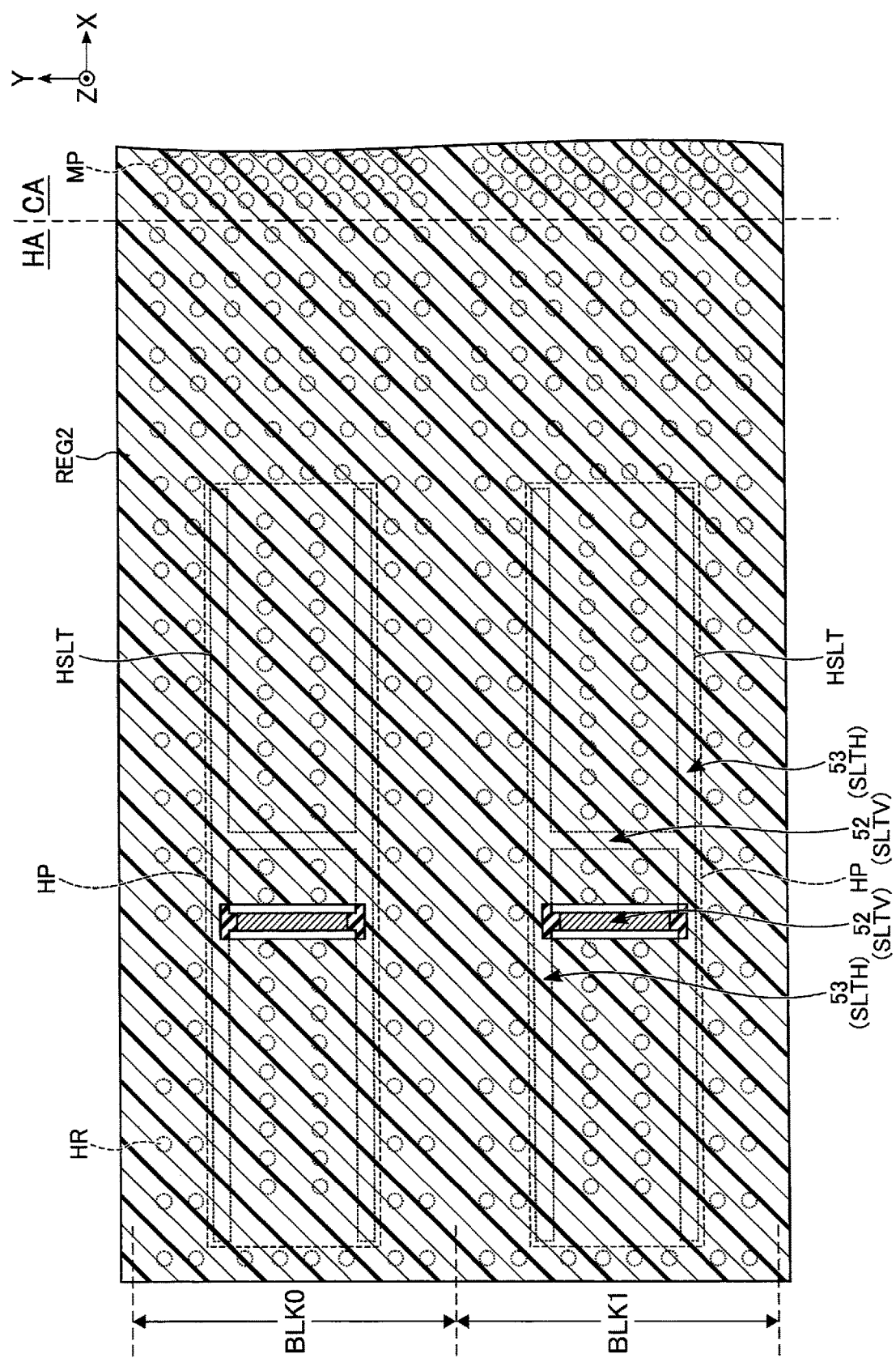
FIG. 22 is a cross-sectional view of the memory cell array showing an example of the manufacturing process of the semiconductor memory device according to the first embodiment.
Figure 23:
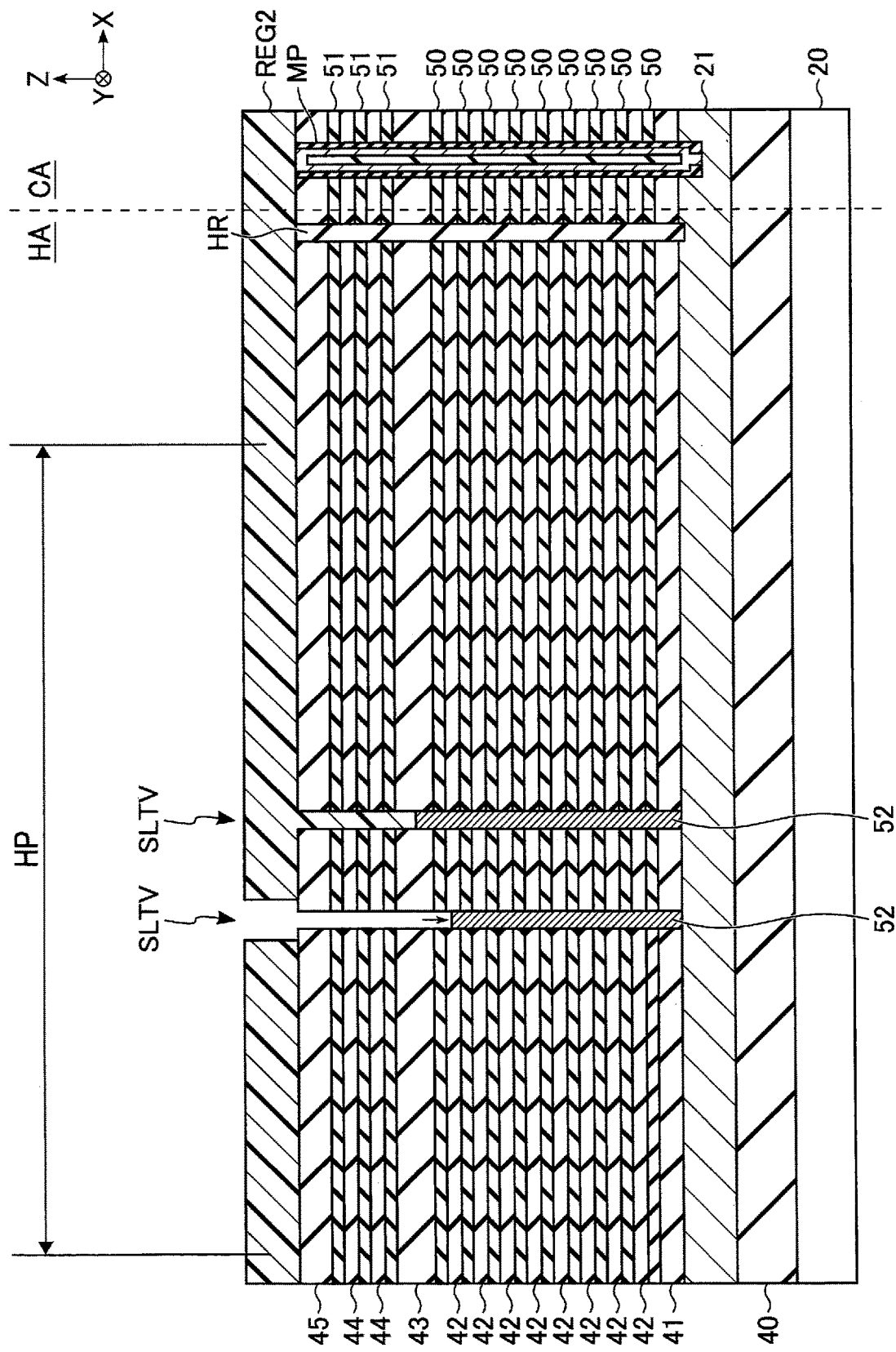
FIG. 23 is a cross-sectional view of the memory cell array showing an example of the manufacturing process of the semiconductor memory device according to the first embodiment.

Subsequently, as shown in FIGS. 22 and 23, a part of the sacrificial member 52 (corresponding to one pair of a sacrificial member 50 and an insulating layer 42) is removed from one of the slits SLTV (step S17). Specifically, first, as shown in FIG. 22, a resist REG2 in which a region corresponding to one of the slits SLTV is opened is formed by, for example, photolithography, etc. Then, as shown in FIG. 23, a part of the sacrificial member 52 corresponding to the one pair in the Z direction is removed from the slit SLTV by the anisotropic etching using the resist REG2. Then, the resist REG2 is removed by, for example, the CMP.

Figure 24:
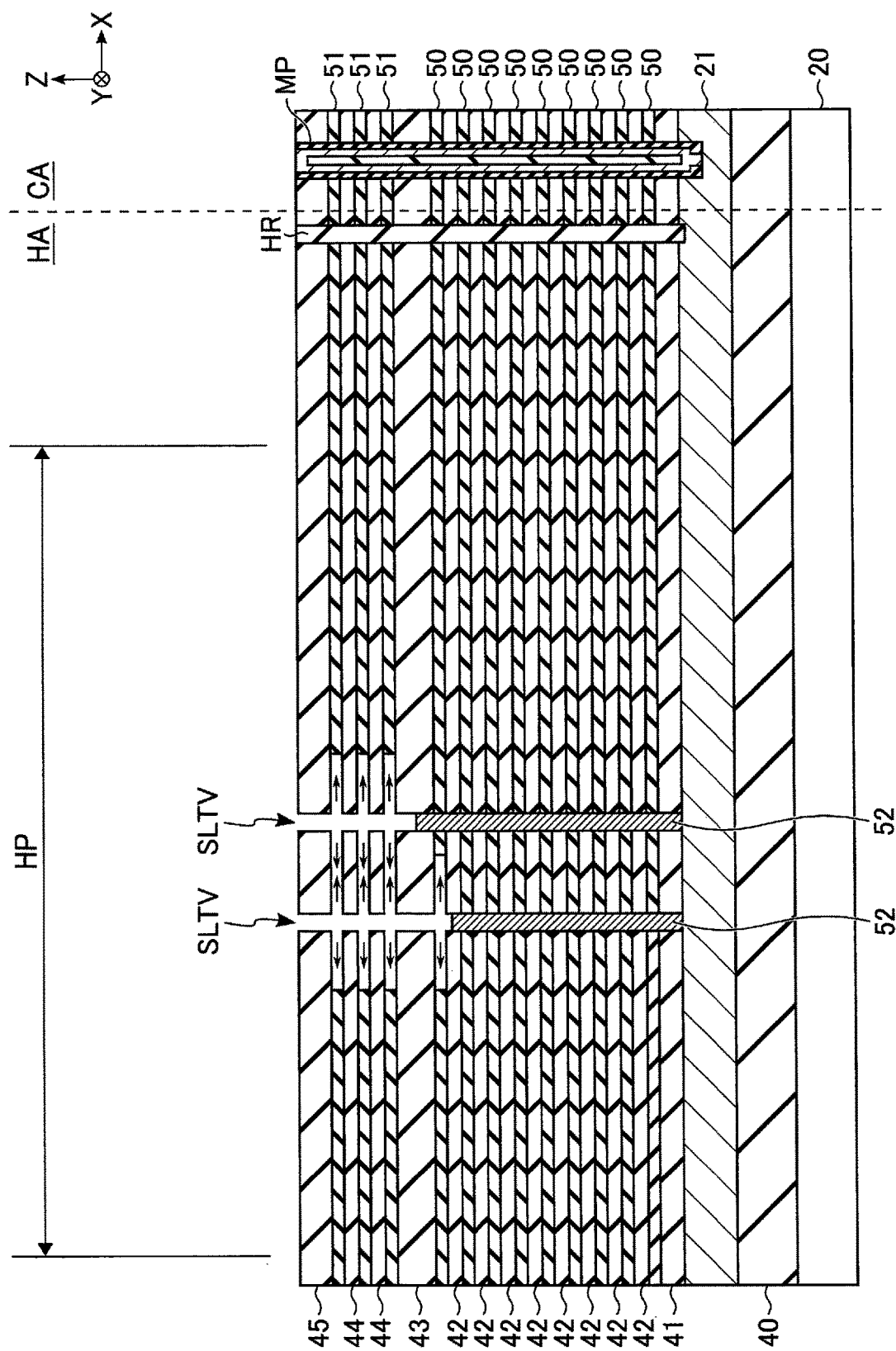
FIG. 24 is a cross-sectional view of the memory cell array showing an example of the manufacturing process of the semiconductor memory device according to the first embodiment.

Subsequently, as shown in FIG. 24, parts of the sacrificial members 50 and 51 between the adjacent slits SLT and the adjacent slits SLTH that correspond to one terrace width are removed through the slits SLTV (step S18). Specifically, the sacrificial members 50 and 51 are selectively removed by, for example, wet etching through the slits SLTV. By controlling the time of the wet etching, the wet etching of the present process is ended when the parts of the sacrificial members 50 and 51 corresponding to one terrace width in the X direction are removed. The structure from which the sacrificial members 50 and 51 are removed maintains its three-dimensional structure by the plurality of support pillars HR.

Subsequently, it is confirmed whether a process of removing the sacrificial members 50 and 51 has been performed a predetermined number of times (step S19). If the number of times is less than the predetermined number (step S19, NO), a process in step S20 is performed.

Figure 25:
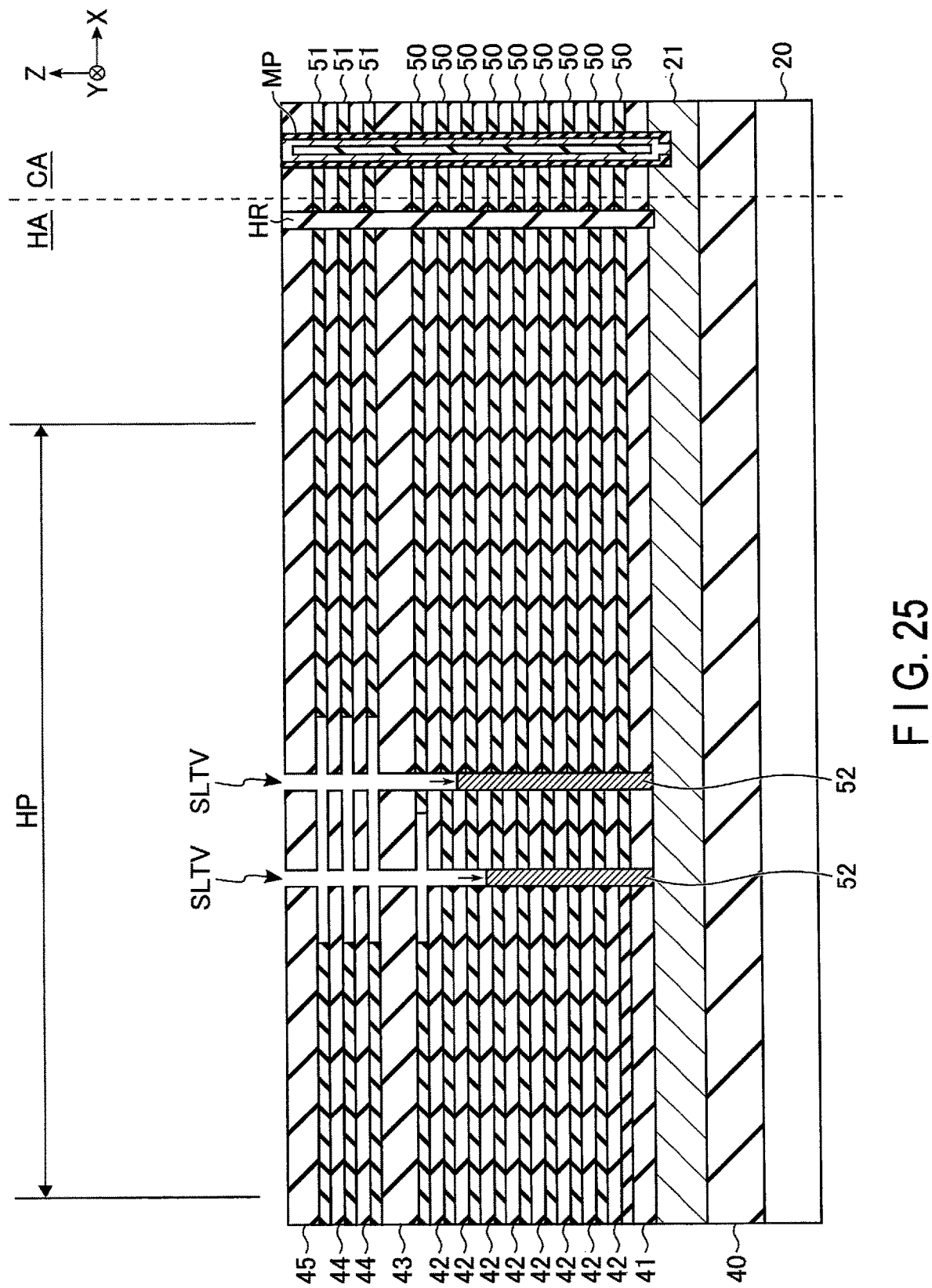
FIG. 25 is a cross-sectional view of the memory cell array showing an example of the manufacturing process of the semiconductor memory device according to the first embodiment.

In step S20, as shown in FIG. 25, parts of the sacrificial members 52 corresponding to the two pairs in the set of slits SLTV are removed. Specifically, a resist in which regions corresponding to the set of slits SLTV are opened is formed by photolithography, etc. Then, the parts of the sacrificial members 52 corresponding to the two pairs in the slits SLTV are removed by the anisotropic etching using the formed mask. The resist is removed by, for example, the CMP.

Figure 26:
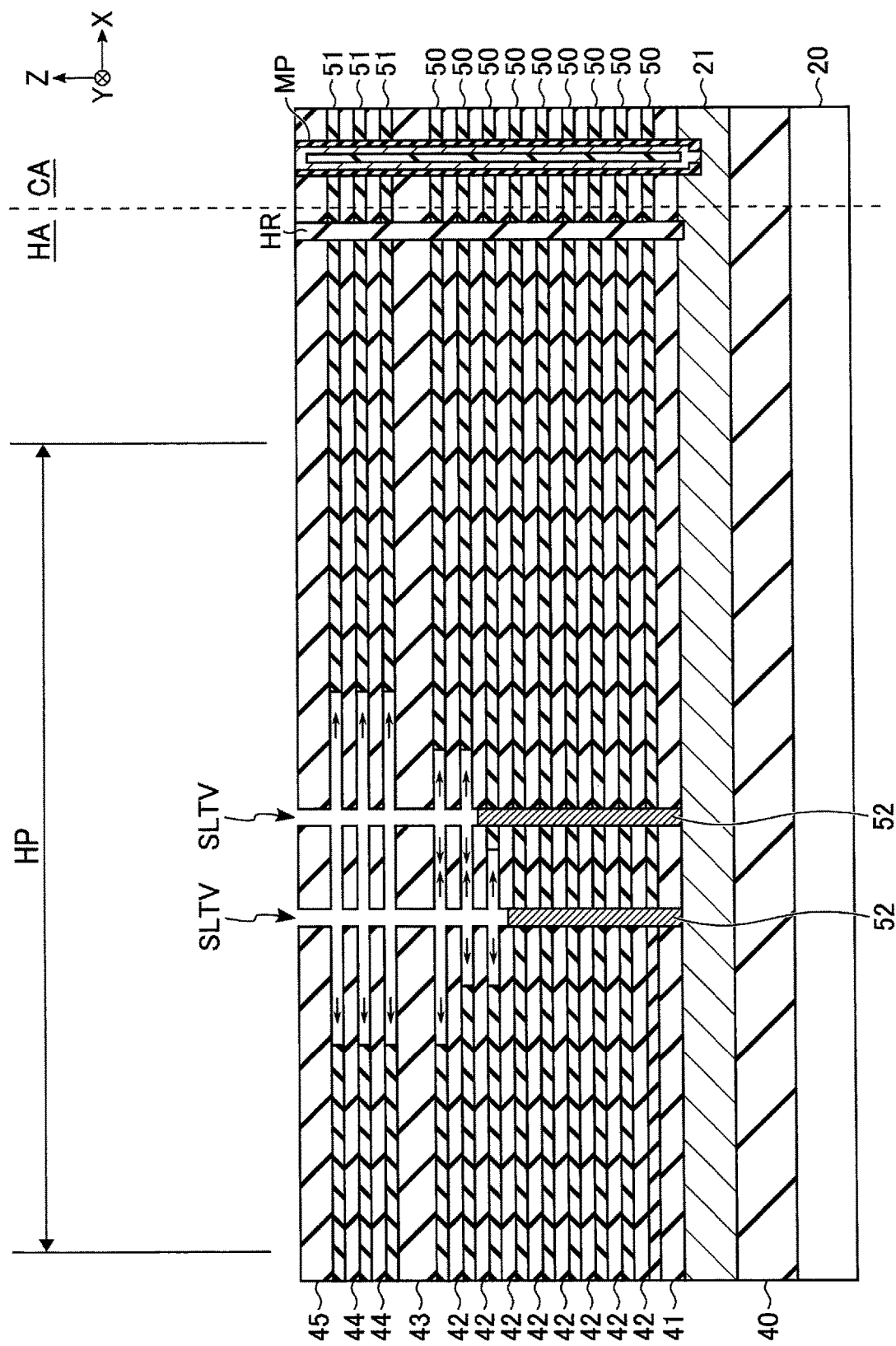
FIG. 26 is a cross-sectional view of the memory cell array showing an example of the manufacturing process of the semiconductor memory device according to the first embodiment.
Figure 27:
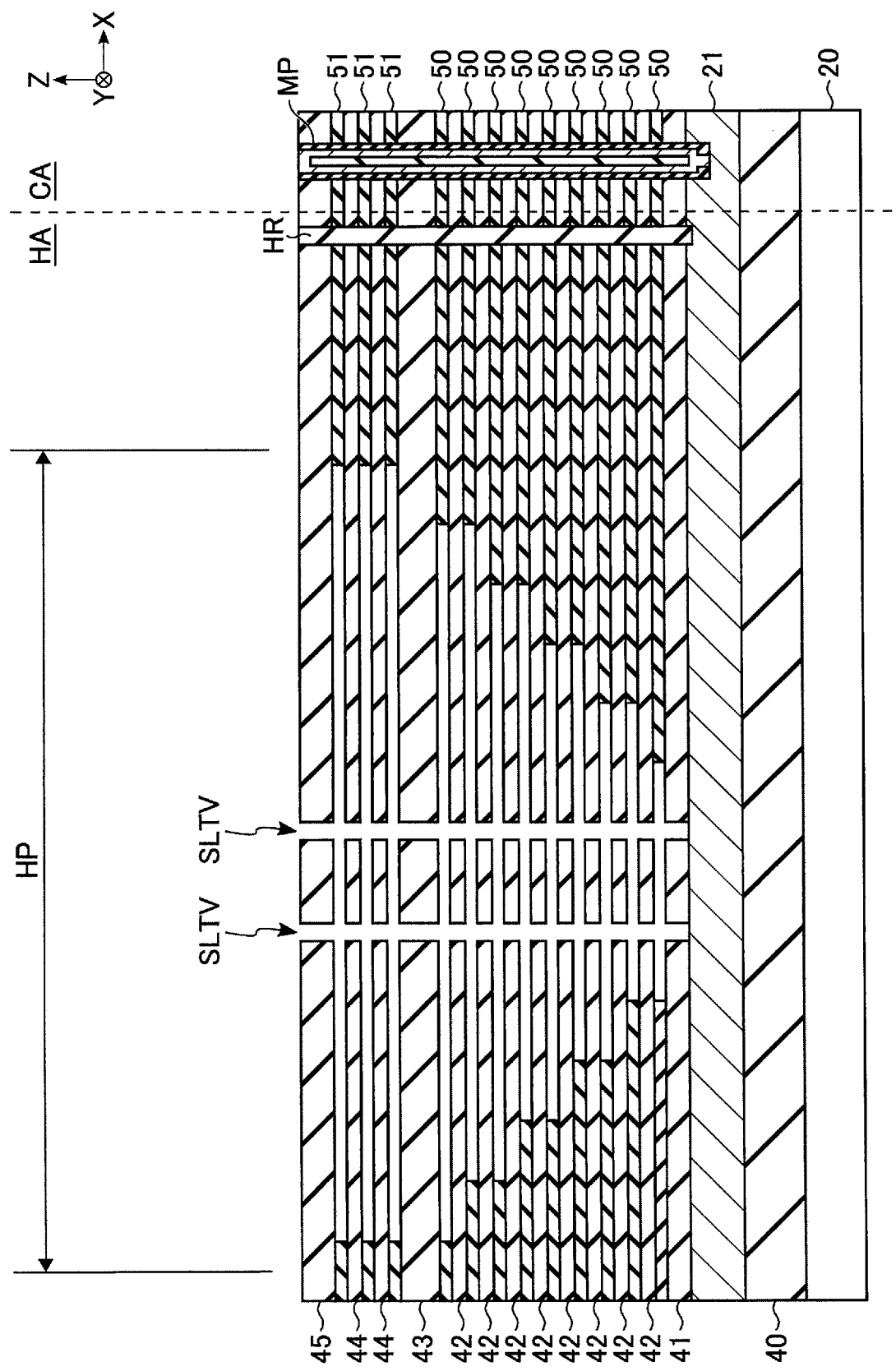
FIG. 27 is a cross-sectional view of the memory cell array showing an example of the manufacturing process of the semiconductor memory device according to the first embodiment.

Next, the process of step S18 is performed again. Specifically, as shown in FIG. 26, parts of the sacrificial members 50 and 51 between the adjacent slits SLT and the adjacent slits SLTH that correspond to one terrace width are removed through the slits SLTV in the X direction (step S18).

Then, step S19 is performed again to confirm whether the process of removing the sacrificial members 50 and 51 has been performed a predetermined number of times. Step S18 and step S20 are repeatedly performed the predetermined number of times (step S19, YES), the processing for the sacrificial members 50 and 51 are completed, and step 21 is performed.

Figure 28:
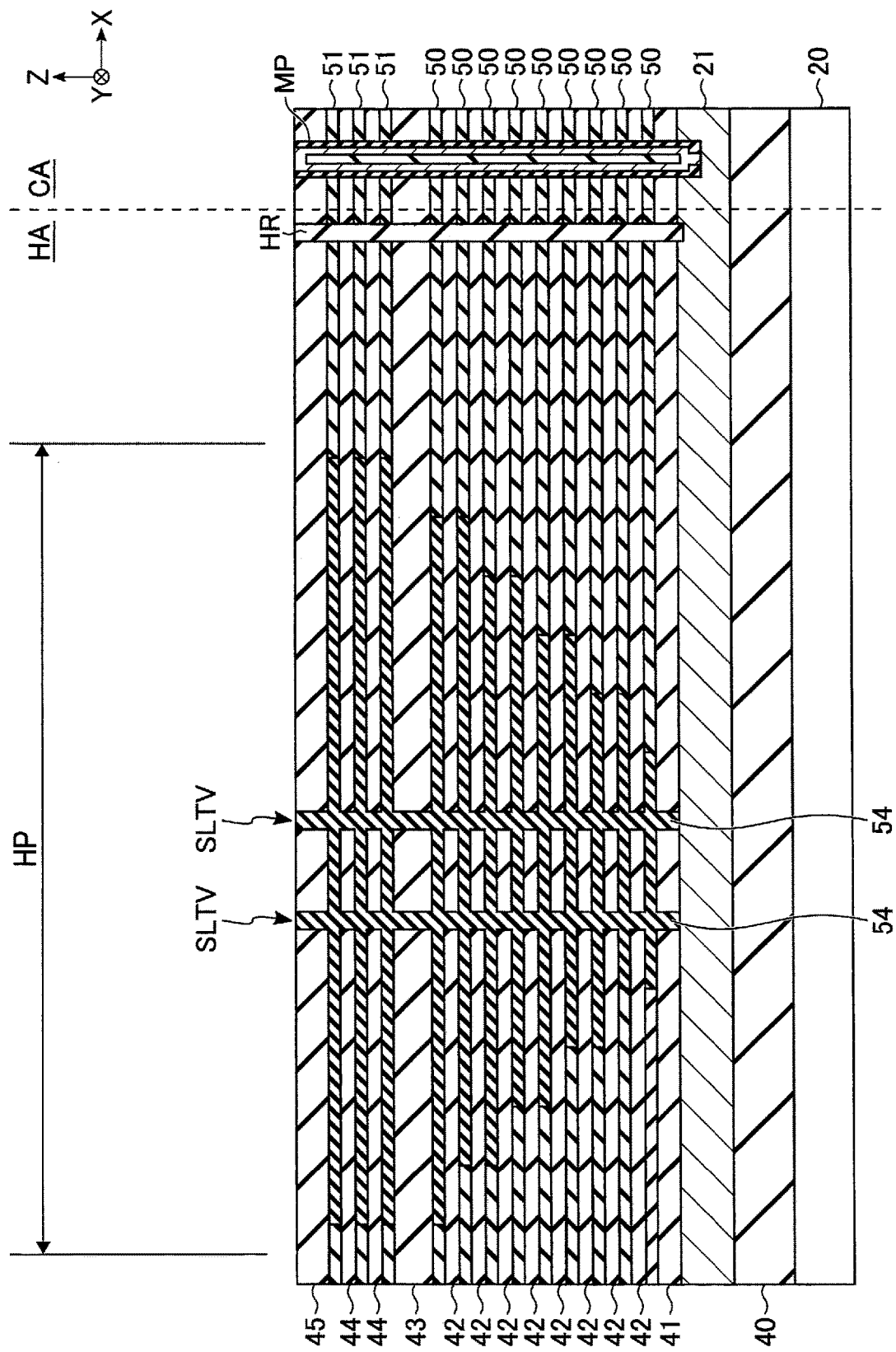
FIG. 28 is a cross-sectional view of the memory cell array showing an example of the manufacturing process of the semiconductor memory device according to the first embodiment.

In step S21, an insulator 54 is formed in the slits SLTV, as shown in FIG. 28. Specifically, the insulator 54 is formed in the slits SLTV and space obtained by wet etching through the slits SLTV.

Figure 29:
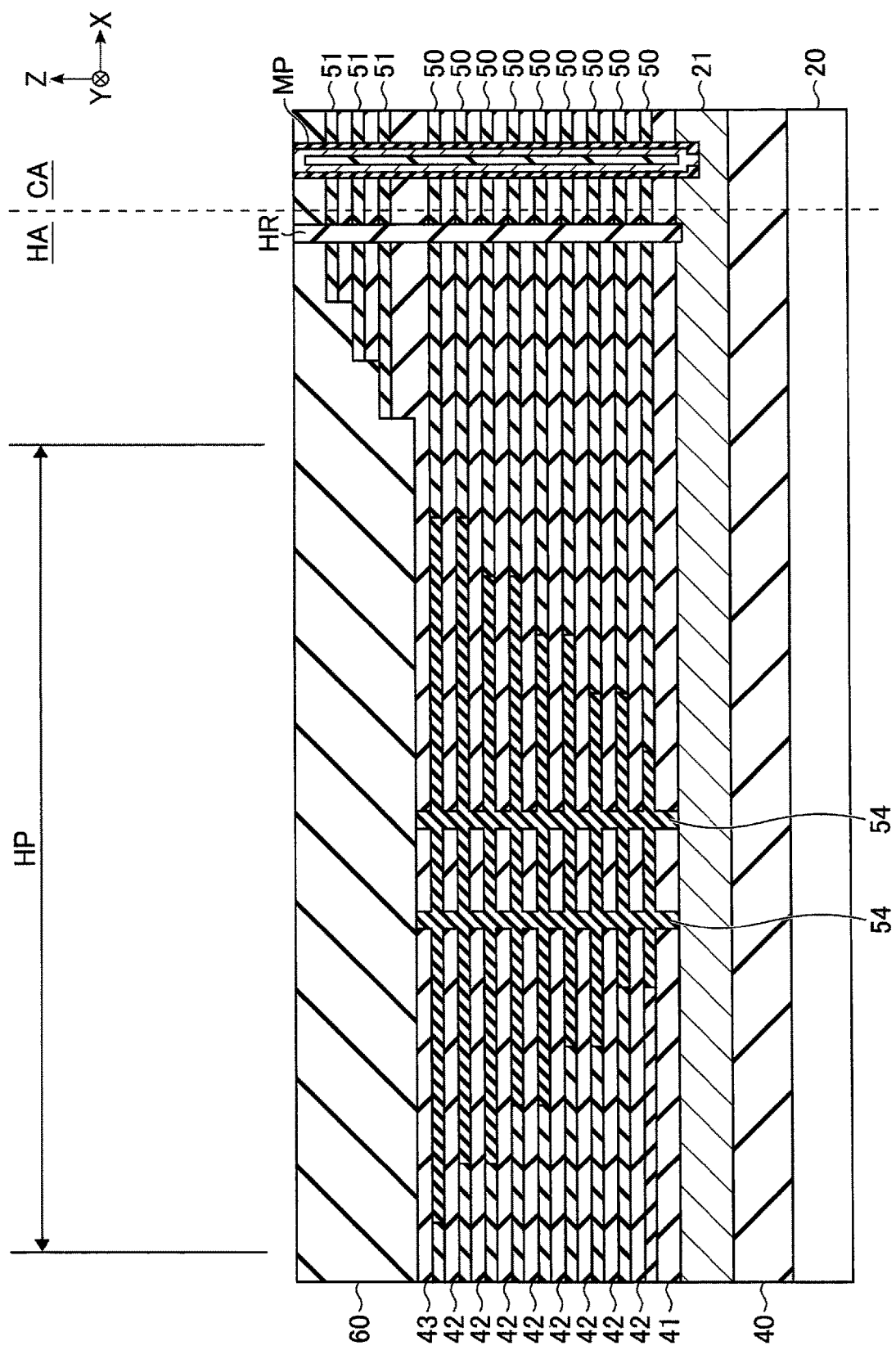
FIG. 29 is a cross-sectional view of the memory cell array showing an example of the manufacturing process of the semiconductor memory device according to the first embodiment.

Subsequently, a stair structure of the sacrificial members 51 is formed as shown in FIG. 29 (step S22). Specifically, first, a mask is formed, which covers the cell area CA and an end portion of the hookup area HA adjacent to the cell area by photolithography, etc. Then, in a region of the hookup area HA not covered by the mask, the topmost insulating layers 44 and 45 and the topmost sacrificial member 51 are removed by the anisotropic etching using the formed mask. In the cell area. CA and the adjacent hookup area HA, slimming of the mask and anisotropic etching are repeatedly performed, until a portion where the insulating layer 43 is formed becomes exposed. As a result, the stair structure of the sacrificial members 51 is formed. Then, an insulating layer 60 is formed on the steps generated by the anisotropic etching, and the steps are flattened by, for example, the CMP.

Figure 30:
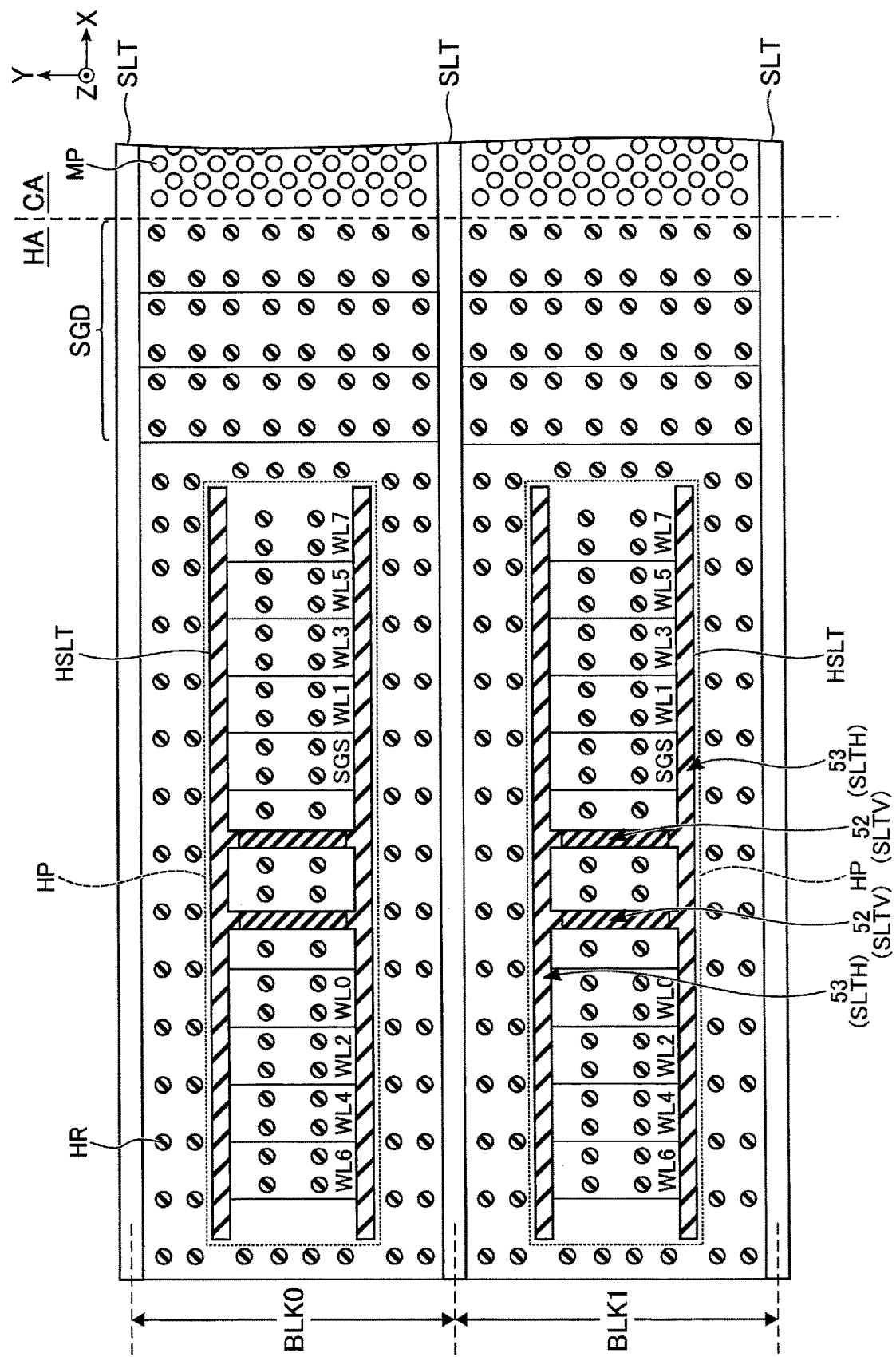
FIG. 30 is a cross-sectional view of the memory cell array showing an example of the manufacturing process of the semiconductor memory device according to the first embodiment.
Figure 31:
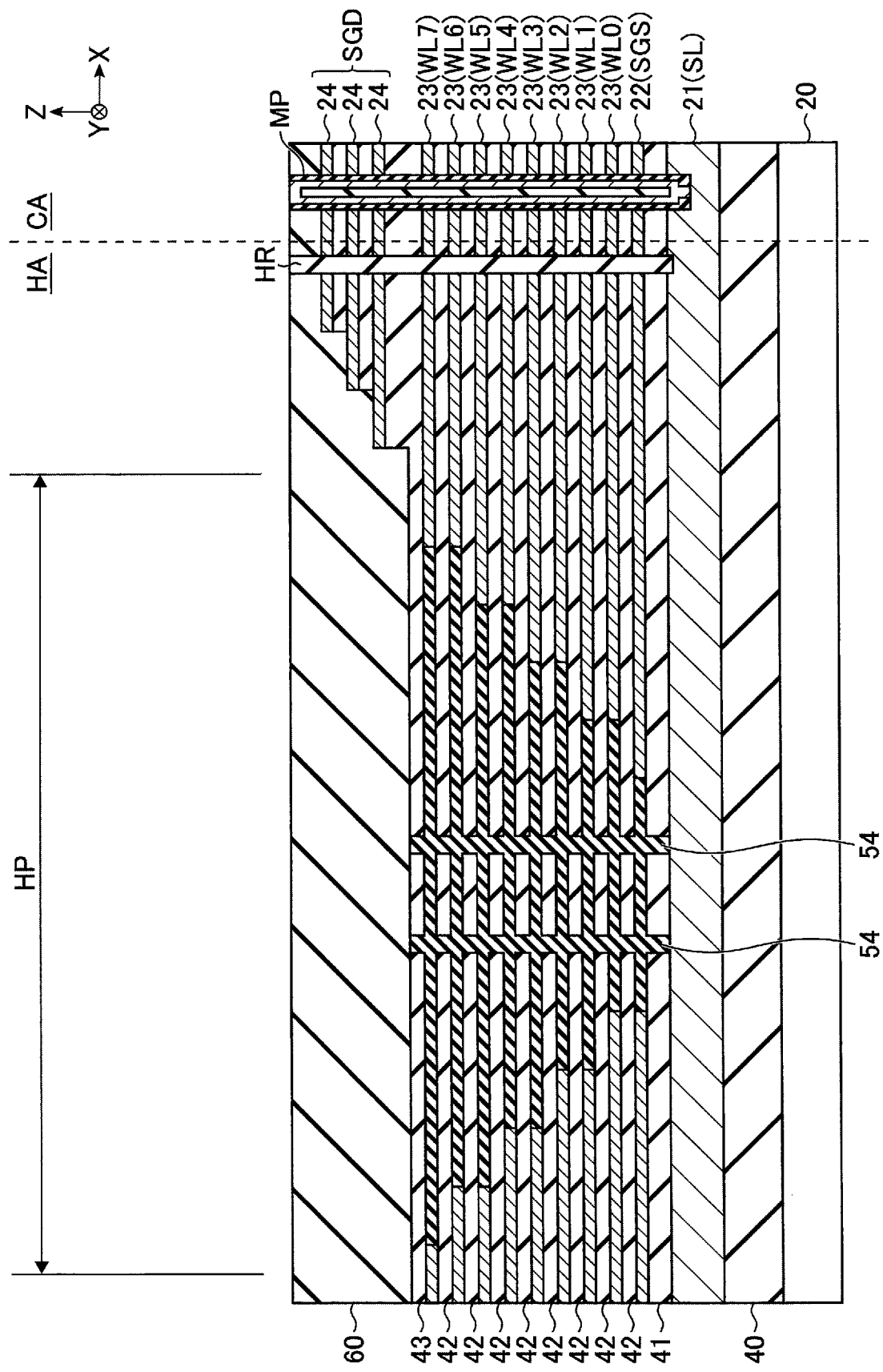
FIG. 31 is a cross-sectional view of the memory cell array showing an example of the manufacturing process of the semiconductor memory device according to the first embodiment.

Subsequently, a replacement process of the stacked interconnect portion is performed, as shown in FIGS. 30 and 31 (step S23). Specifically, first, a mask in which regions corresponding to the slits SLT are opened is formed by photolithography, etc. Then, the slits SLT are formed by the anisotropic etching using the formed mask. By the wet etching through the slits SLT, the sacrificial members 50 and 51 are selectively removed. The structure from which the sacrificial members 50 and 51 are removed maintains its three-dimensional structure by the plurality of support pillars HR, memory pillars MP, etc. Then, by, for example, chemical vapor deposition (CVD), a conductor is filled into the spaces from which the sacrificial members 50 and 51 have been removed. Thereafter, the conductor formed in the slits SLT and the conductors formed above the top ends of the support pillars HR and above the top ends of the memory pillars MP are removed by an etch-back process. An insulator is embedded in each slit SLT.

In this manner, the conductive layer 22 corresponding to the select gate line SGS, the conductive layers 23 respectively corresponding to the word lines WL0 to WL7, and the conductive layers 24 corresponding to the select gate lines SGD are formed.

Figure 32:
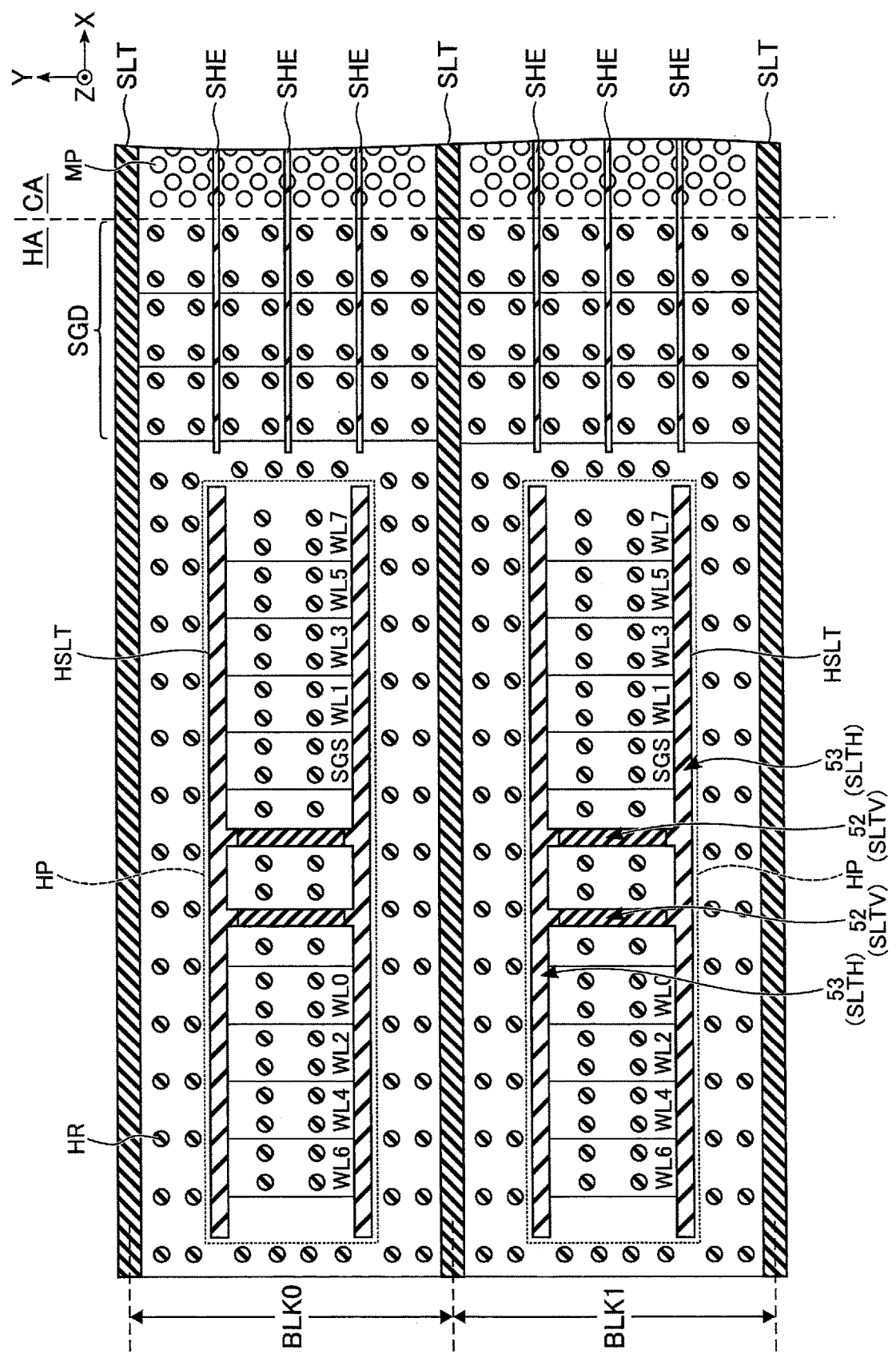
FIG. 32 is a cross-sectional view of the memory cell array showing an example of the manufacturing process of the semiconductor memory device according to the first embodiment.

Subsequently, as shown in FIG. 32, the slits SHE are formed (step S24). Specifically, first, a mask in which regions corresponding to the slits SHE are opened is formed by photolithography, etc. Then, the slits SHE are formed by the anisotropic etching using the formed mask. An insulator is embedded in the slits SHE.

Each slit SHE formed in the present process penetrates the lowermost conductive layer 24. The bottom part of the slit SHE stops, for example, in a layer in which the insulating layer 43 is provided. The anisotropic etching in the present process is, for example, RIE.

Figure 33:
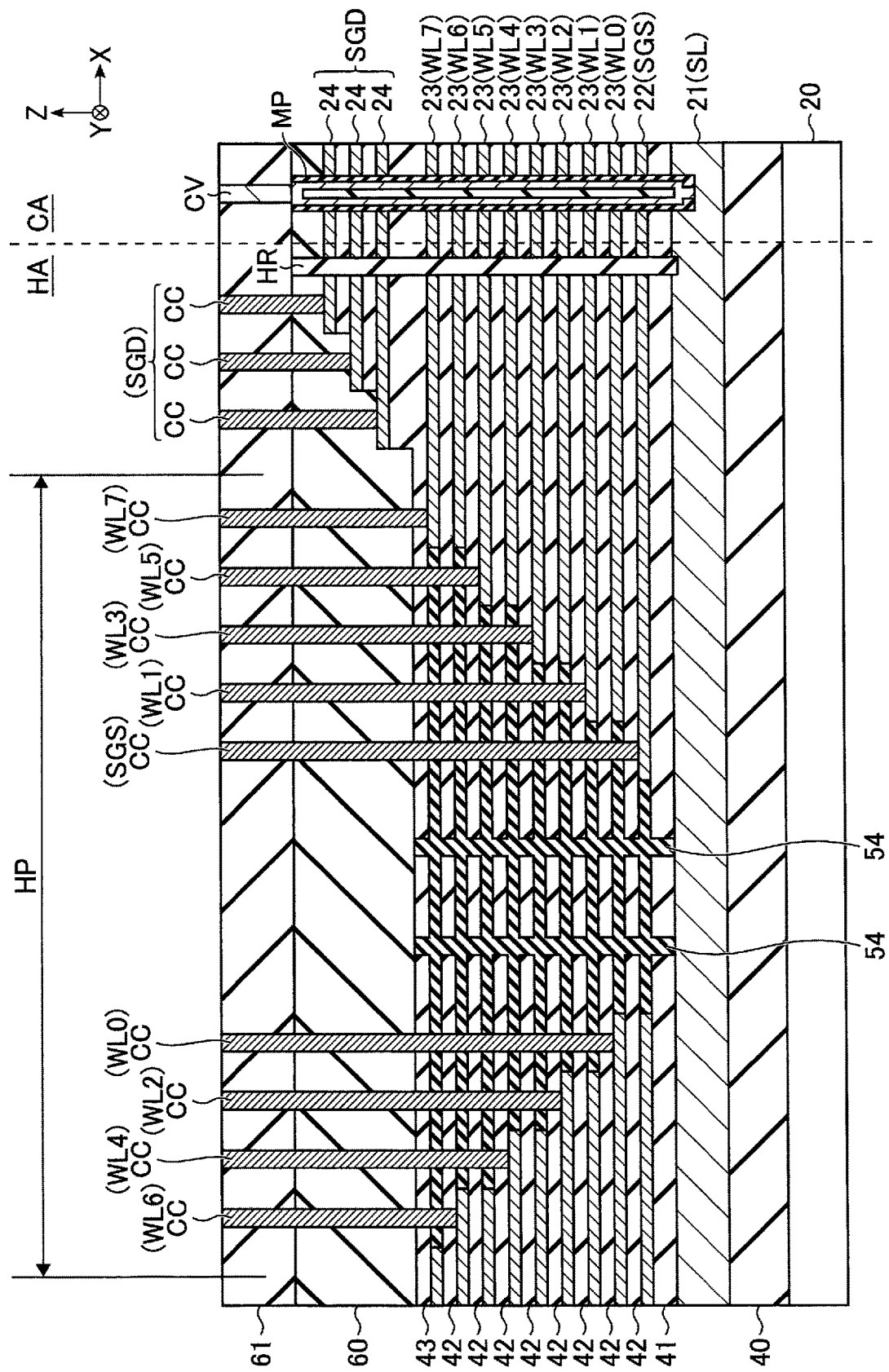
FIG. 33 is a cross-sectional view of the memory cell array showing an example of the manufacturing process of the semiconductor memory device according to the first embodiment.

Subsequently, the contacts CC are formed, as shown in FIG. 33 (step S25). Specifically, the contacts CC are formed on the terrace portions of the select gate line SGS and the word lines WL0 to WL7 in the ladder portion HP, and on the steps of the respective select gate lines SGD.

Through the manufacturing process of the semiconductor memory device 1 according to the first embodiment explained above, the memory pillars MP, the support pillars HR, the source line SL, the word lines WL, and the select gate lines SGS and SGD, and the contacts CC are formed. The above-described manufacturing steps are mere examples. Another step may be interposed between manufacturing steps, and the order of the manufacturing steps may be altered provided that no problem occurs.

[1-3] Advantages of First Embodiment

The above described semiconductor memory device 1 according to the first embodiment can reduce the manufacturing costs of the semiconductor memory device 1. Advantages of the semiconductor memory device 1 according to the first embodiment will be explained in detail below.

In the semiconductor memory device in which memory cells are stacked three dimensionally, plate-like interconnects used as, for example, the word lines WL are stacked, and the contacts are formed on the terrace portions provided on the respective layers, so that the word lines are coupled to the row decoder module 15.

As a method for forming the terrace portions on the respective layers, slimming and etching may be repeated to provide the stair structure. FIG. 34 is a cross-sectional view showing an example of a cross-sectional structure of a semiconductor memory device 1 in the course of manufacturing according to a comparative example of the first embodiment. In FIG. 34, part of the hookup area HA for forming stacked interconnects is shown in simple form. In FIG. 34, (1) to (3) correspond to representative processes for providing a stair structure.

First, as shown in (1) of FIG. 34, insulators and sacrificial members SM are alternately stacked on a semiconductor substrate SUB. Then, as shown in (2) of FIG. 34, slimming and etching are repeatedly performed. In brief, mask reduction and anisotropic etching are repeated to provide the stair structure. Finally, as shown in (3) of FIG. 34, an insulator is filled in and flattened.

In the semiconductor memory device 1 according to the comparative example of the first embodiment, a structure above the terrace portions is removed by the repeated process of slimming and etching. Then, the space generated above the terrace portions is filled back in with the insulator. Thus, in the semiconductor memory device 1 of the comparative example of the first embodiment, a large part is removed by the anisotropic etching and then filled back in with the insulator. In other words, significant cost may be incurred for the anisotropic etching and the process for filling back in with the insulator.

In contrast, in the semiconductor memory device 1 of the first embodiment, the stair structures facing each other in the ladder portion HP are formed without removing the insulator above the terrace portions. In addition, the step of removing the sacrificial members 50 to provide the stair structure is performed by wet etching. Then, the spaces from which the sacrificial members 50 have been removed are filled back in with insulating layers.

Therefore, in the semiconductor memory device 1 of the first embodiment, both the amount of the sacrificial member to be removed by etching and the amount of the insulator to be filled back in can be lower than those of the comparative example of the first embodiment. As a result, the semiconductor memory device 1 according to the first embodiment can achieve savings in manufacturing costs for the etching and filling back in with the insulator.

Furthermore, in the semiconductor memory device 1 according to the comparative example of the first embodiment, when the hookup area HA is filled back in with the insulator after the terrace portions in the hookup area HA are formed, insulators may also be formed above the structure in the cell area CA. Therefore, when the insulator is flattened by, for example, the CMP, the flattening process may vary depending on a difference in the amount of insulator to be removed or a difference in the base structure. Accordingly, a step may occur, for example, between the hookup area HA and the cell area CA.

In contrast, according to the semiconductor memory device 1 of the first embodiment, the amount of the insulator 54 to be filled back in after the terrace portions in the hookup area HA are formed is less than that in the comparative example of the first embodiment. In the hookup area HA, a large part of the stacked structure of the sacrificial members 50 and the insulating layers 42 remains in the same manner as in the cell area CA. Accordingly, in the semiconductor memory device 1 of the first embodiment, when the insulator is flattened by the CMP, the difference in the amount of insulator to be removed or the difference in the base structure can be smaller than those in the semiconductor memory device 1 of the comparative example of the first embodiment.

Accordingly, in the semiconductor memory device 1 of the first embodiment, the variation in the flattening by the CMP can be suppressed, so that the occurrence of a step between the cell area CA and the hookup area HA can be suppressed. As a result, the semiconductor memory device 1 according to the first embodiment can suppress any failure due to occurrence of a step, and thereby improve yield.

In the manufacturing method of the semiconductor memory device 1 according to the first embodiment, in the process of step S17 described with reference to FIG. 10, a difference in height corresponding to one pair is provided between the sacrificial members 52 of one set of slits SLTV.

Each time steps S18 and S20 described with reference to FIG. 10 are repeated, terrace portions of different layers facing each other, with the set of slits SLTV interposed therebetween, are simultaneously formed. Namely, the terrace portions of the two layers are simultaneously formed.

Therefore, the manufacturing method of the semiconductor memory device 1 according to the first embodiment enables the number of manufacturing steps to be smaller than that in the case where the step of forming the terrace portion of one layer is repeated. Thus, the semiconductor memory device 1 of the first embodiment can reduce the manufacturing costs.

[1-4] Modifications of First Embodiment

The semiconductor memory device 1 according to the first embodiment may be modified in various manners. First, second, and third modifications of the first embodiment will be sequentially explained below.

First Modification of First Embodiment

Figure 35:
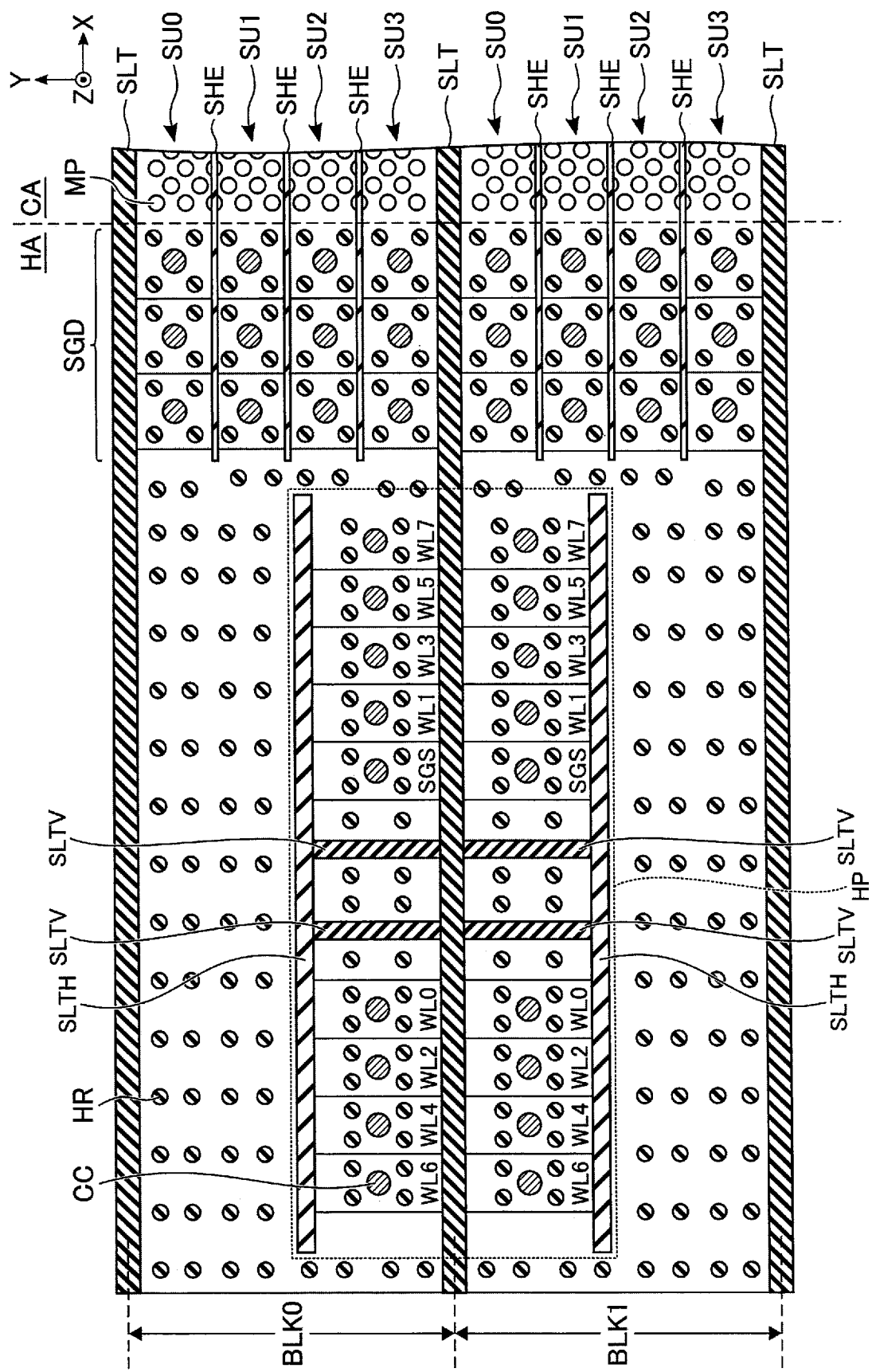
FIG. 35 is a plan view showing an example of a planar layout in a hookup area of a memory cell array included in a semiconductor memory device according to a first modification of the first embodiment.

FIG. 35 shows an exemplary detailed planar layout in a hookup area of a memory cell array 10 included in a semiconductor memory device 1 according to the first modification of the first embodiment. The region similar to that shown in FIG. 7 is illustrated. As shown in FIG. 35, the semiconductor memory device 1 according to the first modification of the first embodiment differs from the first embodiment in the arrangement of the ladder portion HP.

Specifically, in the semiconductor memory device 1 according to the first modification of the first embodiment, the ladder portion HP is provided in each of a set of blocks BLK0 and BLK1, a set of blocks BLK2 and BLK3, . . . and a set of blocks BLK(n-1) and BLKn. The ladder portion HP is arranged across the slit SLT between, for example, the blocks BLK0 and BLK1. In other words, the ladder portion HP is arranged across a set of blocks BLK. A set of slits SLTV in the ladder portion HP is divided by the slit SLT at the boundary between the set of two blocks BLK.

The respective terrace portions of the select gate line SGS and the word lines WL0 to WL7 in the ladder portion HP are divided by the slit SLT. Specifically, of the ladder portion HP, the terrace portions in the block BLK0 respectively correspond to the select gate line SGS and the word lines WL0 to WL7 in the block BLK0. Similarly, of the ladder portion HP, the terrace portions in the block BLK1 respectively correspond to the select gate line SGS and the word lines WL0 to WL7 in the block BLK1. Two contacts CC respectively corresponding to the blocks BLK0 and BLK 1 are formed on each of the terrace portions of the select gate line SGS and the word lines WL0 to WL7. The rest of the structure is the same as in the first embodiment.

As described above, in the semiconductor memory device 1 according the first modification of the first embodiment, the terrace portions corresponding to the two blocks BLK are formed by one ladder portion HP. Thus, the area for arranging the ladder portions HP in the entire semiconductor memory device 1 according to the first modification of the first embodiment can be smaller than that in the case in which one ladder portion HP is arranged in each block BLK. As a result, the semiconductor memory device 1 according to the first modification of the first embodiment can suppress an increase in manufacturing costs.

Furthermore, in the semiconductor memory device 1 according to the first modification of the first embodiment, the slit SLT is arranged between the set of slits SLTH of the ladder portion HP. Therefore, according to the first modification of the first embodiment, in the stacked interconnect portion replacement process of step S23, the time to remove the sacrificial members 50 and 51 in the region sandwiched between the set of slits SLTH can be shorter than that in the first embodiment. Accordingly, the semiconductor memory device 1 of the first modification of the first embodiment can reduce the costs for the stacked interconnect portion replacement process as compared to the first embodiment.

Second Modification of First Embodiment

Figure 36:
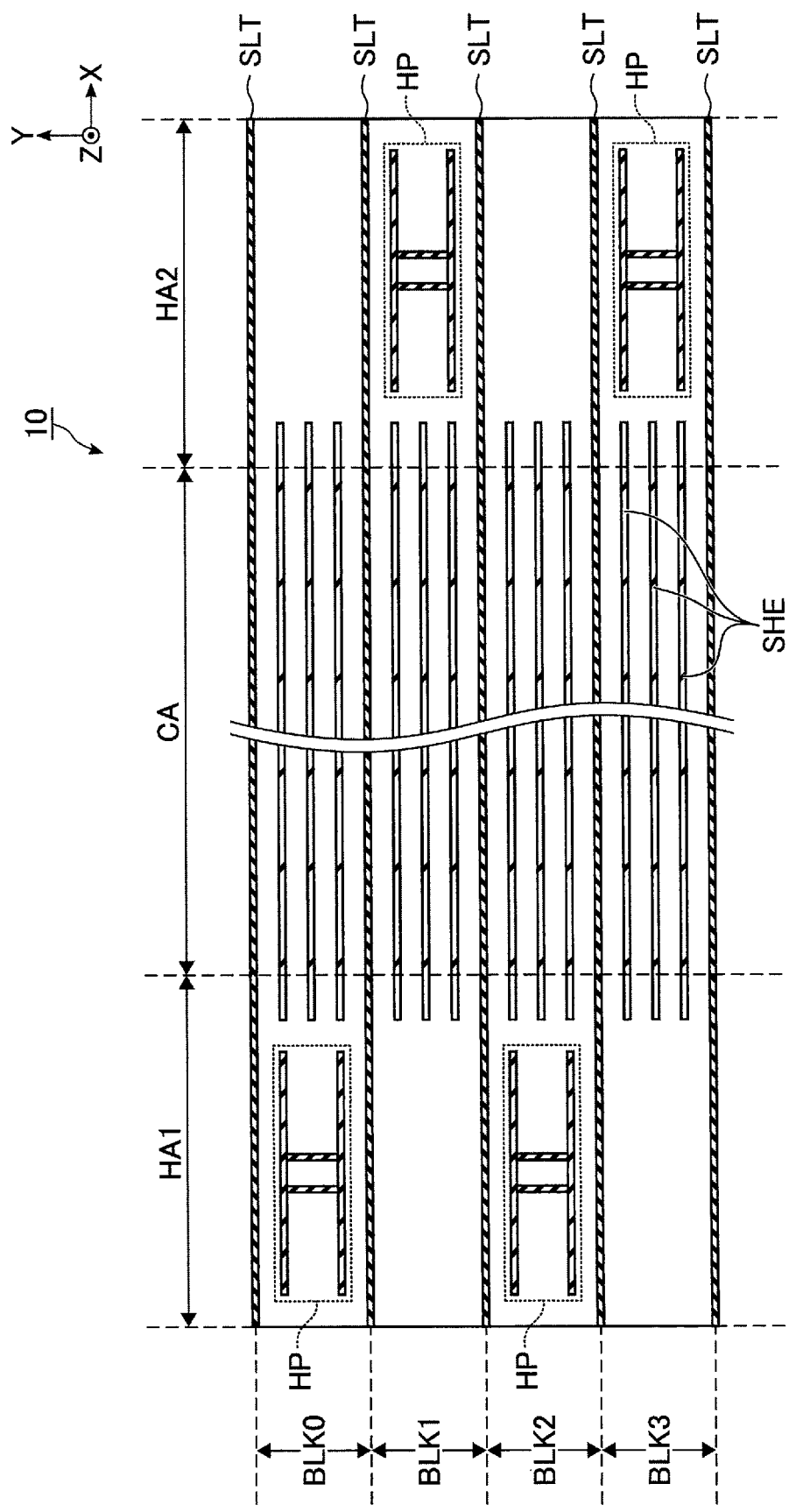
FIG. 36 is a plan view showing an example of a planar layout of a memory cell array included in a semiconductor memory device according to a second modification of the first embodiment.

FIG. 36 shows an exemplary planar layout of a memory cell array 10 included in a semiconductor memory device 1 according to the second modification of the first embodiment. The region similar to that shown in FIG. 3 is illustrated. As shown in FIG. 36, the semiconductor memory device 1 according to the second modification of the first embodiment differs from the first embodiment in the arrangement of the ladder portions HP.

Specifically, the semiconductor memory device 1 according to the second modification of the first embodiment is divided in the X direction into a hookup area HA1, a cell area CA, and a hookup area HA2, in the planar layout of the memory cell array 10. The cell area CA is interposed between the hookup areas HA1 and HA2 in the X direction. The ladder portions HP are arranged alternately in the hookup area HA1 or the hookup area HA2 in each block BLK.

More specifically, in the example shown in FIG. 36, the ladder portions HP are provided in even-numbered blocks BLK in the hookup area HA1, and in odd-numbered blocks BLK in the hookup area HA2. Contacts to the select gate line SGS and the word lines WL are provided in the ladder portions HP. In the example shown in FIG. 36, in the even-numbered blocks BLK, the contacts are provided in the ladder portions HP formed in the hookup area HA1. In the odd-numbered blocks BLK, the contacts are provided in the ladder portions HP formed in the hookup area HA2. The other configurations in the semiconductor memory device 1 according to the second modification of the first embodiment are the same as those of the first embodiment.

As described above, a plurality of hookup areas HA may be provided in the memory cell array 10. Each block BLK may be provided with at least one ladder portion HP. In this case also, the semiconductor memory device 1 according to the second modification of the first embodiment can achieve the same advantageous effects as the first embodiment.

Third Modification of First Embodiment

FIG. 37 shows an exemplary planar layout of a memory cell array 10 included in a semiconductor memory device 1 according to the third modification of the first embodiment. The region similar to that shown in FIG. 3 is illustrated. As shown in FIG. 37, the semiconductor memory device 1 according to the third modification of the first embodiment differs from the first embodiment in the arrangement of the ladder portions HP.

Specifically, the semiconductor memory device 1 according to the third modification of the first embodiment is divided in the X direction into a cell area CA1, a hookup area HA, and a cell area CA2, in the planar layout of the memory cell array 10. The cell area CA1 and the cell area CA2 interpose the hookup area HA in the X direction. The hookup area HA is provided with a ladder portion HP that is shared by the cell area CA1 and the cell area CA2

More specifically, a word line WL0 in the cell area CA1 and a word line WL0 in the cell area CA2 are coupled in common in the hookup area HA, and coupled to a row decoder module 15 through contacts provided in terrace portions on the word lines WL0 in the ladder portion HP. The other configurations in the semiconductor memory device 1 according to the third modification of the first embodiment are the same as those of the first embodiment.

As described above, the hookup area HA may be interposed between the cell areas CA and located in a central portion of the memory cell array 10. In this case also, the semiconductor memory device 1 according to the third modification of the first embodiment can achieve the same advantageous effects as the first embodiment.

[2] Second Embodiment

In a semiconductor memory device 1 according to the second embodiment, a plurality of ladder portions are provided in each block BLK in one hookup area HA. In the following, a description will be given of differences between the semiconductor memory device 1 according to the second embodiment and that of the first embodiment.

[2-1] Configuration

Figure 38:
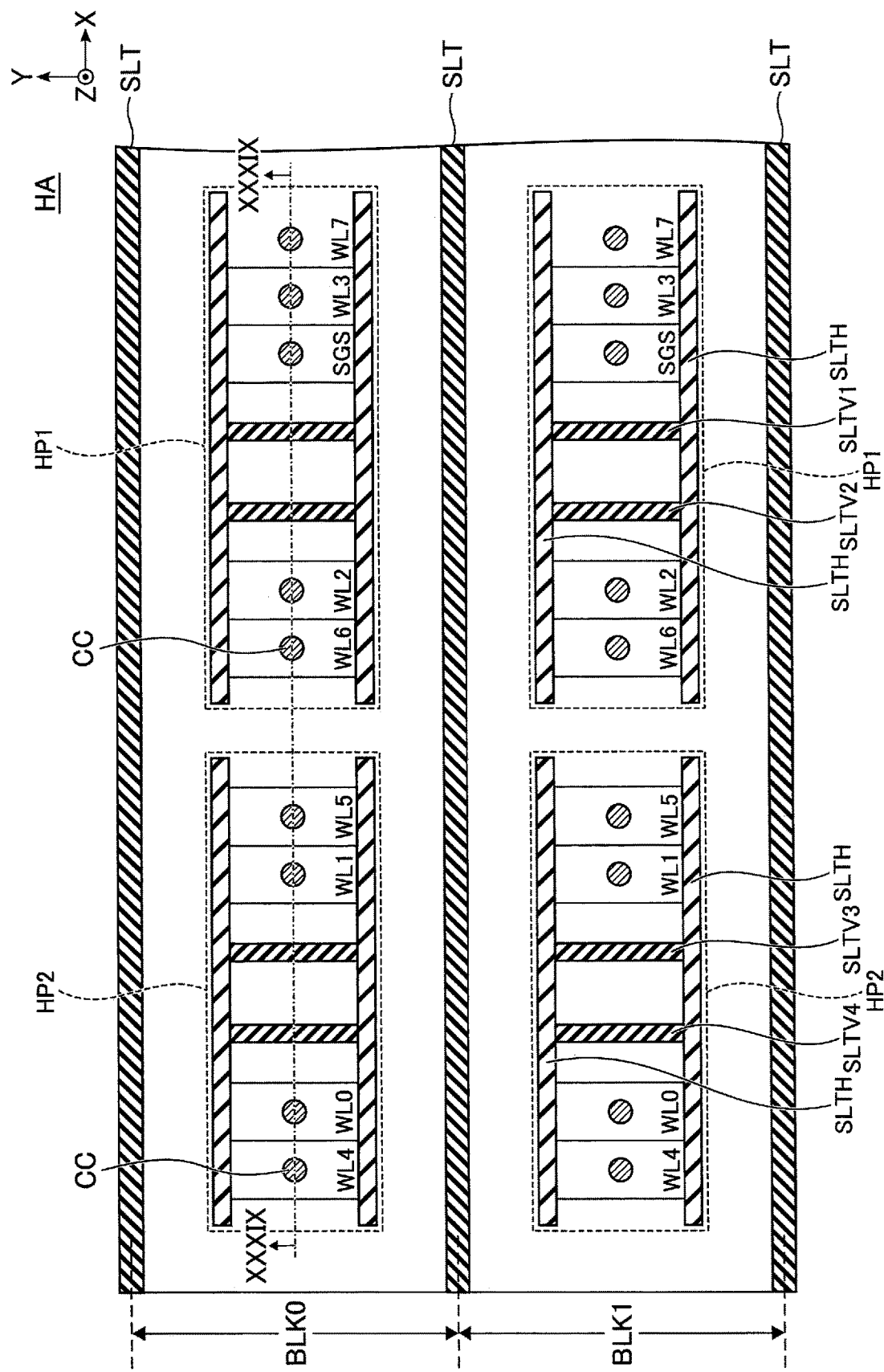
FIG. 38 is a plan view showing an example of a planar layout in a hookup area of a memory cell array included in a semiconductor memory device according to a second embodiment.

FIG. 38 is a plan view showing an example of a detailed planar layout of a hookup area HA1 in the memory cell array 10 in the semiconductor memory device 1 according to the second embodiment, which shows the region corresponding to the adjacent blocks BLK0 and BLK1.

As shown in FIG. 38, the semiconductor memory device 1 according to the second embodiment includes a plurality of ladder portions HP1 and HP2 in the hookup area HA. The ladder portions HP1 and HP2 are arranged in the X direction and separated from each other in each block BLK. The slit SLTH of the ladder portion HP1 and the slit SLTH of the ladder portion HP2 are separated.

The ladder portion HP1 includes the respective terrace portions of, for example, the select gate line SGS, and word lines WL2, WL3, WL6 and WL7. In the ladder portion HP1, the respective terrace portions of the select gate line SGS and the word lines WL3 and WL7 face the respective terrace portions of the word lines WL2 and WL6 with the slits SLTV1 and SLTV2 interposed therebetween. Specifically, in the ladder portion HP1, the terrace portion of the word line WL6, the terrace portion of the word line WL2, the slit SLTV2, the slit SLTV1, the terrace portion of the select gate line SGS, the terrace portion of the word line WL3, and the terrace portion of the word line WL7 are arranged in this order in the X direction.

The ladder portion HP2 includes the respective terrace portions of, for example, the word lines WL0, WL1, WL4 and WL5. In the ladder portion HP2, the respective terrace portions of the word lines WL1 and WL5 face the respective terrace portions of the word lines WL0 and WL4 with the slits SLTV3 and SLTV4 interposed therebetween. Specifically, in the ladder portion HP2, the terrace portion of the word line WL4, the terrace portion of the word line WL0, the slit SLTV4, the slit SLTV3, the terrace portion of the word line WL1, and the terrace portion of the word line WL5 are arranged in this order in the X direction.

FIG. 39 is a cross-sectional view of the structure taken along line. XXXIX-XXXIX in FIG. 38, showing an example of a cross-sectional structure of the hookup area HA in the memory cell array 10 in the semiconductor memory device 1 according to the second embodiment. As shown in FIG.

39, parts of a plurality of conductive layers, respectively corresponding to the word lines WL and the select gate lines SGS and SGD, are provided in a staircase shape in the hookup region HA. The illustrated region includes a plurality of terrace portions corresponding to the word lines WL0 to WL7 and the select gate line SGS.

In the ladder portion HP1, a set of the respective terrace portions of the select gate line SGS and the word lines WL3 and word line WL7 faces a set of the respective terrace portions of the word lines WL2 and WL6 with a set of the slits SLTV1 and SLTV2 interposed therebetween. Steps corresponding to four conductive layers 43 are formed by the terrace portions that are adjacent in the X direction.

In the ladder portion HP2, a set of the respective terrace portions of the word lines WL1 and WL5 faces a set of the respective terrace portions of the word lines WL0 and WL4 with a set of the slits SLTV3 and SLTV4 interposed therebetween. Steps corresponding to four conductive layers 43 are formed by the terrace portions that are adjacent in the X direction.

The configuration of the ladder portions HP1 and HP2 can also be described as follows: The ladder portion HP1 includes a first sub-area, a second sub-area, and a third sub-area arranged in this order in the X direction. The first sub-area of the ladder portion HP1 includes the respective terrace portions of the word lines WL2 and WL6. The second sub-area of the ladder portion HP1 includes a set of slits SLTV1 and SLTV2. The third sub-area of the ladder portion. HP1 includes the respective terrace portions of the select gate line SGS, and the word lines WL3 and WL7. The ladder portion HP2 includes a first sub-area, a second sub-area, and a third sub-area arranged in this order in the X direction. The first sub-area of the ladder portion HP2 includes the respective terrace portions of the word lines WL0 and WL4. The second sub-area of the ladder portion HP2 includes a set of slits SLTV3 and SLTV4. The third sub-area of the ladder portion HP2 includes the respective terrace portions of the word lines WL1 and WL5. The first sub-area of the ladder portion HP1 and the first sub-area of the ladder portion HP2 include steps that become higher in a direction away from the cell area CA. The third sub-area of the ladder portion HP1 and the third sub-area of the ladder portion HP2 include steps that become higher in a direction approaching the cell area CA.

The other configurations in the semiconductor memory device 1 according to the second embodiment are the same as those of the first embodiment.

[2-2] Manufacturing Method

Figure 40:
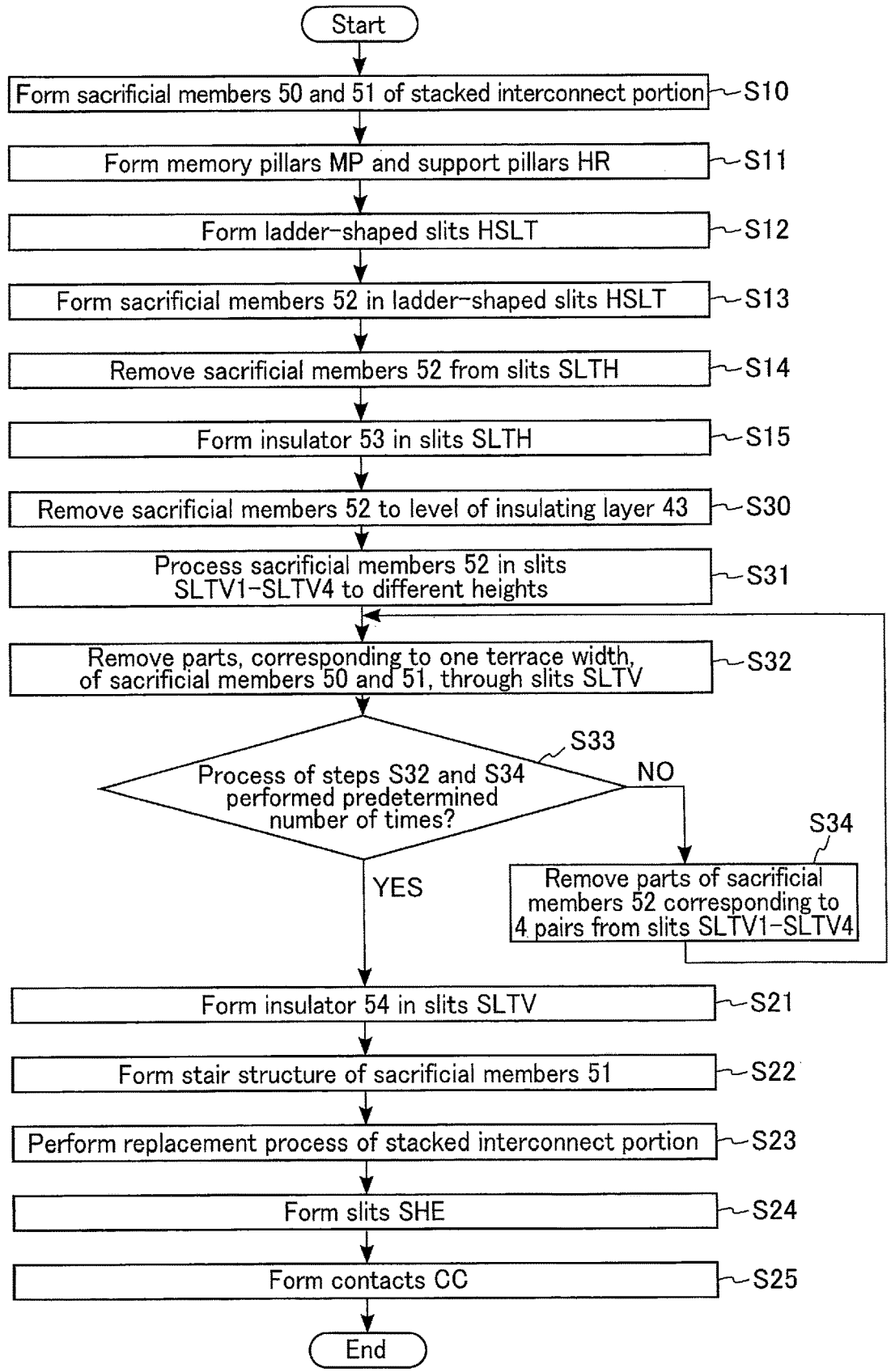
FIG. 40 is a flowchart showing an example of a manufacturing process of the semiconductor memory device according to the second embodiment.

Hereinafter, a series of manufacturing steps to form the semiconductor memory device 1 according to the second embodiment will be described with reference to FIG. 40 as appropriate. FIG. 40 is a flowchart showing an example of a manufacturing process of the semiconductor memory device 1 according to the second embodiment. FIGS. 41 to 46 each show an example of the cross-section structure in a region including the hookup area HA in manufacturing the semiconductor memory device 1 according to the second embodiment.

Figure 41:
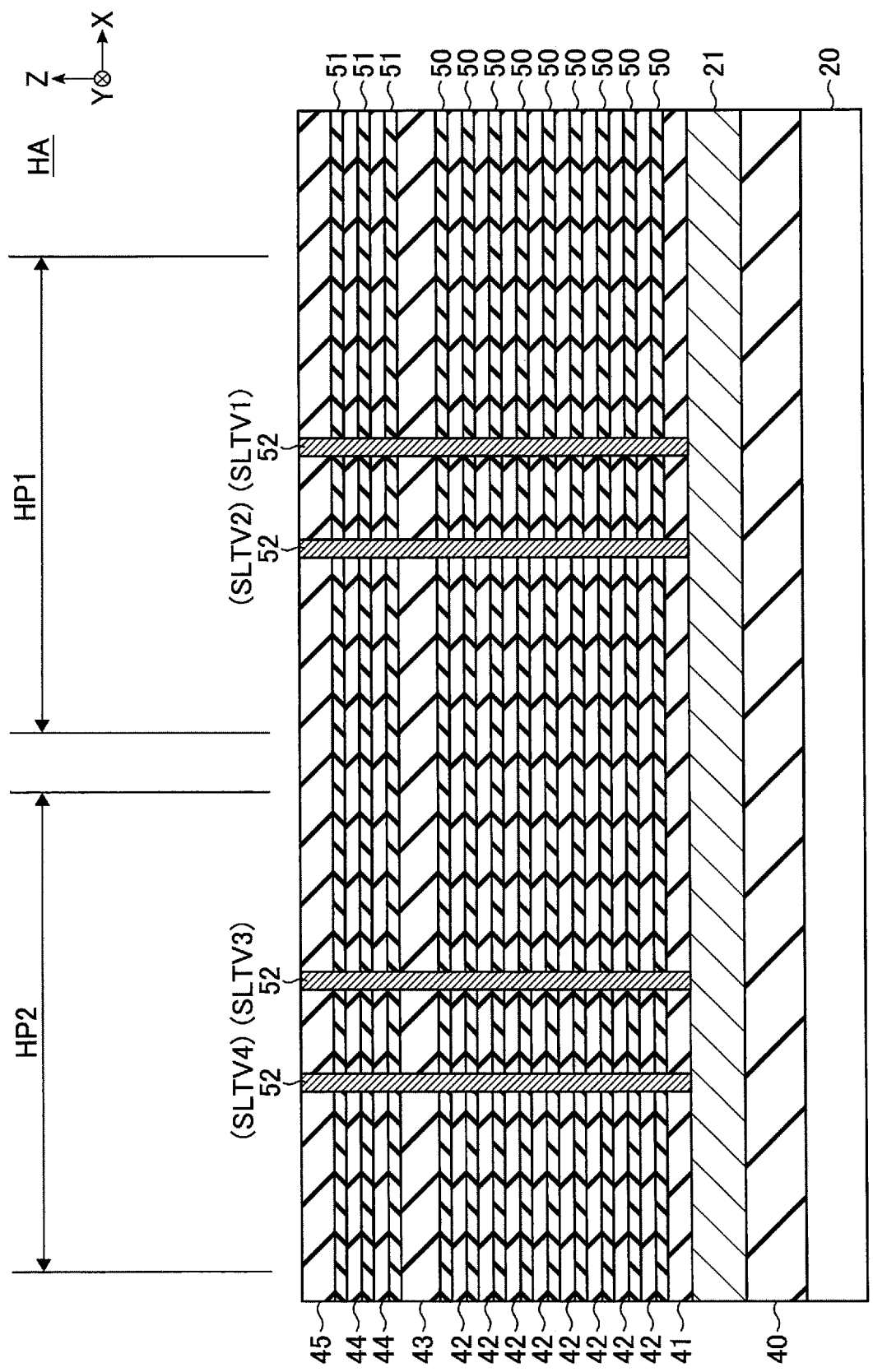
FIG. 41 is a cross-sectional view of the memory cell array showing an example of the manufacturing process of the semiconductor memory device according to the second embodiment.

The processing of steps S10 to S15 is the same as that in the first embodiment. FIG. 41 shows a state in which the processing of steps S10 to S15 has been completed. In this state, sacrificial members 52 are filled in the slits SLTV1 and SLTV2 in the ladder portion HP1, and the slits SLTV3 and SLTV4 in the ladder portion HP2.

Figure 42:
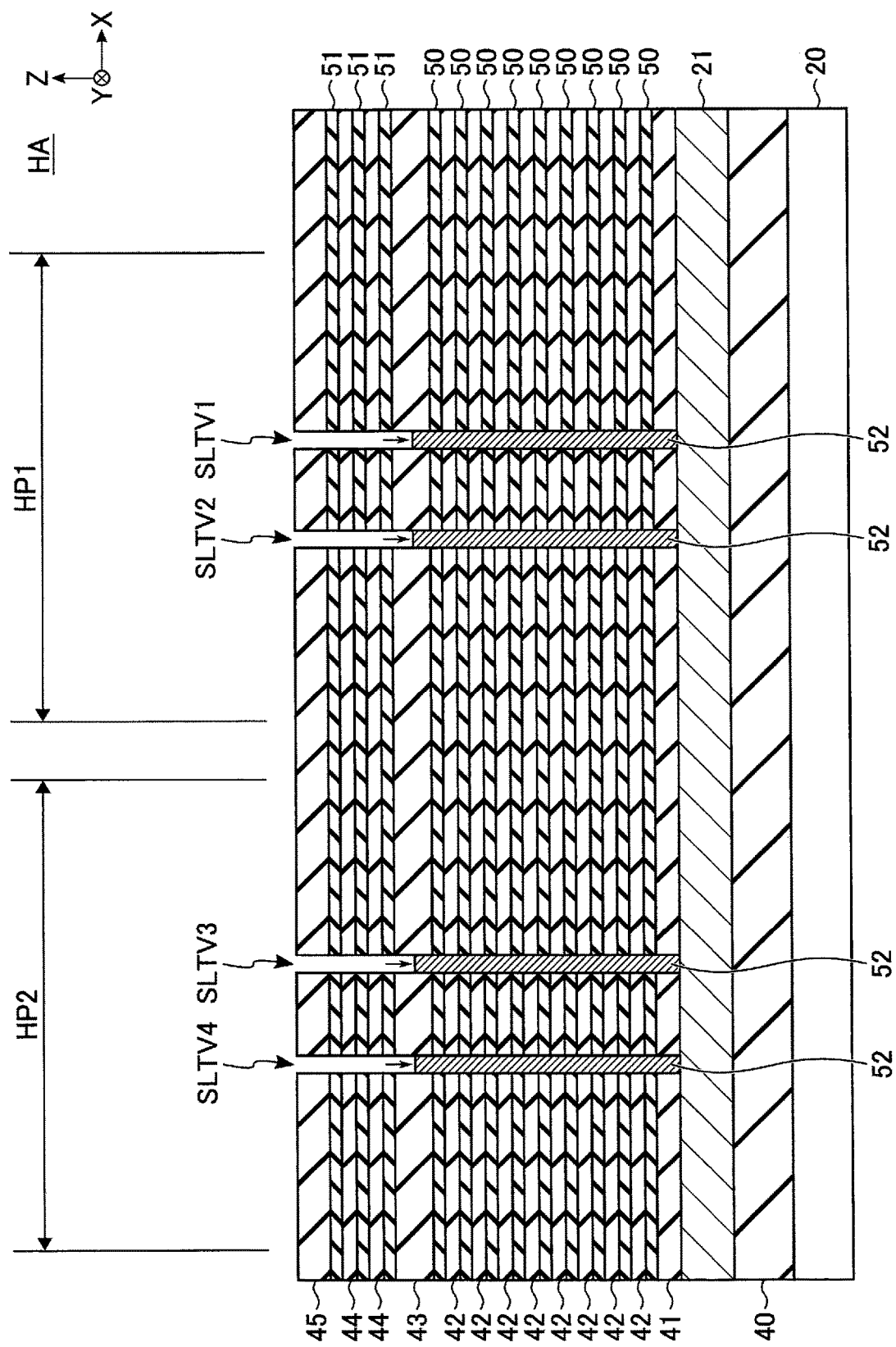
FIG. 42 is a cross-sectional view of the memory cell array showing an example of the manufacturing process of the semiconductor memory device according to the second embodiment.

Then, as shown in FIG. 42, parts of the sacrificial members 52 are removed until the top ends of the sacrificial members 52 come to a level included in the insulating layer 43 (step S30). Specifically, a resist in which regions corresponding to the slits SLTV are opened is formed by, for example, photolithography. Then, the sacrificial members 52 in the slits SLTV are removed by the anisotropic etching using the resist, until the top ends of the sacrificial members 52 come to a level included in the insulating layer 43. The resist is removed by, for example, the CMP.

Figure 43:
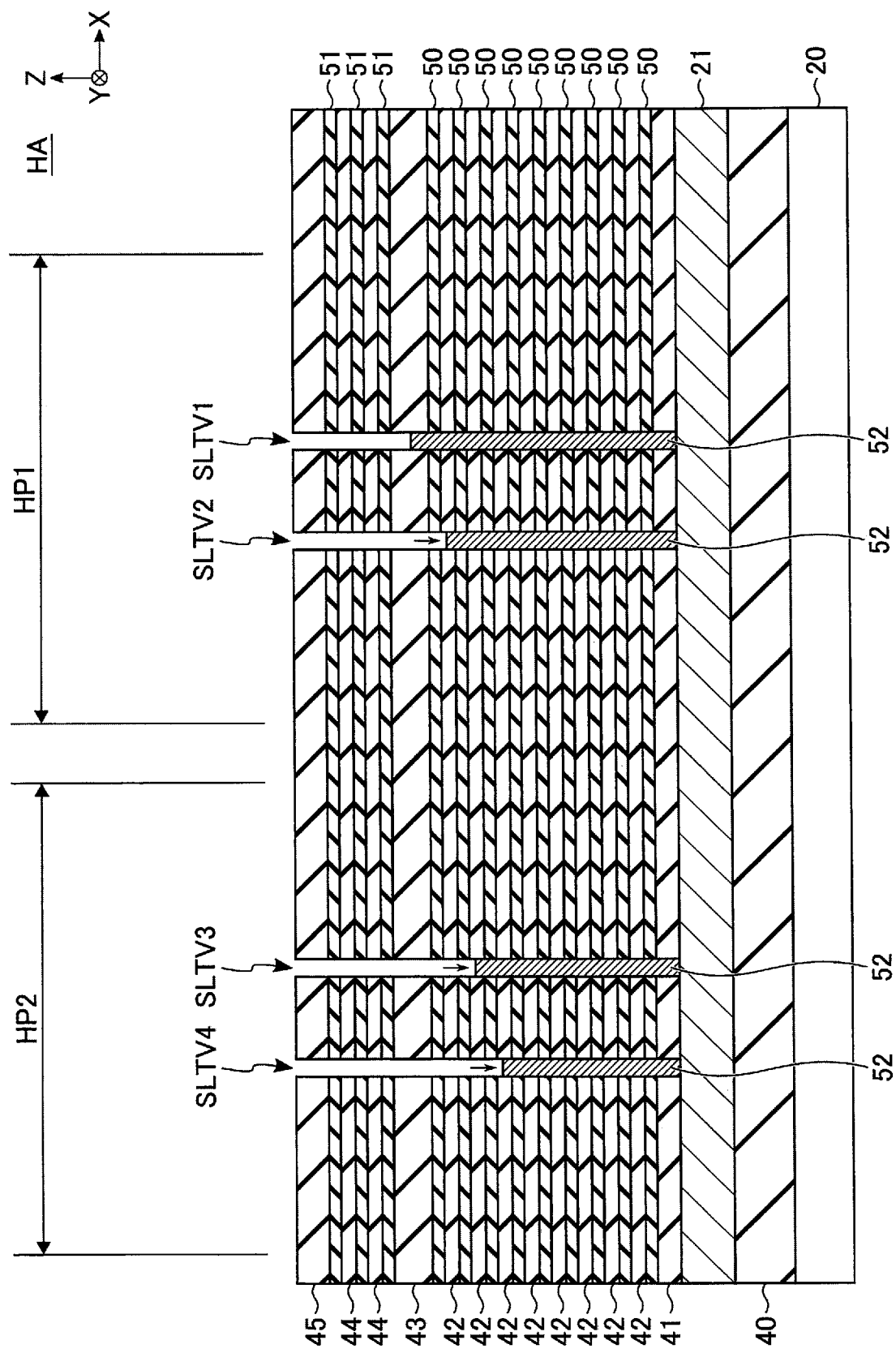
FIG. 43 is a cross-sectional view of the memory cell array showing an example of the manufacturing process of the semiconductor memory device according to the second embodiment.

Subsequently, as shown in FIG. 43, the sacrificial members 52, respectively filled in the slits SLTV1 to SLTV4, are processed to different heights (step S31). Specifically, a resist in which regions corresponding to the slits SLTV2 to SLTV4 are opened is formed by photolithography, etc. Then, parts of the sacrificial members 52 in the slits SLTV2 to SLTV4, corresponding to one pair, are removed by the anisotropic etching using the resist. The resist is removed by, for example, the CMP. Subsequently, a resist in which regions corresponding to the slits SLTV3 and SLTV4 are opened is formed by, for example, photolithography, etc. Then, parts of the sacrificial members 52 in the slits SLTV3 and SLTV4, corresponding to one pair, are removed by the anisotropic etching using the resist. The resist is removed by, for example, the CMP. Subsequently, a resist in which a region corresponding to the slit SLTV4 is opened is formed by photolithography, etc. Then, a part of the sacrificial member 52 in the slit SLTV4, corresponding to one pair, is removed by the anisotropic etching using the resist. The resist is removed by, for example, the CMP. Thus, the sacrificial members 52 respectively filled in the slits SLTV1 to SLTV4 are processed to different heights.

Subsequently, as shown in FIG. 44, parts of the sacrificial members 50 and 51 between the adjacent slits SLT and the adjacent slits SLTH that correspond to one terrace width are removed through the slits SLTV1 to SLTV4 (step S32). Specifically, for example by the wet etching through the slits SLTV1 to SLTV4, the sacrificial members 50 and 51 are selectively removed. By controlling the time of the wet etching, the wet etching of the present process is ended when the parts of the sacrificial members 50 and 51 corresponding to one terrace width are removed in the X direction.

Subsequently, it is confirmed whether a process of removing the sacrificial members 50 and 51 has been performed a predetermined number of times (step S33). If the number of times is less than the predetermined number (step S33, NO), a process in step S34 is performed.

Figure 45:
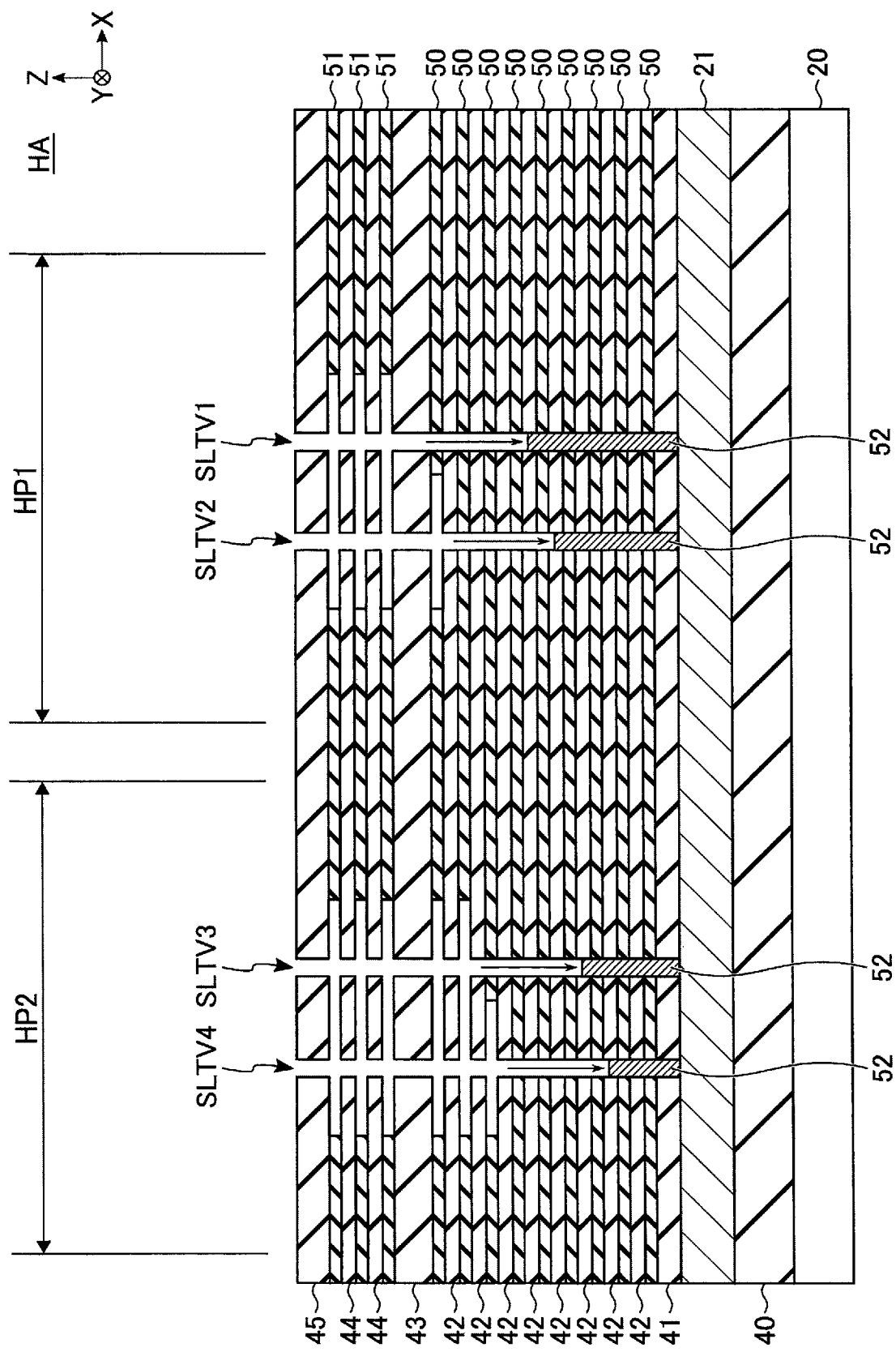
FIG. 45 is a cross-sectional view of the memory cell array showing an example of the manufacturing process of the semiconductor memory device according to the second embodiment.

In step S34, as shown in FIG. 45, parts of the sacrificial members 52 corresponding to the four pairs in the set of slits SLTV1 to SLTV4 are removed. Specifically, a resist in which regions corresponding to the slits SLTV1 to SLTV4 are opened is formed by photolithography, etc. Then, parts of the sacrificial members 52 in the slits SLTV1 to SLTV4, corresponding to four pairs, are removed by the anisotropic etching using the resist. The resist is removed by, for example, the CMP.

Figure 46:
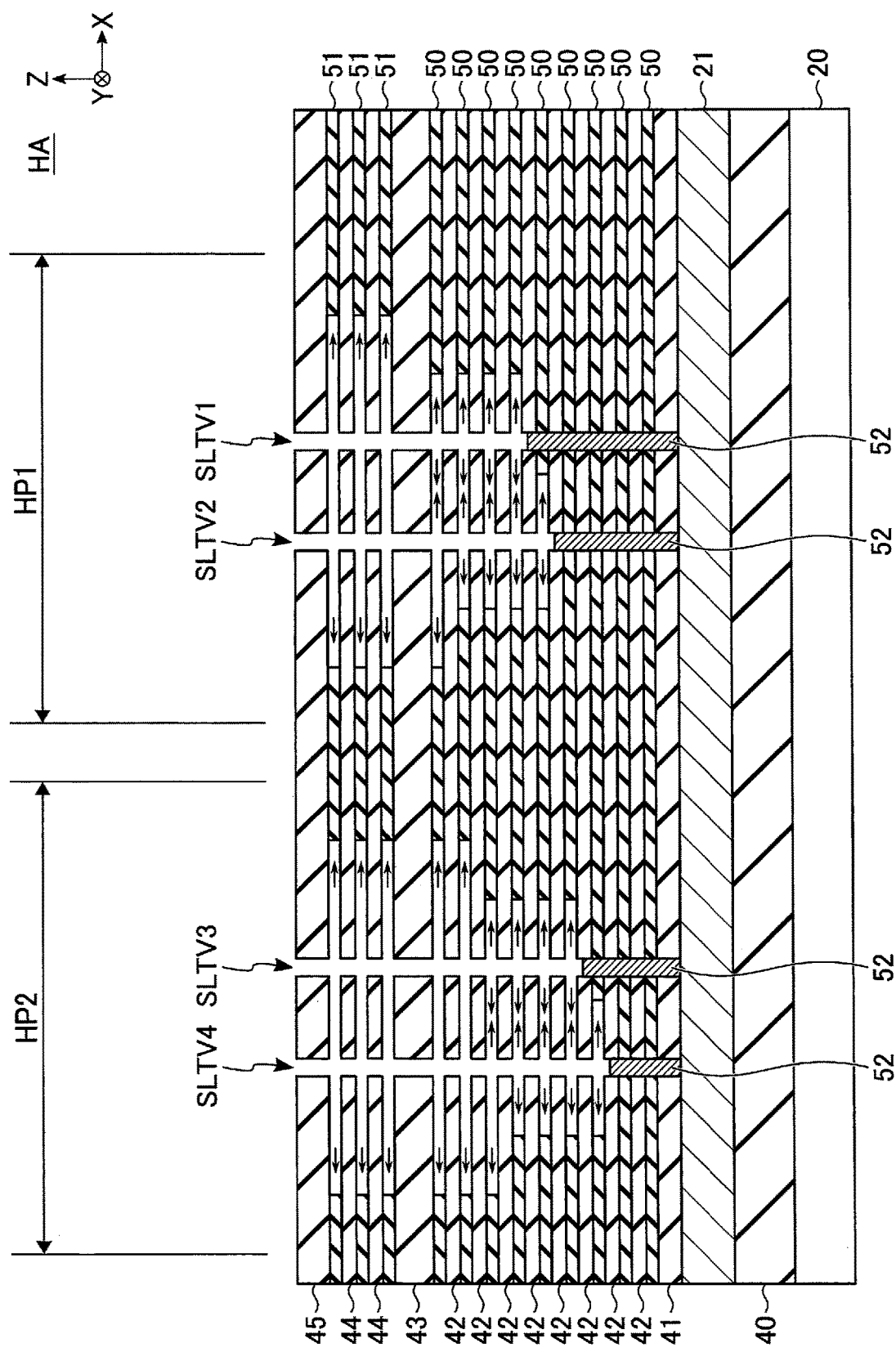
FIG. 46 is a cross-sectional view of the memory cell array showing an example of the manufacturing process of the semiconductor memory device according to the second embodiment.

Next, the process of step S32 is performed. Specifically, as shown in FIG. 46, parts of the sacrificial members 50 and 51 that correspond to one terrace width are removed through the slits SLTV in the X direction (step S32).

Then, step S33 is performed again to confirm whether the process of removing the sacrificial members 50 and 51 has been performed a predetermined number of times. If step 32 and step 34 are repeatedly performed the predetermined number of times (step S33, YES), the processing for the sacrificial members 50 and 51 is completed, and step 21 is performed.

The processing of step S21 and the subsequent step is the same as that in the first embodiment.

[2-3] Advantages of Second Embodiment

The above described semiconductor memory device 1 according to the second embodiment can reduce the manufacturing costs of the semiconductor memory device 1 in the same manner as in the first embodiment.

In the manufacturing method of the semiconductor memory device 1 according to the second embodiment, in the process of step S31 described with reference to FIG. 40, the sacrificial members 52 in the slits SLTV1 to SLTV4 are processed to have heights that differ per pair. Each time steps S32 and S34 described with reference to FIG. 40 are repeated, terrace portions of different layers facing each other, with the slits SLTV1 and SLTV2 interposed therebetween, are simultaneously formed. At the same time, terrace portions of different layers facing each other, with the slits SLTV3 and SLTV4 interposed therebetween, are simultaneously formed. Thus, the terrace portions of four layers are simultaneously formed.

Therefore, the manufacturing method of the semiconductor memory device 1 according to the second embodiment enables the number of manufacturing steps to be smaller than that in the case where the step of forming the terrace portion of one layer is repeated. Thus, the semiconductor memory device 1 of the second embodiment can reduce the manufacturing costs in the same manner as in the first embodiment.

[2-4] Modifications of Second Embodiment

The semiconductor memory device 1 according to the second embodiment may be modified in various manners. First, second, and third modifications of the second embodiment will be sequentially explained below.

First Modification of Second Embodiment

Figure 47:
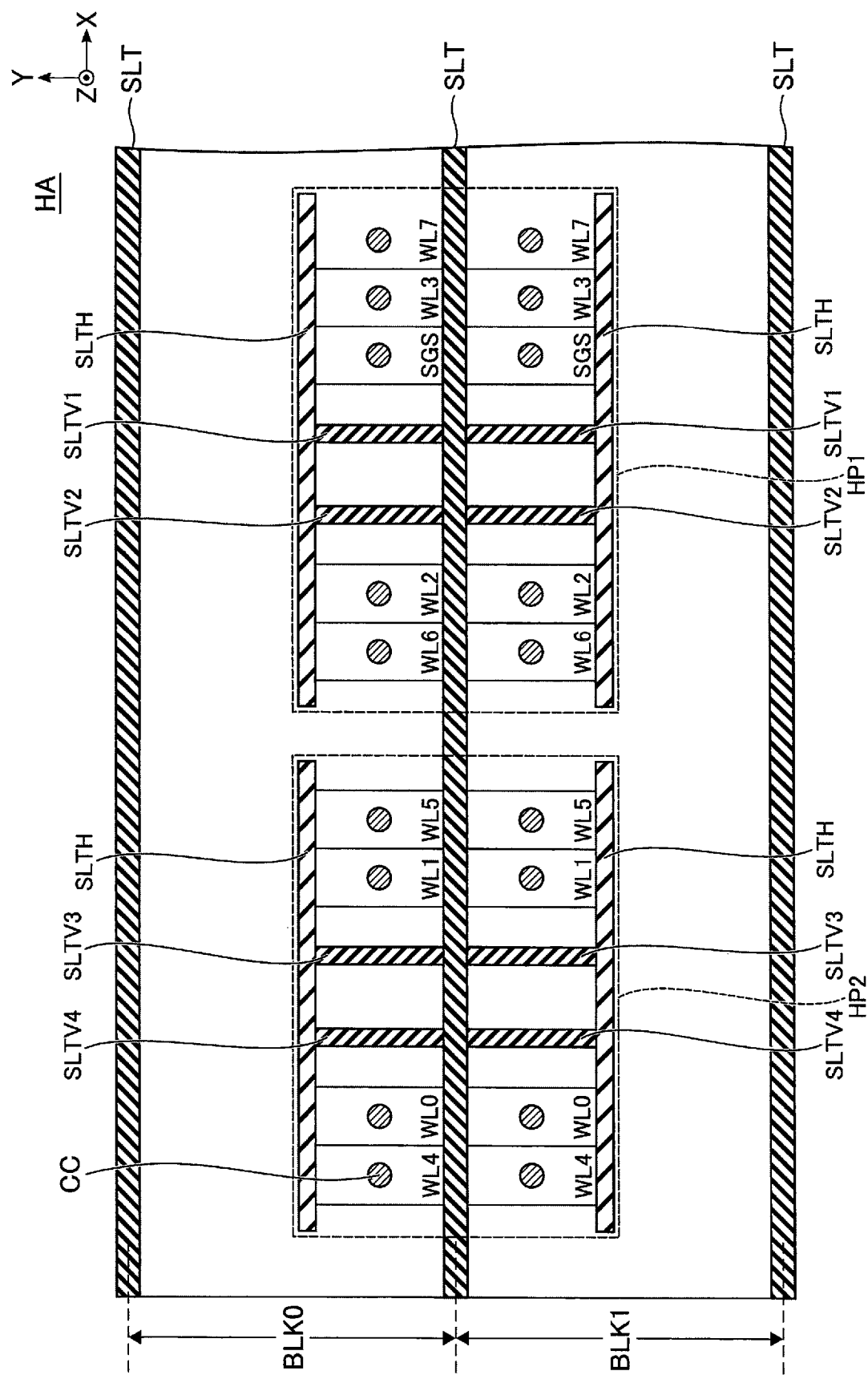
FIG. 47 is a plan view showing an example of a planar layout in a hookup area of a memory cell array included in a semiconductor memory device according to a first modification of the second embodiment.

FIG. 47 shows an exemplary planar layout in a hookup area of a memory cell array 10 included in a semiconductor memory device 1 according to the first modification of the second embodiment. The area similar to that shown in FIG. 38 is illustrated. As shown in FIG. 47, the semiconductor memory device 1 according to the first modification of the second embodiment differs from the second embodiment in the arrangement of the ladder portions HP1 and HP2. The first modification of the second embodiment has been modified from the second embodiment in a manner similar to the first modification of the first embodiment.

Specifically, in the semiconductor memory device 1 according to the first modification of the second embodiment, the ladder portion HP is provided in each of a set of blocks BLK0 and BLK1, a set of blocks BLK2 and BLK3, . . . and a set of blocks BLK(n−1) and BLKn. The ladder portions HP1 and HP2 are arranged across the slit SLT between, for example, the blocks BLK0 and BLK1. In other words, the ladder portions HP1 and HP2 are arranged across a set of blocks BLK. Slits SLTV1 to SLTV4 included in the ladder portions HP1 and HP2 are divided by the slit SLT at the boundary between the set of two blocks BLK.

The respective terrace portions of the select gate line SGS and the word lines WL0 to WL7 in the ladder portions HP1 and HP2 are divided by the slit SLT. Specifically, of the ladder portions HP1 and HP2, the terrace portions in the block BLK0 respectively correspond to the select gate line SGS and the word lines WL0 to WL7 in the block BLK0. Similarly, of the ladder portions HP1 and HP2, the terrace portions in the block BLK1 respectively correspond to the select gate line SGS and the word lines WL0 to WL7 in the block BLK1. The other configurations in the semiconductor memory device 1 according to the first modification of the second embodiment are the same as those of the second embodiment.

As described above, in the semiconductor memory device 1 according the first modification of the second embodiment, the terrace portions corresponding to the two blocks BLK are formed by the ladder portions HP1 and HP2. Thus, the area for arranging the ladder portions HP1 and HP2 in the entire semiconductor memory device 1 according to the first modification of the second embodiment can be smaller than that in the case in which the ladder portions HP1 and HP2 are arranged in each block BLK. As a result, the semiconductor memory device 1 according to the first modification of the second embodiment can suppress an increase in manufacturing costs.

Furthermore, in the semiconductor memory device 1 according to the first modification of the second embodiment, the slit SLT is arranged between the set of slits SLTH in each of the ladder portions HP1 and HP2. Therefore, according to the first modification of the second embodiment, in the stacked interconnect portion replacement process of step S23, the time to remove the sacrificial members 50 and 51 in the region sandwiched between the set of slits SLTH can be shorter than that in the second embodiment. Accordingly, the semiconductor memory device 1 of the first modification of the second embodiment can reduce the costs for the stacked interconnect portion replacement process as compared to the second embodiment.

Second Modification of Second Embodiment

Figure 48:
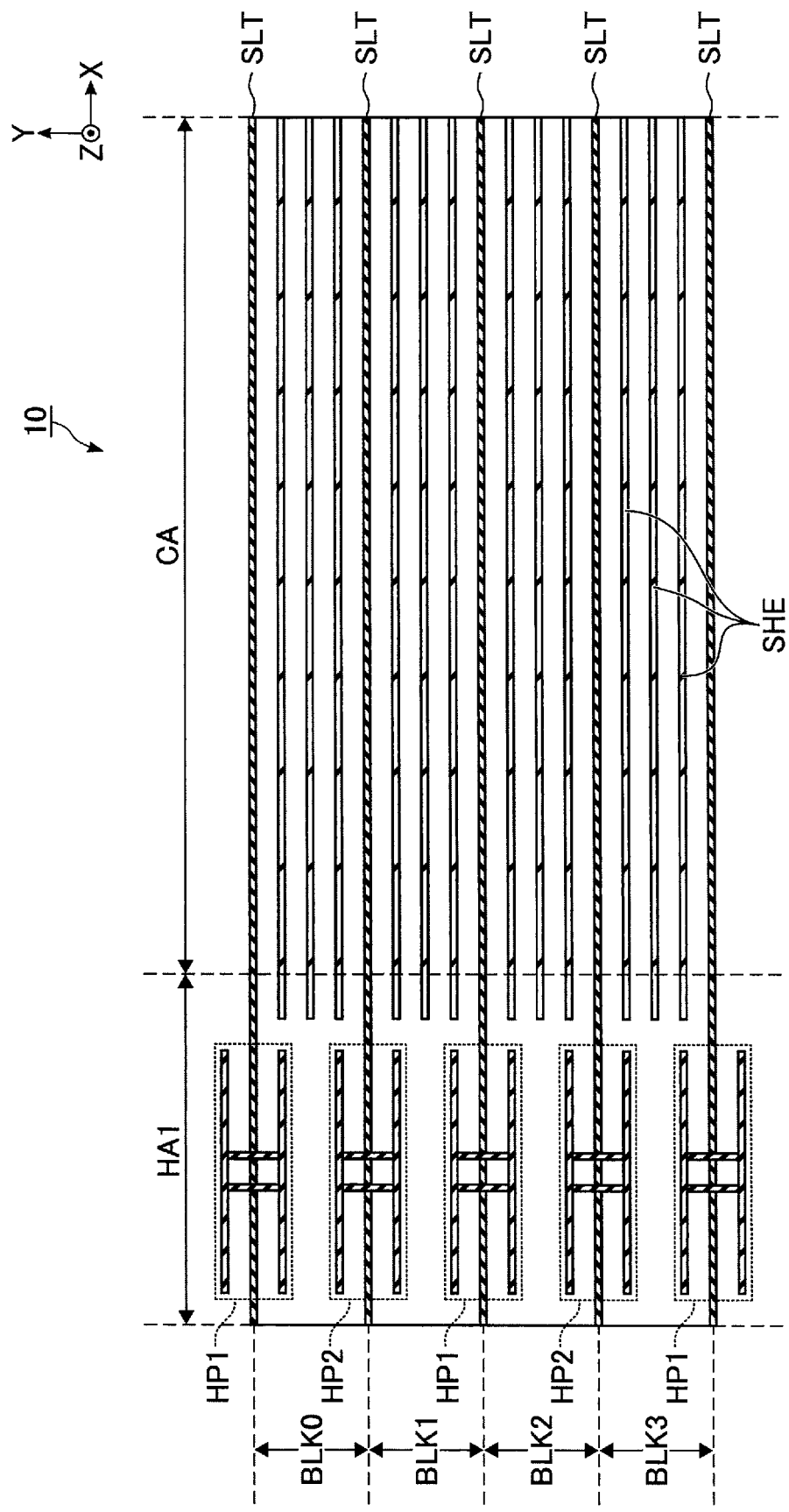
FIG. 48 is a plan view showing an example of a planar layout of a memory cell array included in a semiconductor memory device according to a second modification of the second embodiment.

FIG. 48 is a plan view showing an example of a planar layout of a memory cell array 10 included in a semiconductor memory device 1 according to the second modification of the second embodiment, which shows the region corresponding to four blocks BLK0 to BLK3. As shown in FIG. 48, the semiconductor memory device 1 according to the second modification of the second embodiment differs from the second embodiment in the arrangement of the ladder portions HP1 and HP2.

Specifically, the ladder portions HP1 and HP2 are alternately provided in each of a set of blocks BLK0 and BLK1, a set of blocks BLK2 and BLK3, . . . and a set of blocks BLK(n−1) and BLKn. Specifically, the ladder portion HP1 is arranged across the slit SLT, for example, between the blocks BLK1 and BLK2, and the ladder portion HP2 is arranged across the slit SLT, for example, between the blocks BLK 2 and BLK3. The other configurations in the semiconductor memory device 1 according to the second modification of the second embodiment are the same as those of the second embodiment.

As described above, in the semiconductor memory device 1 according to the second modification of the second embodiment, the ladder portions HP1 and HP2 are alternately arranged in the Y direction. Thus, the area in the X direction of the semiconductor memory device 1 according to the second modification of the second embodiment can be smaller than that in the case in which the ladder portions HP1 and HP2 are arranged in the X direction. Thus, the semiconductor memory device 1 of the second modification of the second embodiment can reduce the manufacturing costs.

Third Modification of Second Embodiment

Figure 49:
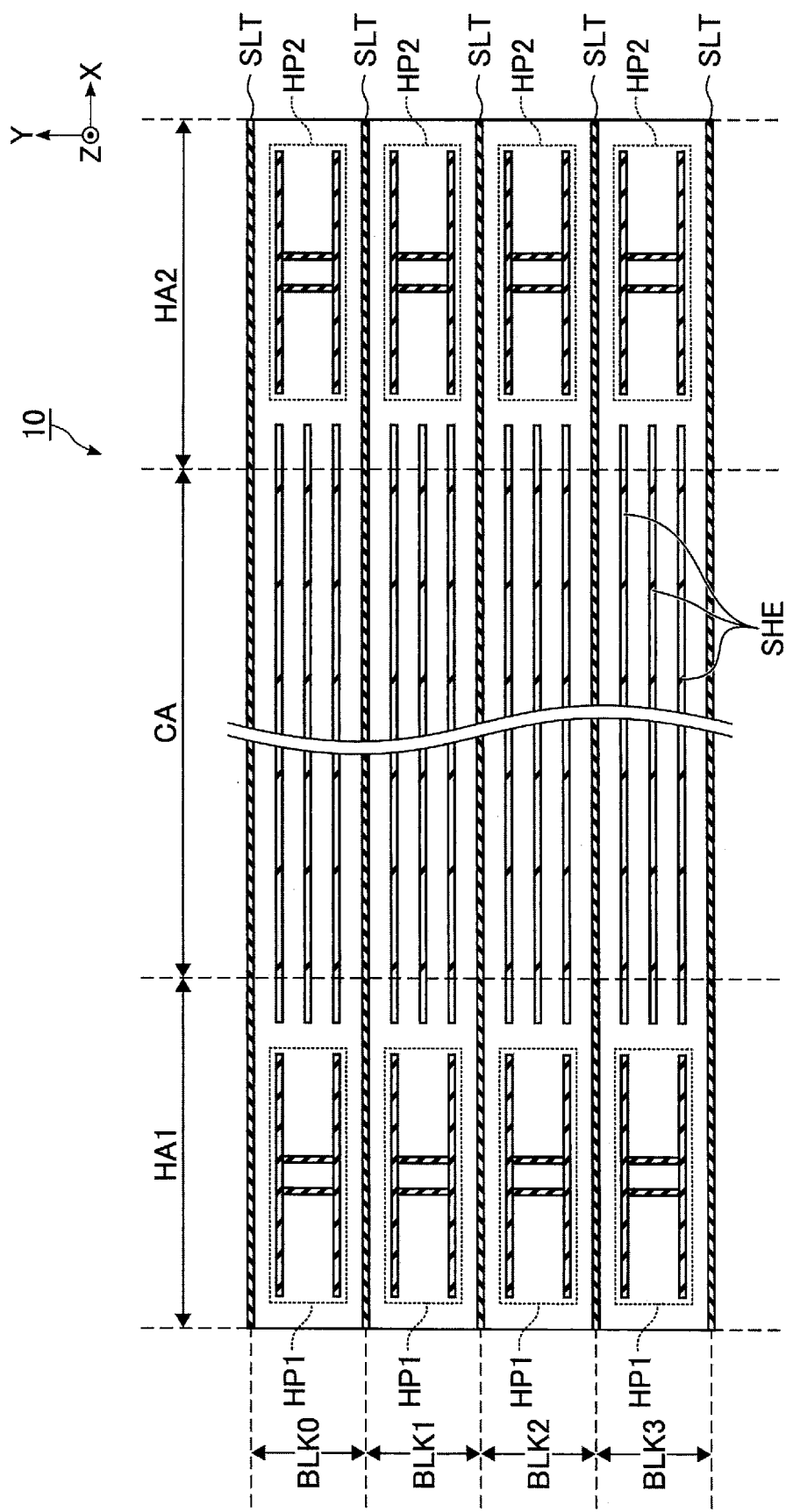
FIG. 49 is a plan view showing an example of a planar layout of a memory cell array included in a semiconductor memory device according to a third modification of the second embodiment.

FIG. 49 is a plan view showing an example of a planar layout of a memory cell array 10 included in a semiconductor memory device 1 according to the third modification of the second embodiment, which shows the region corresponding to four blocks BLK0 to BLK3. As shown in FIG. 49, the semiconductor memory device 1 according to the third modification of the second embodiment differs from the second embodiment in the arrangement of the ladder portions HP1 and HP2.

Specifically, the semiconductor memory device 1 according to the third modification of the second embodiment is divided in the X direction into a hookup area HA1, a cell area CA, and a hookup area HA2, in the planar layout of the memory cell array 10. The cell area CA is interposed between the hookup areas HA1 and HA2 in the X direction. The ladder portions HP1 and HP2 are respectively provided in one and the other of the hookup areas HA1 and HA2 in each block BLK. In the example shown in FIG. 49, the ladder portion HP1 is arranged in the hookup area HA1 in each block BLK. The ladder portion HP2 is arranged in the hookup area HA2 in each block BLK. The other configurations in the semiconductor memory device 1 according to the third modification of the second embodiment are the same as those of the second embodiment.

As described above, the memory cell array 10 may be provided with a plurality of hookup areas HA. In this case also, the semiconductor memory device 1 according to the third modification of the second embodiment can achieve the same advantageous effects as the second embodiment.

[3] Other Modifications, Etc.

Figure 50:
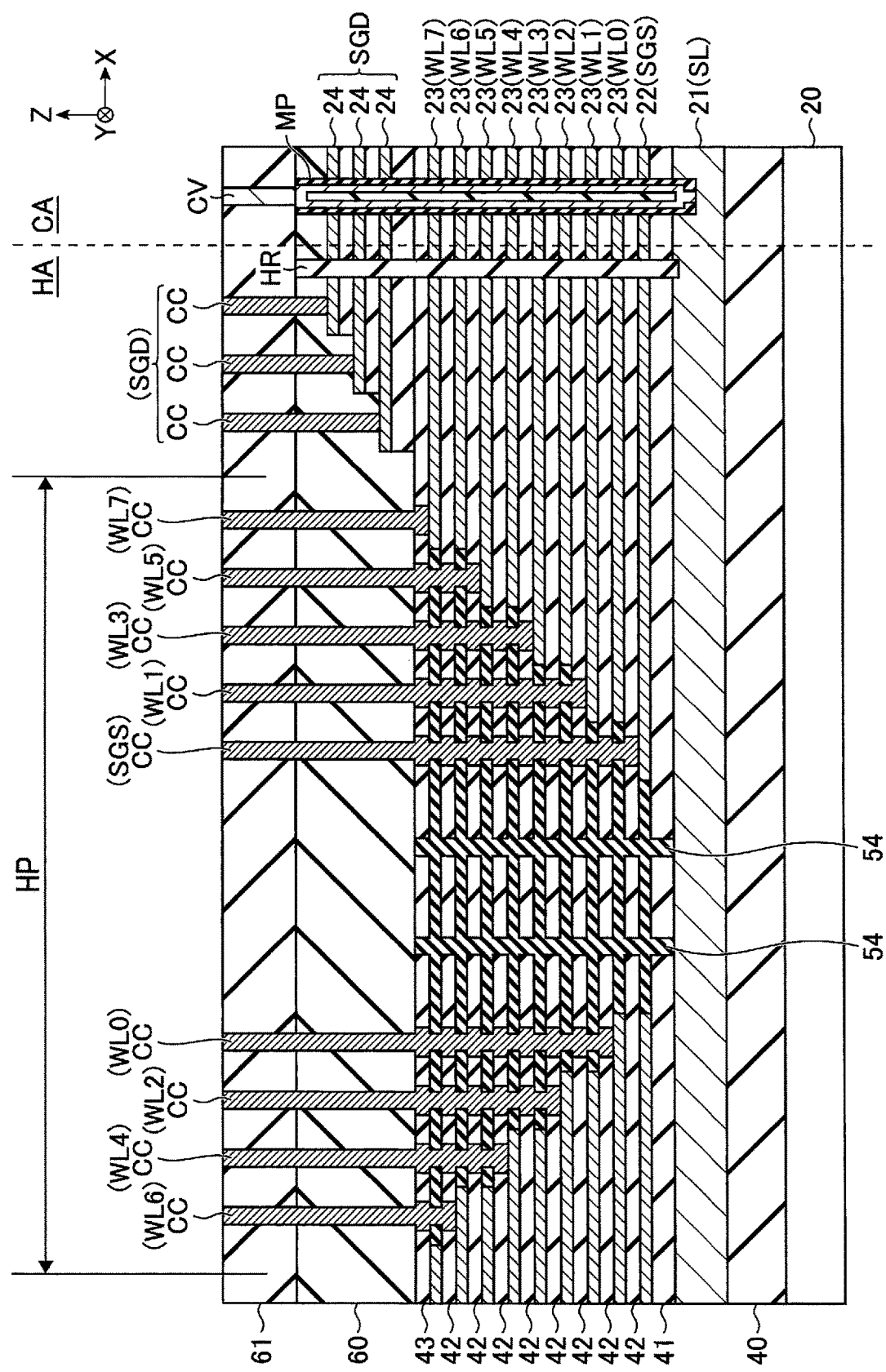
FIG. 50 is a cross-sectional view showing an example of a cross-sectional structure of a hookup area of the memory cell array included in the semiconductor memory device according to the first embodiment.

With regard to the first embodiment, the explanations have been given for the case in which the contacts CC extend in the Z direction in fixed areas. However, the contacts CC are not limited to the shapes illustrated in the first embodiment. FIG. 50 shows an example of a cross-sectional structure of a hookup area HA of the memory cell array 10 included in the semiconductor memory device 1 according to the first embodiment. In the example shown in FIG. 50, the width in the X direction of the contact CC is greater in a portion in contact with the insulating layers 42 and 43 than in a portion in contact with the insulator 54. In other words, the diameter and cross-sectional area of the contact CC at the height of the insulating layer 42 or 43 can be greater than the diameter and cross-sectional area of the contact CC at the height of the conductive layer 23.

As described above with reference to FIG. 10, the insulating layers 42 and 43 are formed in the process of step S10, and the insulator 54 is formed in the process of step S21. Since the insulating layers 42 and 43 are formed in the step which differs from the step of forming the insulator 54, the film quality or material of the former may differ from that of the latter. If those layers differ in terms of the film quality or material, the selection ratios of the layers in the etching for forming the contact CC in the process of step S25 may be different, and a step may occur between the insulating layers 42 and 43 and the insulator 54. Thus, the contact CC may be of a shape having steps.

If the contact CC is of a shape having steps, it can be assumed that the contact CC is in contact with insulators that differ in terms of film quality or material in the portion of a larger diameter and cross-sectional area and the portion of a smaller diameter and cross-sectional area. It can be also assumed that the method of the embodiment described above is used to form the terrace portions.

Figure 51:
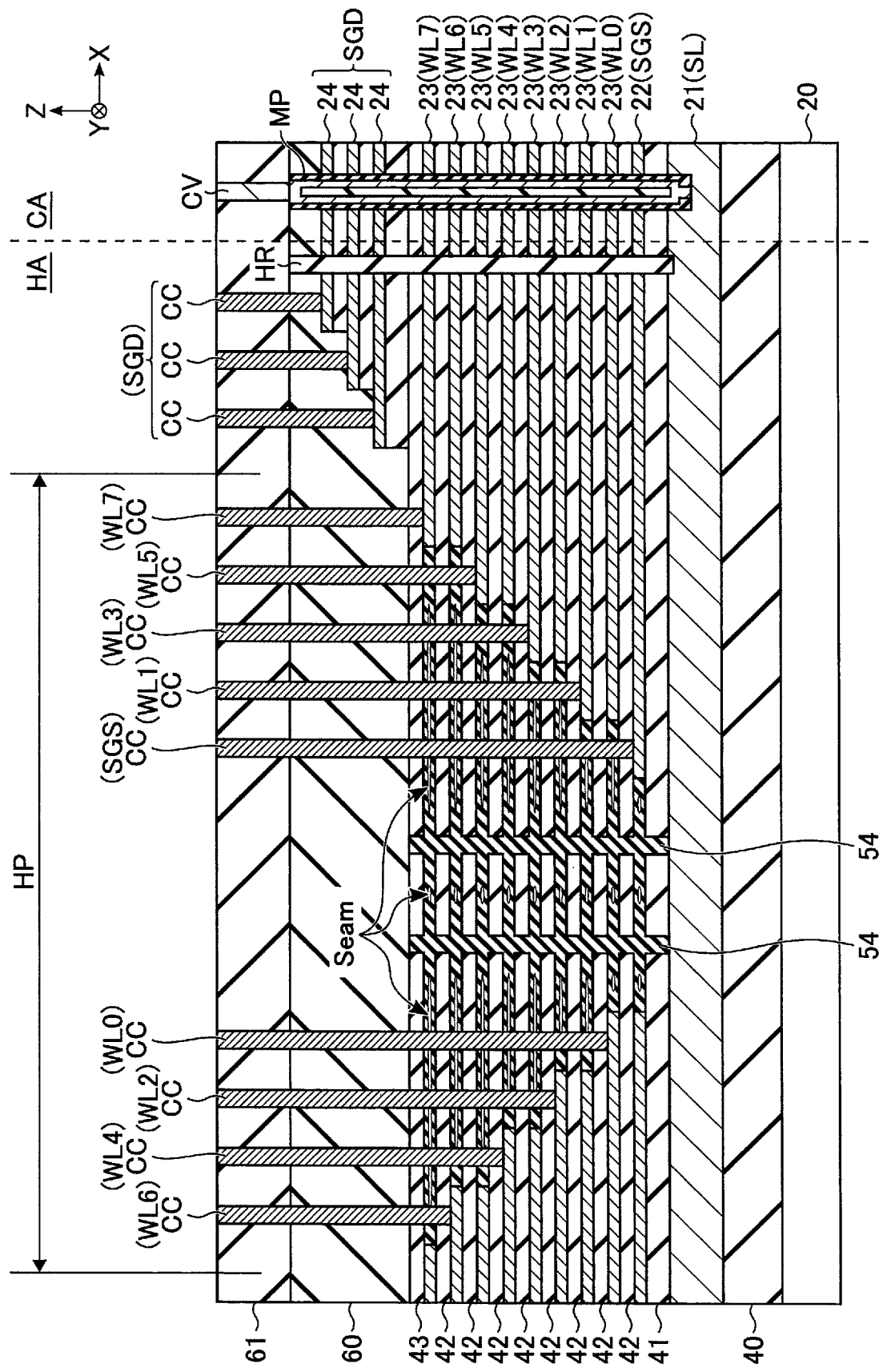
FIG. 51 is a cross-sectional view showing an example of a cross-sectional structure of the hookup area of the memory cell array included in the semiconductor memory device according to the first embodiment.

With regard to the first embodiment, the explanations have been given for the case in which the insulator 54 is filled in without any spaces. However, the insulator 54 is not limited to the shape illustrated in the first embodiment. FIG. 51 shows an example of a cross-sectional structure of the hookup area HA of the memory cell array 10 included in the semiconductor memory device 1 according to the first embodiment. In the example shown in FIG. 51, the insulator 54 includes seams.

As described above with reference to FIG. 10, since the insulator 54 is filled in through the slits SLTV in the process of step S21, seams may occur. In contrast, the insulating layers 42 and 43 are formed in the process of step S10, and no seams are formed in those layers.

If the insulators with the seams and the insulators with no seams are alternately provided in the Z direction, it can be assumed that the respective portions are formed by different manufacturing processes.

Figure 52:
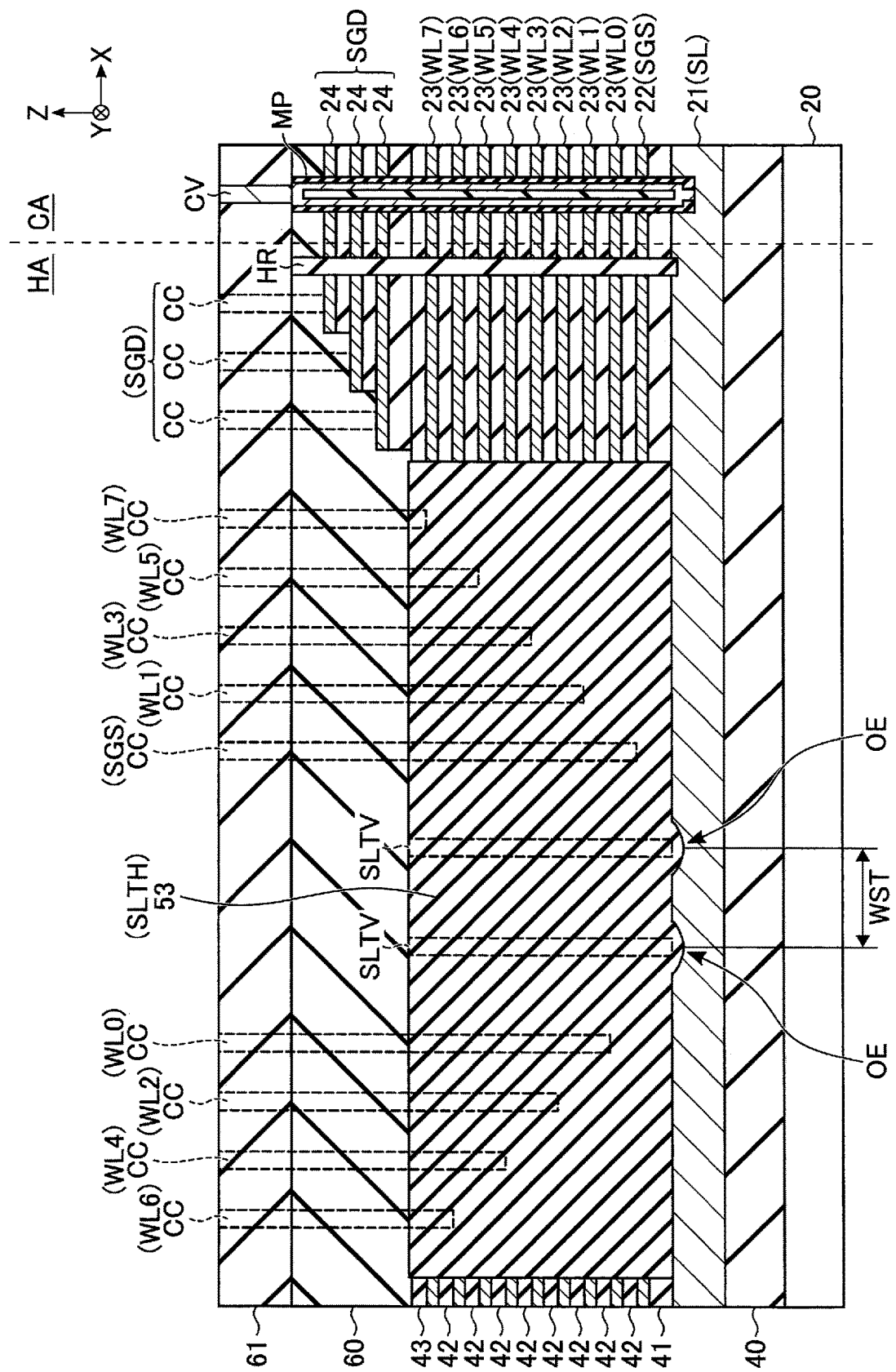
FIG. 52 is a cross-sectional view showing an example of a cross-sectional structure of the hookup area of the memory cell array included in the semiconductor memory device according to the first embodiment.

FIG. 52 shows an example of a cross-sectional structure of the hookup area HA of the memory cell array 10 included in the semiconductor memory device 1 according to the first embodiment. In the example shown in FIG. 52, the slit SLTH has projections OE, which project in the Z direction, in portions that are in contact with the slits SLTV and with the conductive layer 21.

As described above with reference to FIG. 10, the ladder-shaped slits HSLT corresponding to the slits SLTH and SLTV are formed by the anisotropic etching. At this time, the etching can proceed faster in a portion where the part corresponding to the slit SLTH and the part corresponding to the slit SLTV intersect as compared to the other portions. Therefore, in the portion where the slit SLTH and the slit SLTV intersect, overetching may occur and the projection OE may be formed.

Thus, based on the position of the projection OE, the position where the slit SLTV and the slit SLTH intersect can be estimated. Furthermore, based on the distance between the projections OE, the distance between the slits SLTV can be estimated.

With regard to the first and second embodiments, the explanations have been given for the case in which the sacrificial members 52 are removed by the anisotropic etching. However, the process to remove the sacrificial members 52 is not limited to anisotropic etching. The sacrificial members 52 may be selectively removed by isotropic etching, for example, wet etching.

With regard to the first and second embodiments, the explanations have been given for the case in which the slit SLTV is interposed between the two adjacent slits SLTH. However, the slit SLTV and the slit SLTH may intersect. In a part of the slit SLTV provided outside the region between the two adjacent slits SLTH, the insulator 53 is formed at the same time as in the slits SLTH through the process of steps S14 and S15 described with reference to FIG. 10.

In the example of the first and second embodiments, the support pillars HR formed of an insulating material alone has been discussed. However, the support pillars HR may have a different structure. For example, the support pillars HR may have a structure similar to the memory pillars MP, or may have part of the structure of the memory pillars MP. If the support pillars HR have a structure similar to the memory pillars MP, the top surfaces of the support pillars HR are on the same plane as the top surfaces of the memory pillars MP.

In the first and second embodiments, the configuration of the memory cell array 10 may be different from the above-described configuration. For example, the memory pillar MP may be configured in such a manner that two or more pillars are coupled in the Z direction. Moreover, the memory pillar MP may have a structure in which a pillar corresponding to the select gate line SGD and a pillar corresponding to the word line WL are coupled. Multiple types of insulators may be provided in the slit SLT.

According to the first and second embodiments, the explanations have been given for the semiconductor memory device 1 having a structure in which circuits such as a sense amplifier module 16 is arranged below the memory cell array 10. The structure, however, is not limited thereto. For example, the semiconductor memory device 1 may have a structure in which stacked interconnects such as word lines WL are deposited on the semiconductor substrate 20, or a structure in which a chip having a sense amplifier module 16 and a chip having a memory cell array 10 are bonded together. If such a bonded structure is adopted, the structure corresponding to the semiconductor substrate 20 may be omitted.

In the drawings used for the explanation of the first embodiment, the memory pillars MP and support pillars HR are illustrated as having the same diameter in the Z direction. The pillars are not limited thereto. For example, the memory pillars MP and support pillars HR may be tapered or reverse tapered, or bulged in the middle. Similarly, the slits SLT may have a tapered or inverse-tapered shape, or a shape that bulges at the middle. Moreover, in the embodiment, the memory pillars MP, support pillars HR, and contacts CC have a circular cross section. However, the cross section of each component may be ellipsoidal or in any shape. The "inner diameter" and the "outer diameter" respectively indicate an inner diameter and an outer diameter in a cross-section parallel to the semiconductor substrate 20.

In this specification, the term "coupling" refers to electrical coupling, and does not exclude intervention of another element. Expressions such as "electrically coupled" covers insulator-interposed coupling that allows for the same operation as electrical coupling without an insulator. The term "pillar" refers to a structure provided in a hole formed in the process of manufacturing the semiconductor memory device 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first area and a second area arranged in a first direction;
   a plurality of conductive layers arranged in a second direction intersecting the first direction, with first insulating layers each interposed between adjacent two of the conductive layers;
   a first member and a second member arranged in a third direction intersecting each of the first direction and the second direction, the first member and the second member extending in the first direction across the first area and the second area and dividing the conductive layers;
   a plurality of pillars penetrating the conductive layers in the first area;
   a third member and a fourth member arranged in the third direction, the third member and the fourth member extending in the first direction and penetrating the conductive layers in the second area and between the first member and the second member, and
   a fifth member extending in the first direction across the first area and the second area between the first member and the second member and dividing the conductive layers,
   wherein:
   an intersection of each of the pillars and each of the conductive layers in the first area functions as a memory cell;
   the second area includes a first contact area including a first sub-area, a second sub-area, and a third sub-area, which are arranged in the first direction and interposed between the third member and the fourth member in the third direction;
   the conductive layers include a first conductive layer, a second conductive layer, a third conductive layer, and a fourth conductive layer, which are arranged in order from bottom to top;
   the first conductive layer includes a first terrace portion that does not overlap conductive layers above the first conductive layer of the conductive layers in the first sub-area;
   the second conductive layer includes a second terrace portion that does not overlap conductive layers above the second conductive layer of the conductive layers in the third sub-area;
   the third conductive layer includes a third terrace portion that does not overlap conductive layers above the third conductive layer of the conductive layers in the first sub-area;
   the fourth conductive layer includes a fourth terrace portion that does not overlap conductive layers above the fourth conductive layer of the conductive layers in the third sub-area;
   at least one contact extends in the second direction from each of the first to fourth terrace portions;
   a part of the first sub-area of the conductive layers and a part of the third sub-area of the conductive layers are separated with the second sub-area interposed therebetween, and
   the fifth member is arranged between the third member and the fourth member in the first contact area.

2. The semiconductor memory device according to claim 1, wherein
   each of the first to fourth terrace portions is provided with two contacts extending in the second direction with the fifth member interposed therebetween.

3. The semiconductor memory device according to claim 1, wherein
   the first terrace portion and the second terrace portion are almost equal in length in the first direction.

4. The semiconductor memory device according to claim 1, wherein
   the first terrace portion, the second terrace portion, the third terrace portion, and the fourth terrace portion are almost equal in length in the first direction.

5. The semiconductor memory device according to claim 1, wherein
the third member and the fourth member have projections on a lower side in the second sub-area.

6. The semiconductor memory device according to claim 1, further comprising
a sixth member and a seventh member arranged in the first direction, the sixth member and the seventh member extending in the third direction and penetrating the conductive layers in the second sub-area and between the third member and the fourth member.

7. The semiconductor memory device according to claim 6, wherein
the sixth member and the seventh member are arranged in the first direction at an interval that is longer than length of the first terrace portion in the first direction.

8. The semiconductor memory device according to claim 6, wherein
each of the third member and the fourth member has projections on a lower side in portions where the sixth member and the seventh member intersect.

9. The semiconductor memory device according to claim 1, wherein:
the first to third sub-areas are arranged in order of the first sub-area, the second sub-area, and the third sub-area in the first direction in descending order of distance from the first area;
the first terrace portion is continuous with the first conductive layer in the first area through a region between the first member and the third member;
the second terrace portion is continuous with the second conductive layer in the first area in the first direction;
the third terrace portion is continuous with the third conductive layer in the first area through a region between the first member and the third member; and
the fourth terrace portion is continuous with the fourth conductive layer in the first area in the first direction.

10. The semiconductor memory device according to claim 1, wherein:
the first to third sub-areas are arranged in order of the first sub-area, the second sub-area, and the third sub-area in the first direction in descending order of distance from the first area;
the conductive layers include steps that become higher in a direction away from the first area in the first sub-area, and steps that become higher in a direction approaching the first area in the third sub-area.

11. The semiconductor memory device according to claim 1, wherein:
the first terrace portion is nearer to the second sub-area than the third terrace portion is; and
the second terrace portion is nearer to the second sub-area than the fourth terrace portion is.

12. The semiconductor memory device according to claim 1, wherein:
the first sub-area excludes a terrace portion where the second conductive layer does not overlap conductive layers above the second conductive layer of the conductive layers, and a terrace portion where the fourth conductive layer does not overlap conductive layers above the fourth conductive layer of the conductive layers; and
the third sub-area excludes a terrace portion where the first conductive layer does not overlap conductive layers above the first conductive layer of the conductive layers, and a terrace portion where the third conductive layer does not overlap conductive layers above the third conductive layer of the conductive layers.

13. The semiconductor memory device according to claim 1, wherein
assuming that two conductive layers of the conductive layers adjacent to each other in the second direction with one of the first insulating layers interposed therebetween are defined as an n-th conductive layer and an (n+1)th conductive layer (n is a positive integer),
the n-th conductive layer includes an n-th terrace portion that does not overlap conductive layers above the n-th conductive layer of the conductive layers in the first sub-area, and
the (n+1)th conductive layer includes an (n+1)th terrace portion that does not overlap conductive layers above the (n+1)th conductive layer of the conductive layers, the (n+1)th terrace portion being provided in a portion other than the first sub-area.

14. A semiconductor memory device comprising:
a first area and a second area arranged in a first direction;
a plurality of conductive layers arranged in a second direction intersecting the first direction, with first insulating layers each interposed between adjacent two of the conductive layers;
a first member and a second member arranged in a third direction intersecting each of the first direction and the second direction, the first member and the second member extending in the first direction across the first area and the second area and dividing the conductive layers;
a plurality of pillars penetrating the conductive layers in the first area;
a third member and a fourth member arranged in the third direction, the third member and the fourth member extending in the first direction and penetrating the conductive layers in the second area and between the first member and the second member; and
an eighth member and a ninth member arranged in the third direction and separated from the third member and the fourth member, the eighth member and the ninth member extending in the first direction and penetrating the conductive layers in the second area and between the first member and the second member,
wherein:
an intersection of each of the pillars and each of the conductive layers in the first area functions as a memory cell;
the second area includes a first contact area including a first sub-area, a second sub-area, and a third sub-area, which are arranged in the first direction and interposed between the third member and the fourth member in the third direction;
the conductive layers include a first conductive layer, a second conductive layer, a third conductive layer, and a fourth conductive layer, which are arranged in order from bottom to top;
the first conductive layer includes a first terrace portion that does not overlap conductive layers above the first conductive layer of the conductive layers in the first sub-area;
the second conductive layer includes a second terrace portion that does not overlap conductive layers above the second conductive layer of the conductive layers in the third sub-area;

the third conductive layer includes a third terrace portion that does not overlap conductive layers above the third conductive layer of the conductive layers in the first sub-area;

the fourth conductive layer includes a fourth terrace portion that does not overlap conductive layers above the fourth conductive layer of the conductive layers in the third sub-area;

at least one contact extends in the second direction from each of the first to fourth terrace portions;

a part of the first sub-area of the conductive layers and a part of the third sub-area of the conductive layers are separated with the second sub-area interposed therebetween;

the second area includes a second contact area including a fourth sub-area, a fifth sub-area, and a sixth sub-area, which are arranged in the first direction and interposed between the eighth member and the ninth member, the second contact area being separated from the first contact area;

the conductive layers include a fifth conductive layer, a sixth conductive layer, a seventh conductive layer, and an eighth conductive layer, which are arranged in order from bottom to top;

the fifth conductive layer includes a fifth terrace portion that does not overlap conductive layers above the fifth conductive layer of the conductive layers in the fourth sub-area;

the sixth conductive layer includes a sixth terrace portion that does not overlap conductive layers above the sixth conductive layer of the conductive layers in the sixth sub-area;

the seventh conductive layer includes a seventh terrace portion that does not overlap conductive layers above the seventh conductive layer of the conductive layers in the fourth sub-area;

the eighth conductive layer includes an eighth terrace portion that does not overlap conductive layers above the eighth conductive layer of the conductive layers in the sixth sub-area;

at least one contact extends in the second direction from each of the fifth to eighth terrace portions; and a part of the fourth sub-area of the conductive layers and a part of the sixth sub-area of the conductive layers are separated with the fifth sub-area interposed therebetween.

15. The semiconductor memory device according to claim 14, further comprising a tenth member extending in the first direction across the first area and the second area between the first member and the second member and dividing the conductive layers, the tenth member being arranged between the third member and the fourth member in the first contact area, and between the eighth member and the ninth member in the second contact area.

16. The semiconductor memory device according to claim 15, wherein each of the first to eighth terrace portions is provided with two contacts extending in the second direction with the tenth member interposed therebetween.

17. The semiconductor memory device according to claim 1, wherein the contacts extending from the first to fourth terrace portions in the second direction have different cross-sectional areas in a level at which each of the conductive layers is provided, and a level corresponding to each of the first insulating layers between the two adjacent conductive layers.

18. The semiconductor memory device according to claim 1, wherein second insulating layers are each provided between adjacent two of the first insulating layers in the first contact area and above the first to fourth terrace portions.

19. The semiconductor memory device according to claim 18, wherein the second insulating layers include a seam.

* * * * *